US012585195B2

(12) United States Patent
Kato et al.

(10) Patent No.: US 12,585,195 B2
(45) Date of Patent: Mar. 24, 2026

(54) PATTERN EXPOSURE APPARATUS, DEVICE MANUFACTURING METHOD, AND EXPOSURE APPARATUS

(71) Applicant: NIKON CORPORATION, Tokyo (JP)

(72) Inventors: Masaki Kato, Yokohama (JP); Yasushi Mizuno, Saitama (JP); Toshiharu Nakashima, Fukaya (JP); Satoshi Kawado, Tokyo (JP)

(73) Assignee: NIKON Corporation, Tokyo (JP)

( * ) Notice: Subject to any disclaimer, the term of this patent is extended or adjusted under 35 U.S.C. 154(b) by 139 days.

(21) Appl. No.: 18/397,308

(22) Filed: Dec. 27, 2023

(65) Prior Publication Data

US 2024/0248409 A1 Jul. 25, 2024

Related U.S. Application Data

(63) Continuation of application No. PCT/JP2022/026489, filed on Jul. 1, 2022.

(30) Foreign Application Priority Data

Jul. 5, 2021 (JP) ................................. 2021-111450

(51) Int. Cl.
*G03F 7/00* (2006.01)
*G02B 19/00* (2006.01)
*G02B 27/00* (2006.01)

(52) U.S. Cl.
CPC ..... *G03F 7/70291* (2013.01); *G02B 19/0009* (2013.01); *G02B 27/0068* (2013.01); *G03F 7/7015* (2013.01); *G03F 7/70191* (2013.01)

(58) Field of Classification Search
CPC .............. G03F 7/70291; G03F 7/7015; G03F 7/70191; G03F 7/70058; G03F 7/20;
(Continued)

(56) References Cited

U.S. PATENT DOCUMENTS

| | | | | |
|---|---|---|---|---|
| 7,233,383 | B2 * | 6/2007 | Tokita | ................. G03F 7/70916 355/30 |
| 7,430,036 | B2 * | 9/2008 | Sekine | ................ G03F 7/70291 356/521 |

(Continued)

FOREIGN PATENT DOCUMENTS

| | | |
|---|---|---|
| JP | 2004-039871 A | 2/2004 |
| KR | 10-2020-0062316 A | 6/2020 |
| WO | 2018/088550 A1 | 5/2018 |

OTHER PUBLICATIONS

Jul. 16, 2024 Office Action issued in Japanese Patent Application No. 2023-533106.

(Continued)

*Primary Examiner* — Hung V Nguyen
(74) *Attorney, Agent, or Firm* — Oliff PLC

(57) ABSTRACT

A pattern-exposure-apparatus includes: spatial-light-modulating-element including a plurality of micro-mirrors selectively driven based on drawing data, illumination-unit that irradiates spatial-light-modulating-element with illumination-light at predetermined-incidence-angle, and projection-unit that projects reflected-light from selected micro-mirrors of spatial-light-modulating-element in ON-state to substrate, and pattern-exposure-apparatus projects and exposes pattern corresponding to drawing data to substrate, illumination-unit including condensing-optical-member that condenses light from surface-light-source having predetermined shape so as to obliquely irradiate light to spatial-light-modulating-element and that is disposed along optical-axis which is inclined at incidence-angle with respect to optical-axis of projection-unit so as to optically conjugate surface-light-source with pupil of projection-unit, and correcting-optical-member that deforms shape of outline of the surface-light-source so as to correct distortion of outline of image of the surface-light-source, which is formed on pupil of the pro- (Continued)

jection-unit by reflected-light from micro-mirrors of the spatial-light-modulating-element in ON-state, into elliptical-shape according to incidence-angle.

14 Claims, 31 Drawing Sheets

(58) Field of Classification Search
CPC ............. G03F 7/70308; G03F 7/70075; G02B 19/0009; G02B 27/0068; G02B 26/0833
See application file for complete search history.

(56) References Cited

U.S. PATENT DOCUMENTS 7,719,753 B2 * 5/2010 Meisburger ......... G03F 7/70383
359/290

8,465,155 B2 * 6/2013 Kessler .................. G03B 21/28
353/33
2005/0219493 A1 10/2005 Oshida et al.
2020/0249580 A1 8/2020 Kono

OTHER PUBLICATIONS

Aug. 23, 2022 Search Report issued in International Patent Application No. PCT/JP2022/026489.
Aug. 23, 2022 Written Opinion of the International Searching Authority issued in International Patent Application No. PCT/JP2022/026489.
Apr. 21, 2025 Office Action issued in Korean Patent Application No. 10-2023-7044548.

* cited by examiner (A)

(B)

$$\frac{Uy}{Ux} = \cos\theta\alpha$$

(A)

(B)

$$\frac{Uy}{Ux} = \cos\theta\alpha$$

$$\frac{Uy}{Ux} = \cos \theta \alpha$$

1

PATTERN EXPOSURE APPARATUS, DEVICE MANUFACTURING METHOD, AND EXPOSURE APPARATUS

CROSS-REFERENCE TO RELATED APPLICATION

Priority is claimed on Japanese Patent Application No. 2021-111450, filed on Jul. 5, 2021. The present application is a continuation application of International Application PCT/JP2022/026489, filed on Jul. 1, 2022. The contents of the above applications are incorporated herein.

BACKGROUND

Technical Field

The present invention relates to a pattern exposure apparatus configured to expose a pattern for an electronic device, and a device manufacturing method for an electronic device and an exposure apparatus, which use the same pattern exposure apparatus.

In the related art, in a lithography process of manufacturing a display panel by liquid crystal or organic EL, an electronic device (micro device) such as a semiconductor device (an integrated circuit or the like), or the like, a step-and-repeat type projection exposure apparatus (so-called stepper), a step-and-scan type projection exposure apparatus (so-called scanning stepper (also referred to as a scanner)), or the like is used. Such an exposure apparatus projects and exposes a mask pattern for an electronic device to a photosensitive layer applied on a surface of an exposed substrate (hereinafter, also simply referred to as a substrate) such as a glass substrate, a semiconductor wafer, a printed circuit board, a resin film, or the like.

Due to the time and expenses required to create a mask substrate that forms the mask pattern fixedly, an exposure apparatus using a spatial light modulating element (a variable mask pattern generator) such as a digital mirror device (DMD) or the like in which a plurality of micro mirrors that are slightly displaced are regularly arranged, instead of the mask substrate, is known (for example, see PCT International Publication No. 2018/088550). In the exposure apparatus disclosed in PCT International Publication No. 2018/088550, light from a light source 3 using a semiconductor laser with a wavelength of 405 nm or 365 nm is obliquely irradiated to a digital mirror device (DMD) as a spatial light modulating element 4 via an irradiation optical system 6 at an incidence angle of 22 to 26°, and the reflected light from pixel mirrors in an ON state among a plurality of pixel mirrors of the spatial light modulating element (DMD) 4 is projected to expose an exposure area of an object W via a projection optical system 5.

In the case of PCT International Publication No. 2018/088550, the inclination angle of the pixel mirror (micro mirror) of the DMD is set as an angle of ½ of the incidence angle 22 to 26° of the illumination light. Since the plurality of pixel mirrors (micro mirrors) are disposed at a constant pitch in a matrix, the function of an optical diffraction grating (brazed diffraction grating) is also provided. In particular, when a fine pattern for an electronic device is projected and exposed, if illumination light to the DMD is obliquely illuminated, an image forming state of a pattern may be deteriorated by the action as the diffraction grating of the DMD (a state of a generating direction or an intensity distribution of diffraction light).

SUMMARY

Solution to Problem

According to a first aspect of the present invention, there is provided a pattern exposure apparatus including: a spatial light modulating element including a plurality of micro mirrors selectively driven based on drawing data; an illumination unit configured to irradiate the spatial light modulating element with illumination light at a predetermined incidence angle; and a projection unit configured to project reflected light from selected micro mirrors of the spatial light modulating element in an ON state to a substrate, and the pattern exposure apparatus is configured to project and expose a pattern corresponding to the drawing data to the substrate, the illumination unit including: a condensing optical member that is configured to condense light from a surface light source having a predetermined shape which is a source of the illumination light so as to obliquely irradiate the light to the spatial light modulating element and that is disposed along an optical axis which is inclined at the incidence angle with respect to an optical axis of the projection unit so as to optically conjugate the surface light source with a pupil of the projection unit, and a correcting optical member configured to deform a shape of an outline of the surface light source so as to correct distortion of an outline of an image of the surface light source, which is formed on the pupil of the projection unit by the reflected light from the micro mirrors of the spatial light modulating element in the ON state, into an elliptical shape according to the incidence angle.

According to a second aspect of the present invention, there is provided a device manufacturing method of forming a pattern for an electronic device onto a substrate by obliquely illuminating illumination light from an illumination unit to a spatial light modulating element including a plurality of micro mirrors selectively driven based on drawing data of the pattern for the electronic device and by projecting and exposing reflected light from selected micro mirrors of the spatial light modulating element in an ON state to the substrate via a projection unit, the method including: a step of condensing light from a surface light source including a predetermined shape generated in the illumination unit as the illumination light and obliquely irradiating the light to the spatial light modulating element at a predetermined incidence angle; and a step of deforming an outline shape of the surface light source so as to correct distortion of an outline of an image of the surface light source, which is formed on a pupil of the projection unit by the reflected light from the micro mirrors of the spatial light modulating element in the ON state, into an elliptical shape according to the incidence angle.

According to a third aspect of the present invention, there is provided a exposure apparatus including: a spatial light modulating element including a plurality of micro mirrors, an illumination unit configured to irradiate the spatial light modulating element with illumination light, and a projection unit configured to project reflected light from micro mirrors of the spatial light modulating element in an ON state, the illumination unit including: a cylindrical lens, and a condensing optical member configured to condense light passed through the cylindrical lens and irradiate the spatial light modulating element with the light.

DESCRIPTION OF THE EMBODIMENTS

A pattern exposure apparatus (pattern forming apparatus) according to an aspect of the present invention will be described below in detail with reference to the accompanying drawings while exemplifying suitable embodiments. Further, aspects of the present invention are not limited to these embodiments, and also include those with various changes or improvements. That is, the components described below include those that would likely be assumed by a person skilled in the art and those that are substantially the same, and the components described below can be combined as appropriate. In addition, various omissions, substitutions, or changes of the components may be made without departing from the scope of the present invention. Further, throughout the drawings and detailed descriptions that follow, the same reference signs are used for members or components that accomplish the same or similar functions.
(Entire Configuration of Pattern Exposure Apparatus)

Figure 1:
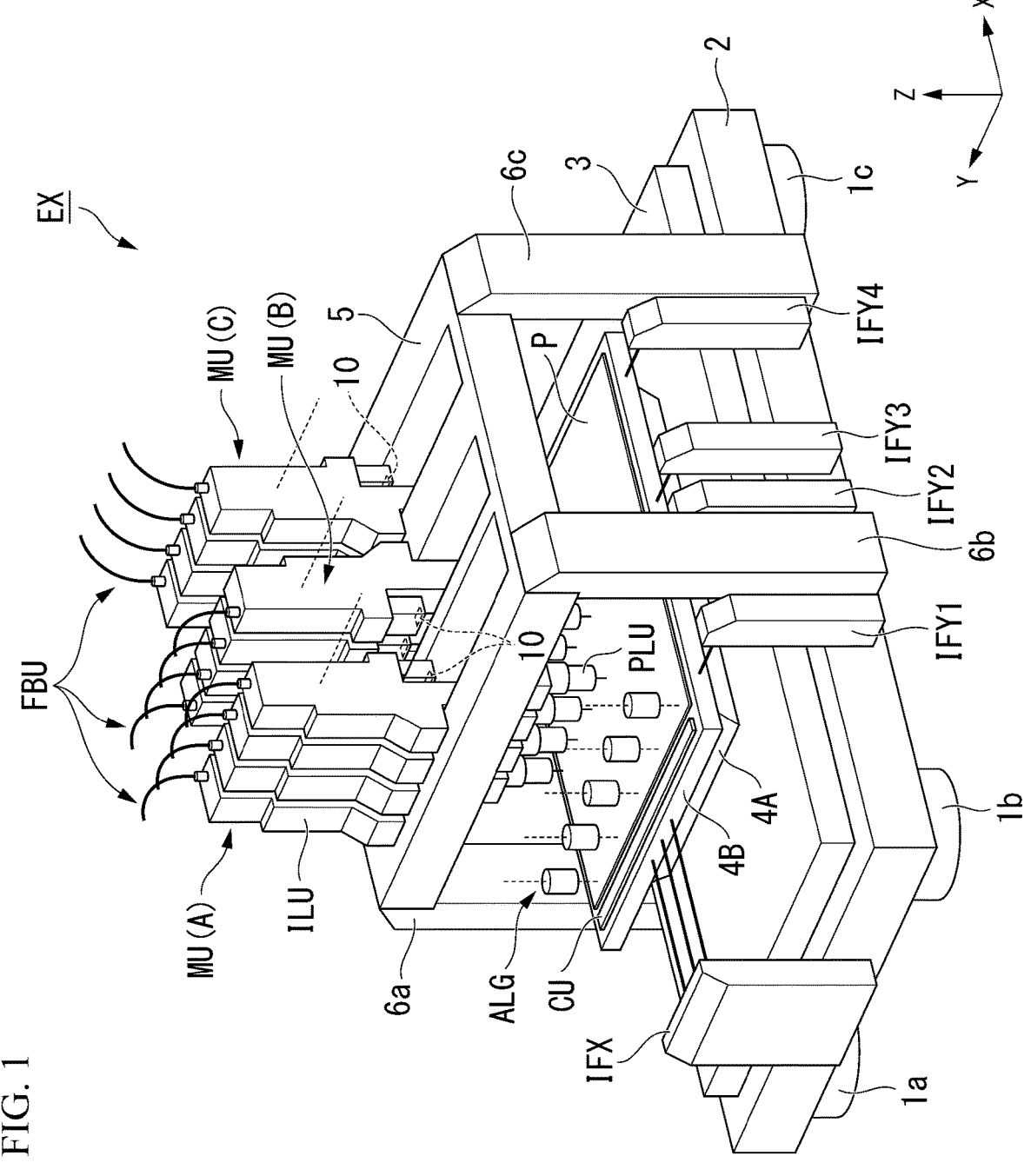
FIG. 1 is a perspective view showing a schematic external configuration of a pattern exposure apparatus EX according to an embodiment.

FIG. 1 is a perspective view showing a schematic external configuration of a pattern exposure apparatus (hereinafter, also simply referred to as an exposure apparatus) EX of the embodiment. The exposure apparatus EX is an apparatus configured to project exposure light with an intensity distribution dynamically modulated in a space to form an image on an exposed substrate using a spatial light modulating element (digital mirror device: DMD). In a specified embodiment, the exposure apparatus EX is a step-and-scan type projection exposure apparatus (scanner) in which a rectangular (square) glass substrate used in a display device (flat panel display) or the like is provided as an exposure object. The glass substrate is a substrate P for a flat panel display, in which a length of at least one side or a diagonal length is 500 mm or more and a thickness is 1 mm or less. The exposure apparatus EX exposes a projection image of a pattern created by the DMD to a photosensitive layer (photoresist) formed with a constant thickness on a surface of the substrate P. The substrate P conveyed from the exposure apparatus EX after exposure is sent to a predetermined process (a film forming process, an etching process, a plating process, or the like) after a development process.

The exposure apparatus EX includes a stage apparatus constituted by a pedestal 2 placed on active vibration proof units 1a, 1b, 1c and 1d (1d is not shown), a surface plate 3 placed on the pedestal 2, an XY stage 4A that is two-dimensionally movable on the surface plate 3, a substrate holder 4B configured to suck and hold the substrate P on a planar surface on the XY stage 4A, and laser length measurement interferometers (hereinafter, also simply referred to as an interferometer) IFX and IFY1 to IFY4 configured to measure a two-dimensional moving position of the substrate holder 4B (the substrate P). Such a stage apparatus is disclosed in, for example, US Patent Publication No. 2010/0018950 and US Patent Publication No. 2012/0057140.

In FIG. 1, an XY plane of an orthogonal coordinate system XYZ is set to be parallel to a flat surface of the surface plate 3 of the stage apparatus, and the XY stage 4A is set to be able to move in translation within the XY plane. In addition, in the embodiment, a direction parallel to the X axis of the coordinate system XYZ is set as a scanning movement direction of the substrate P (the XY stage 4A)

upon scanning exposure. A moving position of the substrate P in the X axis direction is sequentially measured by the interferometer IFX, and a moving position in a Y axis direction is sequentially measured by at least one or more (preferably two) of the four interferometers IFY1 to IFY4. The substrate holder 4B is configured to be finely movable with respect to the XY stage 4A in a Z axis direction perpendicular to the XY plane and finely tiltable with respect to the XY plane in an arbitrary direction, and focus adjustment and leveling (degree of parallelization) adjustment between a surface of the substrate P and an image forming surface of the projected pattern are actively performed. Further, the substrate holder 4B is configured to be microrotatable (θz rotation) around an axis parallel to the Z axis in order to actively adjust an inclination of the substrate P in the XY plane.

The exposure apparatus EX further includes an optical surface plate 5 configured to hold a plurality of exposure (drawing) module groups MU(A), MU(B) and MU(C), and main columns 6a, 6b, 6c and 6d (6d is not shown) configured to support the optical surface plate 5 from the pedestal 2. Each of the plurality of exposure module groups MU(A), MU(B) and MU(C) has an illumination unit ILU attached on a side of the optical surface plate 5 in a +Z direction and configured to allow incidence of illumination light from an optical fiber unit FBU, and a projection unit PLU attached to a side of the optical surface plate 5 in a −Z direction and having an optical axis parallel to the Z axis. Further, each of the exposure module groups MU(A), MU(B) and MU(C) includes a digital mirror device (DMD) 10 configured to reflect illumination light from the illumination unit ILU in the −Z direction and cause the illumination light to enter the projection unit PLU serving as an optical modulation unit. A detailed configuration of an exposure module group constituted by the illumination unit ILU, the DMD 10 and the projection unit PLU will be described below.

A plurality of alignment systems (microscopes) ALG configured to detect alignment marks formed at a plurality of predetermined positions on the substrate P are attached to a side of the optical surface plate 5 of the exposure apparatus EX in the −Z direction. In order to perform confirmation (calibration) of a relative positional relation in an XY plane of a detection field of vision of each of the alignment systems ALG, confirmation (calibration) of a base line error between each projection position of a pattern image projected from the projection unit PLU of each of the exposure module groups MU(A), MU(B) and MU(C) and a position of a detection field of vision of each of the alignment systems ALG, or confirmation of a position or image quality of the pattern image projected from the projection unit PLU, a calibration reference portion CU is provided on an end portion on the substrate holder 4B in the −X direction. Further, while a part in FIG. 1 is not shown, in the embodiment, in each of the exposure module groups MU(A), MU(B) and MU(C), nine modules are arranged at a constant interval in the Y direction as an example, but the number of modules may be smaller than nine or may be greater than nine.

Figure 2:
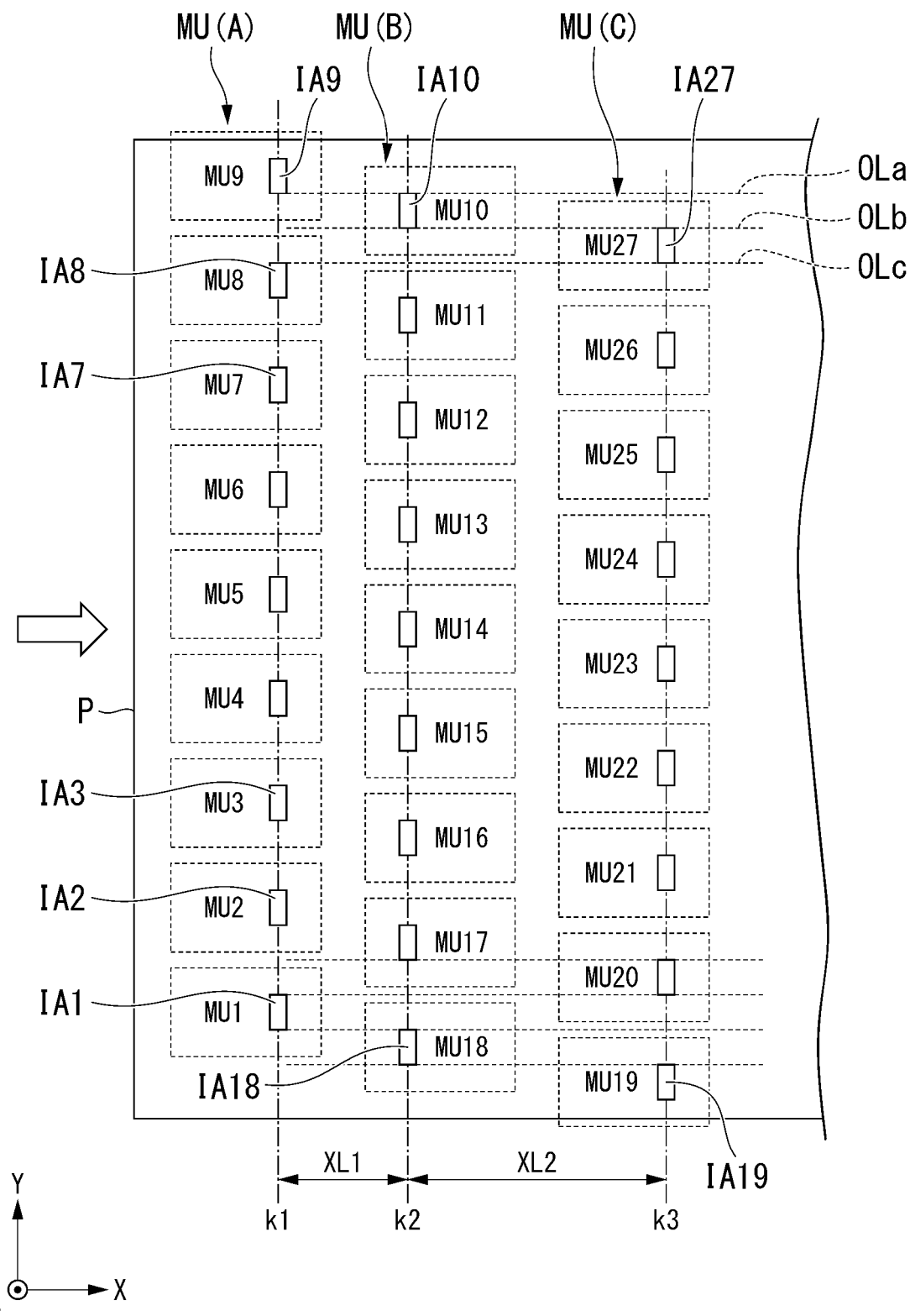
FIG. 2 is a view showing a disposition example of a projection region IAn of a DMD 10 projected onto a substrate P by a projection unit PLU of each of a plurality of exposure module groups MU.

FIG. 2 is a view showing a disposition example of projection regions IAn of the digital mirror device (DMD) 10 projected onto the substrate P by the projection unit PLU of each of the exposure module groups MU(A), MU(B) and MU(C), and the same orthogonal coordinate system XYZ as in FIG. 1 is set. In the embodiment, each of the exposure module group MU(A) of a first row, the exposure module group MU(B) of a second row, and the exposure module group MU(C) of a third row, which are separated from each other in the X direction, is constituted by nine modules arranged in the Y direction. The exposure module group MU(A) is constituted by nine modules MU1 to MU9 disposed in the +Y direction, the exposure module group MU(B) is constituted by nine modules MU10 to MU18 disposed in the −Y direction, and the exposure module group MU(C) is constituted by nine modules MU19 to MU27 disposed in the +Y direction. All the modules MU1 to MU27 have the same configurations, and when the exposure module group MU(A) and the exposure module group MU(B) are set to face each other in the X direction, the exposure module group MU(B) and the exposure module group MU(C) have a back-to-back relation in the X direction.

In FIG. 2, a shape of each of projection regions IA1, IA2, IA3, . . . , IA27 (n is 1 to 27, expressed as IAn) according to each of the modules MU1 to MU27 has a rectangular shape in the Y direction with an aspect ratio of about 1:2 as an example. In the embodiment, according to scanning movement of the substrate P in the +X direction, continuous exposure is performed by an end portion of each of the projection regions IA1 to IA9 of the first row in the −Y direction and an end portion of each of the projection regions IA10 to IA18 of the second row in the +Y direction. Then, a region on the substrate P not exposed by each of the projection regions IA1 to IA18 of the first row and the second row is continuously exposed by each of the projection regions IA19 to IA27 of the third row. A center point of each of the projection regions IA1 to IA9 of the first row is located on a line k1 parallel to the Y axis, a center point of each of the projection regions IA10 to IA18 of the second row is located on a line k2 parallel to the Y axis, and a center point of each of the projection regions IA19 to IA27 of the third row is located on a line k3 parallel to the Y axis. An interval between the line k1 and the line k2 in the X direction is set to a distance XL1, and an interval between the line k2 and the line k3 in the X direction is set to a distance XL2.

Figure 3:
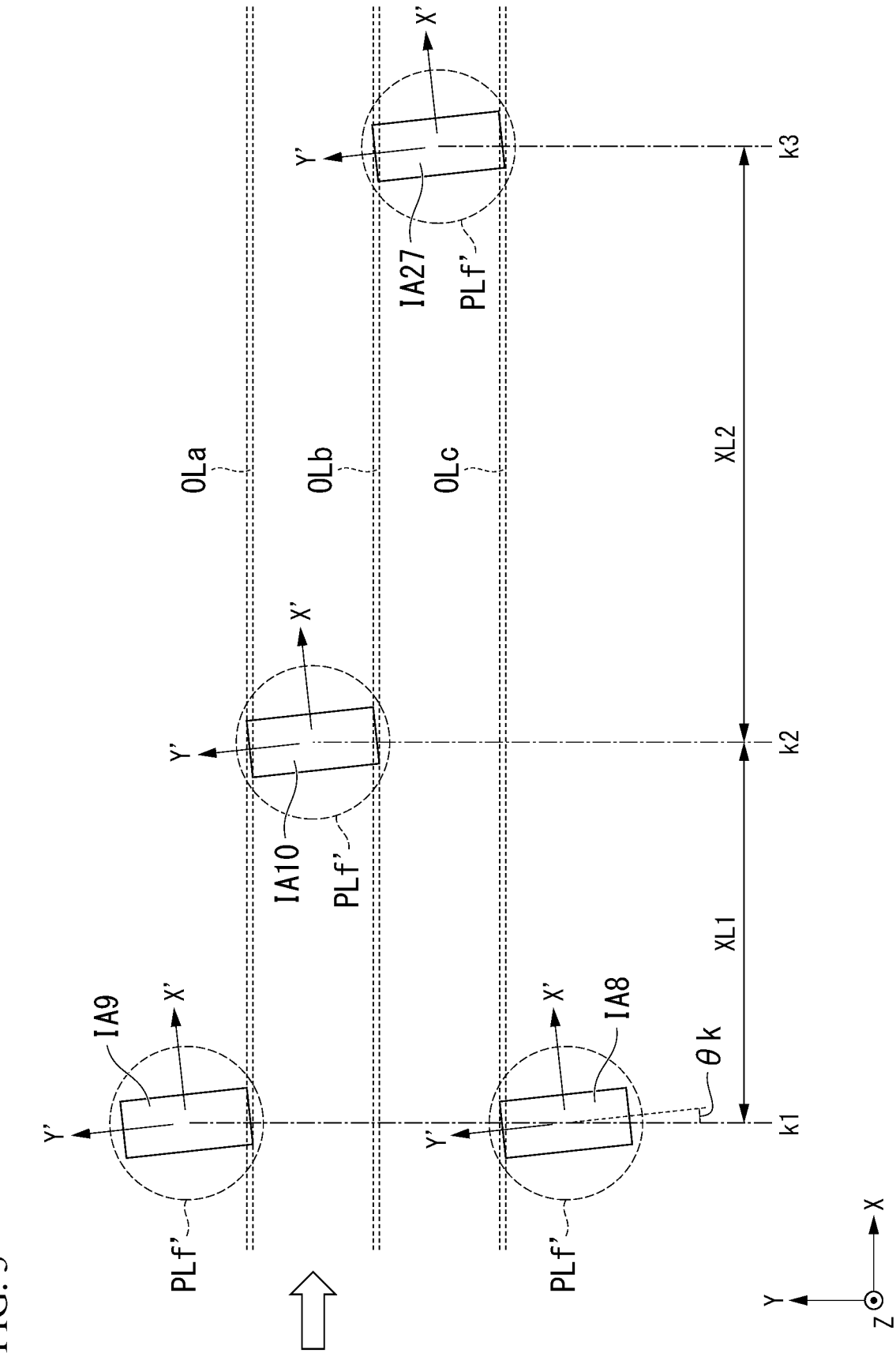
FIG. 3 is a view for describing a state of continuous exposure by each of four specified projection regions IA8, IA9, IA10 and IA27 in FIG. 2.

Here, a state of the continuous exposure will be described with reference to FIG. 3 when a joint portion between the end portion of the projection region IA9 in the −Y direction and the end portion of the projection region IA10 in the +Y direction is referred to as OLa, a joint portion between the end portion of the projection region IA10 in the −Y direction and the end portion of the projection region IA27 in the +Y direction is referred to as OLb, and a joint portion between the end portion of the projection region IA8 in the +Y direction and the end portion of the projection region IA27 in the −Y direction is referred to as OLc. In FIG. 3, the same orthogonal coordinate system XYZ as in FIG. 1 and FIG. 2 is set, and a coordinate system X'Y' in the projection regions IA8, IA9, IA10 and IA27 (and all the other projection regions IAn) are set to be inclined with respect to an X axis and a Y axis (the lines k1 to k3) of the orthogonal coordinate system XYZ by an angle θk. That is, the entire DMD 10 is inclined in the XY plane by the angle θk such that two-dimensional arrangement of the plurality of micro mirrors of the DMD 10 becomes the coordinate system X'Y'.

A circular region containing each of the projection regions IA8, IA9, IA10 and IA27 (and all the other projection regions IAn are also the same) in FIG. 3 represents a circular image field PLf of the projection unit PLU. In the joint portion OLa, a projection image of the micro mirror aligned obliquely (the angle θk) to the end portion of the projection region IA9 in the −Y' direction and a projection image of the micro mirror aligned obliquely (the angle θk) to the end portion of the projection region IA10 in the +Y' direction are set to overlap each other. In addition, in the joint portion OLb, a projection image of the micro mirror aligned obliquely (the angle θk) to the end portion of the projection region IA10 in the −Y' direction and a projection image of the micro mirror aligned obliquely (the angle θk) to the end portion of the projection region IA27 in the +Y' direction are set to overlap each other. Similarly, in the joint portion OLc, a projection image of the micro mirror aligned obliquely (the angle θk) to the end portion of the projection region IA8 in the +Y' direction and a projection image of the micro mirror aligned obliquely (the angle θk) to the end portion of the projection region IA27 in the −Y' direction are set to overlap each other.

(Configuration of Illumination Unit)

Figure 4:
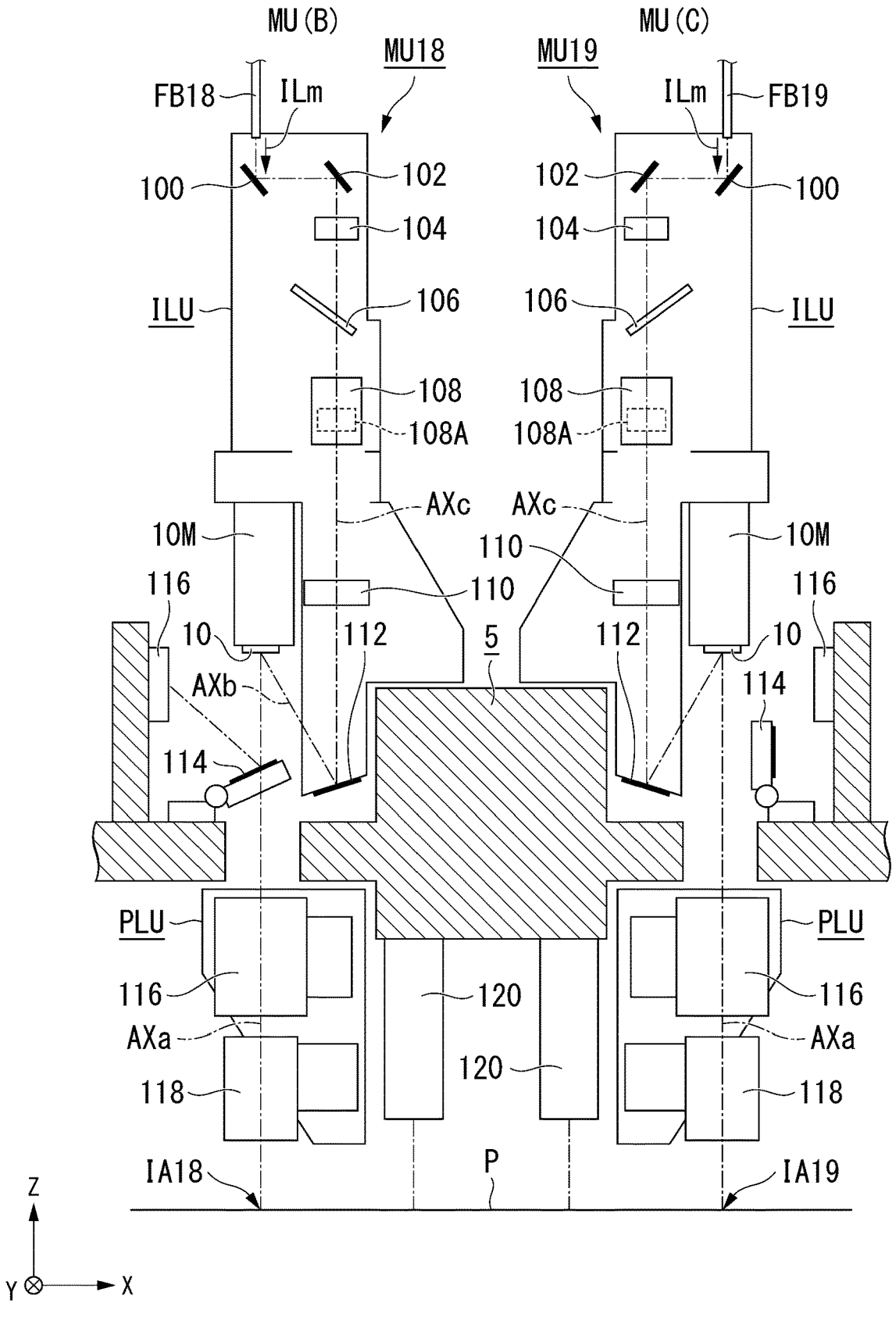
FIG. 4 is an optical arrangement view showing a specific configuration of two exposure modules MU18 and MU19 arranged in an X direction (scanning exposure direction) in an XZ plane.

FIG. 4 is an optical arrangement view showing a specific configuration of the module MU18 in the exposure module group MU(B) and the module MU19 in the exposure module group MU(C) shown in FIG. 1 and FIG. 2 in the XZ plane. The orthogonal coordinate system XYZ of FIG. 4 is set to the same as the orthogonal coordinate system XYZ of FIG. 1 to FIG. 3. In addition, as will be apparent from the disposition of the modules in the XY plane shown in FIG. 2, the module MU18 is deviated from the module MU19 by a constant interval in the +Y direction, and they are installed to have a back-to-back relation. Since each of the optical members in the module MU18 and each of the optical members in the module MU19 are formed of the same material and have the same configuration, the optical configuration of the module MU18 will be mainly described in detail herein. Further, the optical fiber unit FBU shown in FIG. 1 is constituted by 27 optical fiber bundles FB1 to FB27 to correspond to the 27 modules MU1 to MU27 shown in FIG. 2, respectively.

The illumination unit ILU of the module MU18 is constituted by a mirror 100 configured to reflect illumination light ILm that advances from an emission end of the optical fiber bundle FB18 in the −Z direction, a mirror 102 configured to reflect the illumination light ILm from the mirror 100 in the −Z direction, an input lens system 104 serving as a collimator lens, an optical integrator 108 including an illuminance adjustment filter 106, a micro fly's eye (MFE) lens, a field lens, or the like, a condenser lens system 110, and an inclined mirror 112 configured to reflect the illumination light ILm from the condenser lens system 110 toward the DMD 10. The mirror 102, the input lens system 104, the optical integrator 108, the condenser lens system 110, and the inclined mirror 112 are disposed along an optical axis AXc parallel to the Z axis.

The optical fiber bundle FB18 is configured by a single optical fiber wire or a bundle of a plurality of optical fiber wires. The illumination light ILm irradiated from an emission end of the optical fiber bundle FB18 (each of the optical fiber wires) is set to a numerical aperture (NA, also referred to as a flare angle) that allows incidence of the light without being cut off by the input lens system 104 in the subsequent stage. A position of a front focal point of the input lens system 104 is set to the same as the position of the emission end of the optical fiber bundle FB18 by design. Further, the position of the rear focal point of the input lens system 104 is set such that illumination light ILm from a single or a plurality of point light sources formed on the emission end of the optical fiber bundle FB18 overlaps an incident surface side of an MFE lens 108A of the optical integrator 108. Accordingly, an incident surface of the MFE lens 108A is Kohler-illuminated by the illumination light ILm from the emission end of the optical fiber bundle FB18. Further, in an initial state, a geometrical center point of the emission end of the optical fiber bundle FB18 in the XY plane is located on the optical axis AXc, and a principal ray (central ray) of the illumination light ILm from the point light source of the emission end of the optical fiber wire is parallel to (or coaxial with) the optical axis AXc.

The illumination light ILm from the input lens system 104 enters the condenser lens system 110 through the optical integrator 108 (the MFE lens 108A, the field lens, or the like) after reduction in illuminance with an arbitrary value of a range of 0% to 90% by the illuminance adjustment filter 106. The MFE lens 108A is constituted by a plurality of rectangular micro lens with angles of tens μm in a two-dimensional array, and the entire shape in the XY plane is set to be almost similar to the entire shape of the mirror surface of the DMD 10 (an aspect ratio is about 1:2). In addition, a position of the front focal point of the condenser lens system 110 is set to substantially the same as the position of the emission surface of the MFE lens 108A. For this reason, the illumination light from each of the point light sources formed on each emission side of the plurality of micro lenses of the MFE lens 108A is converted to a substantially parallel light flux by the condenser lens system 110, reflected by the inclined mirror 112, and then, overlaps on the DMD 10 to be distributed with a uniform illuminance distribution.

Since a surface light source in which a plurality of point light sources (condensing points) are two-dimensionally densely arranged is generated on the emission surface of the MFE lens 108A, the surface light source functions as a surface light source member. In this way, for example, as disclosed in Japanese Unexamined Patent Application, First Publication No. 2004-045885, the MFE lens 108A may be constituted by two cylindrical micro fly's eye lens elements, each in which a plurality of cylindrical lenses are arranged on each of an incident surface side and an emission surface side of the illumination light, disposed in the optical axis direction.

In the module MU18 shown in FIG. 4, the optical axis AXc parallel to the Z axis through the condenser lens system 110 is bent by the inclined mirror 112 and reaches the DMD 10, but an optical axis between the inclined mirror 112 and the DMD 10 becomes an optical axis AXb. In the embodiment, a neutral plane including a center point of each of the plurality of micro mirrors of the DMD 10 is set to be parallel to the XY plane. Accordingly, an angle formed between a normal line (parallel to the Z axis) of the neutral plane and the optical axis AXb becomes an incidence angle θα of the illumination light ILm with respect to the DMD 10. The DMD 10 is attached to a lower side of a mount portion 10M fixed to a support column of the illumination unit ILU. For example, a micro-motion stage in which a parallel link mechanism and a stretchable piezo element are assembled as disclosed in PCT International Publication No. 2006/120927 is provided in the mount portion 10M in order to finely adjust a position or a posture of the DMD 10.

The illumination light ILm irradiated to the micro mirror in an ON state among the micro mirrors of the DMD 10 is reflected toward the projection unit PLU in the X direction in the XZ plane. Meanwhile, the illumination light ILm irradiated to the micro mirror in an OFF state among the micro mirrors of the DMD 10 is reflected not to be directed toward the projection unit PLU in the Y direction in the YZ plane. While described below in detail, the DMD 10 in the embodiment is a roll and pitch driving type in which the ON state and the OFF state are switched by inclination in a roll direction and inclination in a pitch direction of the micro mirror.

A movable shutter 114 configured to shield the reflected light from the DMD 10 in a non-exposure period is detachably provided in an optical path between the projection units PLU from the DMD 10. The movable shutter 114 is pivoted to an angle position where it retreats from the optical path in an exposure period as shown on the side of the module MU19 and pivoted to an angle position where it is obliquely inserted into the optical path in the non-exposure period as shown in the side of the module MU18. A reflecting surface is formed in the movable shutter 114 on the side of the DMD 10, and light from the DMD 10 reflected thereon is irradiated to a light absorption body 115. The light absorption body 115 absorbs light energy in an ultraviolet wavelength region (a wavelength of 400 nm or less) without re-reflection and converts the light energy into thermal energy. For this reason, a heat radiation mechanism (a heat radiation fin or a cooling mechanism) is also provided in the light absorption body 115. Further, while not shown in FIG. 4, the reflected light from the micro mirror of the DMD 10 in the OFF state during the exposure period is absorbed by the same light absorption body (not shown in FIG. 4) installed with respect to the optical path between the DMD 10 and the projection unit PLU in the Y direction (a direction perpendicular to the drawing of FIG. 4).

(Configuration of Projection Unit)

The projection unit PLU attached to a lower side of the optical surface plate 5 is constituted as a bilateral telecentric image forming projection lens system constituted by a first lens group 116 and a second lens group 118 disposed along an optical axis AXa parallel to the Z axis. Each of the first lens group 116 and the second lens group 118 is configured to be translated with respect to a support column fixed to a lower side of the optical surface plate 5 by a micro-motion actuator in a direction along the Z axis (the optical axis AXa). A projection magnification Mp of an image forming projection lens system by the first lens group 116 and the second lens group 118 is determined by a relation between an arrangement pitch Pd of the micro mirrors on the DMD 10 and a minimum line width (minimum pixel dimension) Pg of a pattern projected into the projection region IAn (n=1 to 27) on the substrate P.

As an example, when the required minimum line width (minimum pixel dimension) Pg is 1 μm and the arrangement pitch Pd of the micro mirrors is 5.4 μm, the projection magnification Mp is set to about ⅙ in consideration of an inclination angle θk in the XY plane of the projection region IAn (the DMD 10) described in FIG. 3 above. The image forming projection lens system by the lens groups 116 and 118 stands up and inverts a reduced image of the entire mirror surface of the DMD 10 to form an image in the projection region IA18 (IAn) on the substrate P.

The first lens group 116 of the projection unit PLU is finely movable in the optical axis AXa direction by an actuator in order to perform fine adjustment (about ±several tens ppm) of the projection magnification Mp, and the second lens group 118 is finely movable in the optical axis AXa direction by an actuator in order to perform high speed adjustment of the focus. Further, in order to measure a position change of a surface of the substrate P in the Z axis direction with accuracy of submicron or less, a plurality of oblique incident light type focus sensors 120 are provided below the optical surface plate 5. The plurality of focus sensors 120 measure a position change of the entire substrate P in the Z axis direction, a position change of a partial region on the substrate P in the Z axis direction corresponding to each of the projection regions IAn (n=1 to 27), a partial inclination change of the substrate P, or the like.

In the illumination unit ILU and the projection unit PLU as described above, since the projection region IAn needs to be inclined by the angle θk in the XY plane as shown in FIG.

3 above, the DMD 10 and the illumination unit PLU (at least an optical path portion of the mirror 102 to a mirror 112 along the optical axis AXc) in FIG. 4 are disposed to be inclined by the angle θk in the XY plane as a whole.

Figure 5:
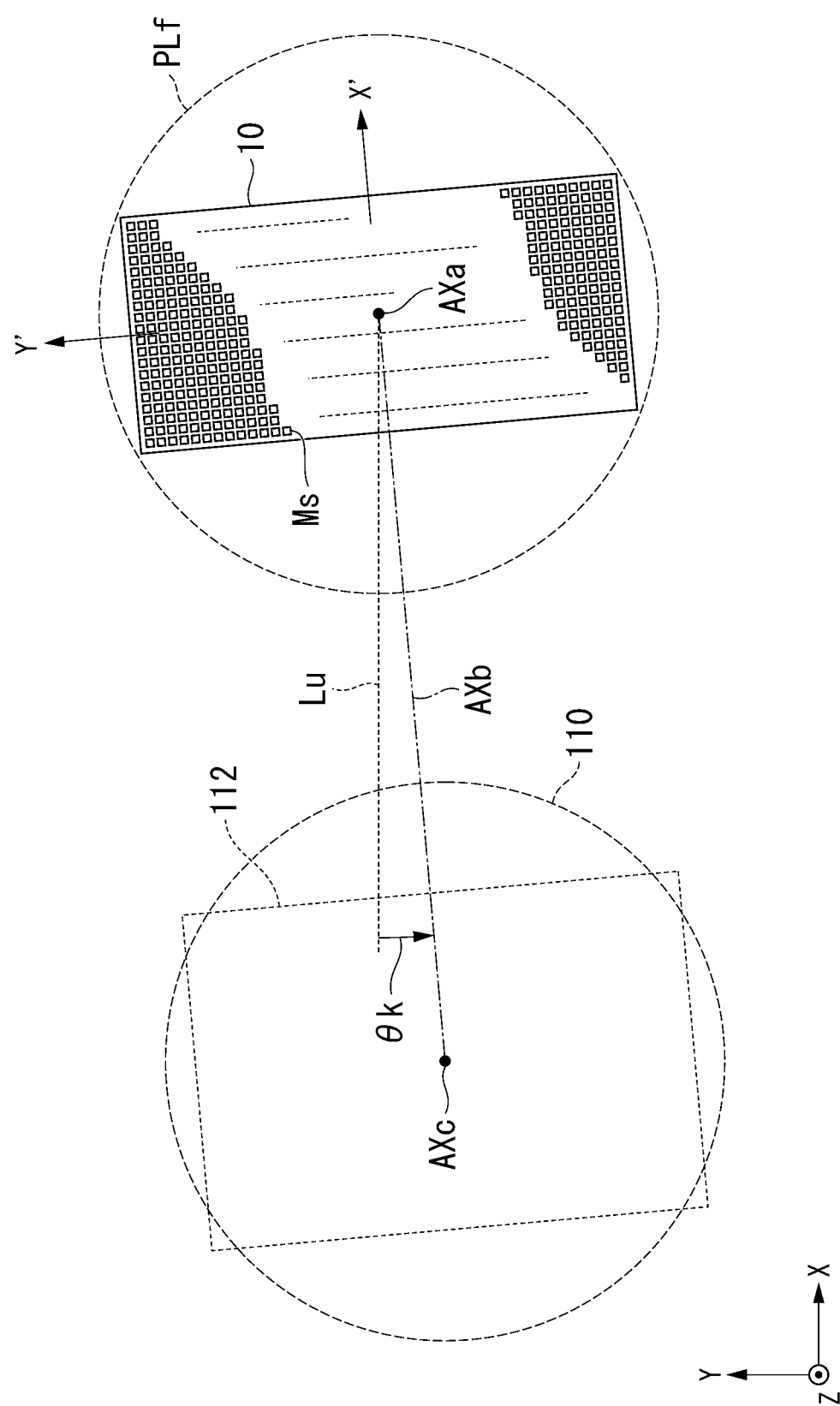
FIG. 5 is a view schematically showing a state in which the DMD 10 and the illumination unit PLU are inclined by an angle θk in the XY plane.

FIG. 5 is a view schematically showing a state in the XY plane in which the DMD 10 and the illumination unit PLU are inclined by the angle θk in the XY plane. In FIG. 5, the orthogonal coordinate system XYZ is the same as the coordinate system XYZ of each of FIG. 1 to FIG. 4 above, and an arrangement coordinate system X'Y' of the micro mirrors Ms of the DMD 10 is the same as the coordinate system X'Y' shown in FIG. 3. A circle that contains the DMD 10 is the image field PLf on an object surface side of the projection unit PLU, and the optical axis AXa is located on a center thereof. Meanwhile, the optical axis AXb where the optical axis AXc passing through the condenser lens system 110 of the illumination unit ILU is folded by the inclined mirror 112 is disposed to be inclined by the angle θk from a line Lu parallel to the X axis in the XY plane.
(Image Forming Optical Path by DMD)

Figure 6:
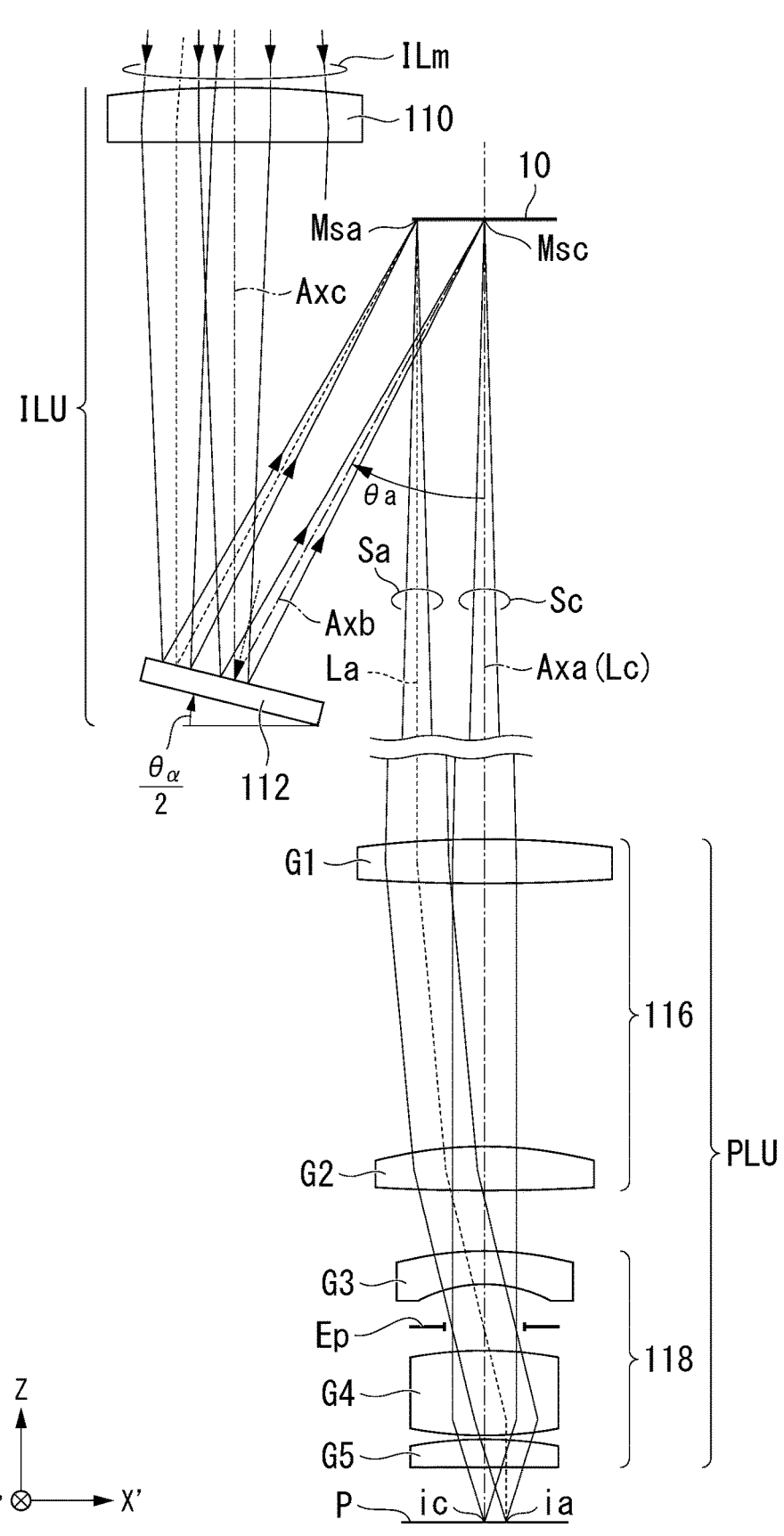
FIG. 6 is a view for describing an image forming state of micro mirrors of the DMD 10 by the projection unit PLU in detail.

Next, an image forming state of the micro mirrors Ms of the DMD 10 by the projection unit PLU (image forming projection lens system) will be described in detail with reference to FIG. 6. The orthogonal coordinate system X'Y'Z of FIG. 6 is the same as the coordinate system X'Y'Z shown in FIG. 3 and FIG. 5 above, and FIG. 6 shows an optical path from the condenser lens system 110 of the illumination unit ILU to the substrate P. The illumination light ILm from the condenser lens system 110 advances along the optical axis AXc, is totally reflected by the inclined mirror 112, and reaches the mirror surface of the DMD 10 along the optical axis AXb. Here, the micro mirror Ms located at a center of the DMD 10 is referred to as Msc, the micro mirrors Ms located therearound are referred to as Msa, and the micro mirrors Msc and Msa are in an ON state.

When an inclination angle of the micro mirror Ms in an ON state is, for example, 17.5° as a standard value with respect to the X'Y' plane (XY plane), in order to make each principal ray of reflected lights Sc and Sa from the micro mirrors Msc and Msa parallel to the optical axis AXa of the projection unit PLU, an incidence angle (an angle from the optical axis AXa of the optical axis AXb) θα of the illumination light ILm irradiated to the DMD 10 is set to 35.0°. Accordingly, in this case, the reflecting surface of the inclined mirror 112 is also disposed to be inclined by 17.5° (=θα/2) with respect to the X'Y' plane (XY plane). A principal ray Lc of the reflected light Sc from the micro mirrors Msc is coaxial with the optical axis AXa, a principal ray La of the reflected light Sa from the micro mirrors Msa is parallel to the optical axis AXa, and the reflected lights Sc and Sa enter the projection unit PLU according to a predetermined numerical aperture (NA).

A reduced image ic of the micro mirror Msc reduced by the projection magnification Mp of the projection unit PLU is formed on the substrate P at a position of the optical axis AXa in a telecentric state by the reflected light Sc. Similarly, a reduced image ia of the micro mirrors Msa reduced by the projection magnification Mp of the projection unit PLU is formed on the substrate P at a position away from the reduced image ic in the +X' direction in a telecentric state by the reflected light Sa. As an example, the first lens system 116 of the projection unit PLU is constituted by three lens groups G1, G2 and G3, and the second lens system 118 is constituted by two lens groups G4 and G5. An exit pupil (also simply referred to as a pupil) Ep is set between the first lens system 116 and the second lens system 118. A light source image of the illumination light ILm (an aggregate of a plurality of point light sources formed on an emission surface side of the MFE lens 108A) is formed at a position of the pupil Ep, and configures Kohler illumination. The pupil Ep is also referred to as an opening of the projection unit PLU, and a size (diameter) of the opening is one of factors that define resolution of the projection unit PLU.

Regular reflected light from the micro mirrors Ms in an ON state of the DMD 10 is set to pass therethrough without being blocked by the maximum diameter (diameter) of the pupil Ep, and a numerical aperture NAi on an image side (the side of the substrate P) in an equation representing resolution R, $R=k1\cdot(\lambda/NAi)$, is determined by the maximum diameter of the pupil Ep and a distance of a rear (image side) focal point of the projection unit PLU (the lens groups G1 to G5 as the image forming projection lens system). In addition, a numerical aperture NAo on the side of the physical surface (the DMD 10) of the projection unit PLU (the lens groups G1 to G5) is expressed by a product of the projection magnification Mp and the numerical aperture NAi, and when the projection magnification Mp is $\frac{1}{6}$, it becomes NAo=NAi/6.

In the configuration of the illumination unit ILU and the projection unit PLU shown in FIG. 6 and FIG. 4 above, an emission end of the optical fiber bundle FBn (n=1 to 27) connected to each module MUn (n=1 to 27) is set to an optical conjugation relation with an emission end side of the MFE lens 108A of the optical integrator 108 by the input lens system 104, and an incidence end side of the MFE lens 108A is set to an optical conjugation relation with a center of the mirror surface (neutral plane) of the DMD 10 by the condenser lens system 110. Accordingly, the illumination light ILm irradiated to the entire mirror surface of the DMD 10 becomes a uniform illuminance distribution (for example, intensity irregularity within ±1%) due to an action of the optical integrator 108. In addition, an emission end side of the MFE lens 108A and a surface of the pupil Ep of the projection unit PLU are set to an optical conjugation relation by the condenser lens system 110 and the lens groups G1 to G3 of the projection unit PLU.

Figure 7:
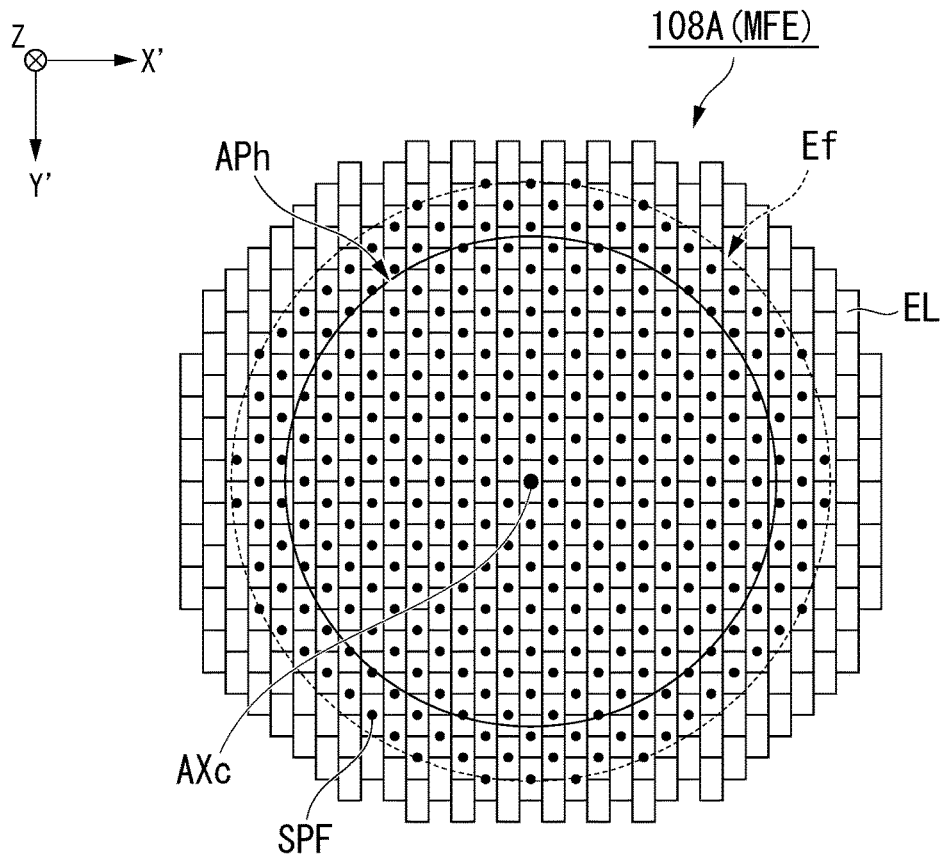
FIG. 7 is a schematic view showing an MFE lens 108A as an optical integrator 108 from an emission surface side.

FIG. 7 is a schematic view showing the MFE lens 108A of the optical integrator 108 seen from an emission surface side. The MFE lens 108A has a cross-sectional shape similar to that of the entire mirror surface (image forming region) of the DMD 10, and is configured by densely arranging a plurality of lens elements EL having a rectangular cross-sectional shape extending in the Y' direction in the X'Y' plane in the X' direction and the Y' direction. The illumination light ILm from the input lens system 104 shown in FIG. 4 is irradiated into a substantially circular irradiation region Ef on an incident surface side of the MFE lens 108A. The irradiation region Ef is a circular region using the optical axis AXc as a center by design with a shape similar to each emission end of a single or a plurality of optical fiber wires of the optical fiber bundle FB18 (FBn) in FIG. 4.

Point light sources SPF created by the illumination light ILm from the emission end of the optical fiber bundle FB18 (FBn) are densely distributed in a substantially circular region on the emission surface side of each of the lens elements EL located in the irradiation region Ef among the plurality of lens elements EL of the MFE lens 108A. In addition, a circular region APh in FIG. 7 represents an opening range when an opening diaphragm having a circular opening is provided on an emission surface side of the MFE lens 108A. The actual illumination light ILm is created by the plurality of point light sources SPF scattered in the circular region APh, and light from the point light sources SPF outside the circular region APh is blocked.

FIGS. 8(A), 8(B) and 8(C) are views schematically show-ing an example of an arrangement relation between the point light sources SPF formed on the emission surface side of the lens elements EL of the MFE lens 108A and the emission end of the optical fiber bundle FBn in FIG. 7. The coordinate system X'Y' of each of FIGS. 8(A), 8(B) and 8(C) are the same as the coordinate system X'Y' set in FIG. 7. FIG. 8(A) expresses a case in which the optical fiber bundle FBn is a single optical fiber wire, FIG. 8(B) expresses a case in which two optical fiber wires as the optical fiber bundle FBn are arranged in the X' direction, and FIG. 8(C) expresses a case in which three optical fiber wires as the optical fiber bundle FBn are arranged in the X' direction.

Since the emission end of the optical fiber bundle FBn and the emission surface of the MFE lens 108A (the lens elements EL) are set to an optical conjugation relation (image forming relation), when the optical fiber bundle FBn is the single optical fiber wire, as shown in FIG. 8(A), the single point light source SPF is formed at a center position of the emission surface side of the lens elements EL. When the two optical fiber wires are bundled in the X' direction as the optical fiber bundle FBn, as shown in FIG. 8(B), a geometrical center of the two point light sources SPF is formed to become a center position of the emission surface side of the lens elements EL. Similarly, when the three optical fiber wires are bundled in the X' direction as the optical fiber bundle FBn, as shown in FIG. 8(C), a geo-metrical center of the three point light sources SPF is formed to become a center position of the emission surface side of the lens elements EL.

Further, when power of the illumination light ILm from the optical fiber bundle FBn is large and the point light sources SPF are condensed to the emission surface of each of the lens elements EL of the MFE lens 108A as the surface light source member or the optical integrator, damage (cloudiness, burning, or the like) may be applied to each of the lens elements EL. In this case, the condensing position of the point light sources SPF may be set in a space slightly deviated outward from the emission surface of the MFE lens 108A (the emission surface of the lens elements EL). In this way, a configuration in which a position of a point light source (focusing point) is deviated outward from the lens element in an illumination system using a fly's eye lens is disclosed in, for example, U.S. Pat. No. 4,939,630.

Figure 9:
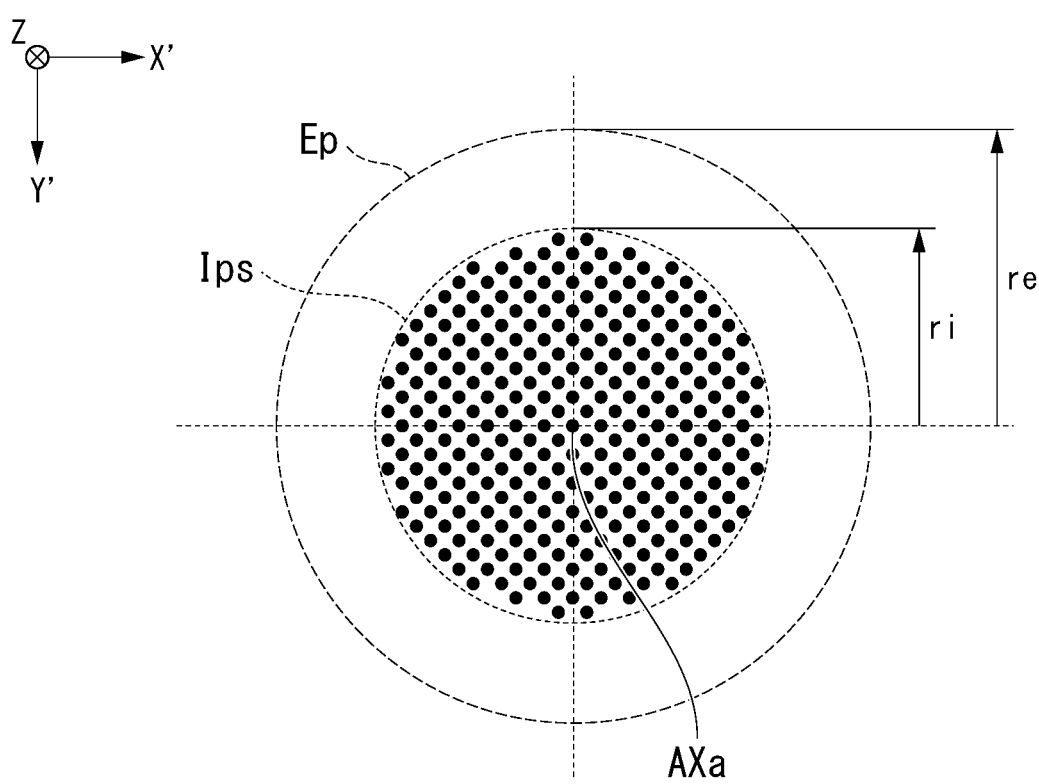
FIG. 9 is a view schematically showing an aspect of a light source image formed on a pupil Ep of the projection unit PLU shown in FIG. 6.

FIG. 9 is a view schematically showing an aspect of a light source image Ips formed on the pupil Ep in the second lens system 118 of the projection unit PL in FIG. 6 when it is assumed that the planar mirror is inclined by an angle θα/2 to be parallel to the inclined mirror 112 in FIG. 6 using the entire mirror surface of the DMD 10 as a single planar mirror. The light source image Ips shown in FIG. 9 is an image obtained by forming the plurality of point light sources SPF (becoming the surface light source aggregated in a substantially circular shape) formed on the emission surface side of the MFE lens 108A again. In this case, diffraction light or scattered light is not generated from the single planar mirror disposed instead of the DMD 10, and only the light source image Ips is generated at the center in the pupil Ep coaxially with the optical axis AXa using only the regular reflected light (zero order light).

In FIG. 9, when a radius corresponding to the maximum diameter of the pupil Ep is referred to as re and a radius corresponding to an effective diameter of the light source image Ips as the surface light source is referred to as ri, a σ value representing a size (area) of the light source image Ips with respect to the size (area) of the pupil Ep is σ=ri/re. The σ value is appropriately changed in order to improve a line width, a concentration degree, or a depth of focus (DOF) of the projected and exposed pattern. The σ value can be changed by providing a variable opening diaphragm at a position of the emission surface side of the MFE lens 108A or a position of the pupil Ep between the first lens system 116 and the second lens system 118 (a conjugation relation with the circular region APh in FIG. 7).

In this type of exposure apparatus EX, since the pupil Ep of the projection unit PLU is often used with its maximum diameter, change of the σ value is mainly performed by the variable opening diaphragm provided on the emission sur-face side of the MFE lens 108A. In this case, the radius ri of the light source image Ips is defined as a radius of the circular region APh in FIG. 7. Of course, the σ value or the depth of focus (DOF) may be adjusted by providing the variable opening diaphragm on the pupil Ep of the projec-tion unit PLU.

However, when a neutral plane of the DMD 10 is per-pendicular to the optical axis AXa of the projection unit PLU and the illumination light ILm is set to a relatively large incidence angle θα (for example, θα≥20°), it is discovered that an intensity distribution at the pupil Ep of the image forming light flux by the reflected light from the micro mirrors Msa (or Msc) in the ON state of the DMD 10 does not become to the distribution of the light source image Ips divided by a circular outline like in FIG. 9 and becomes an elliptical shape. This will be described with reference to FIG. 10.

Figure 10:
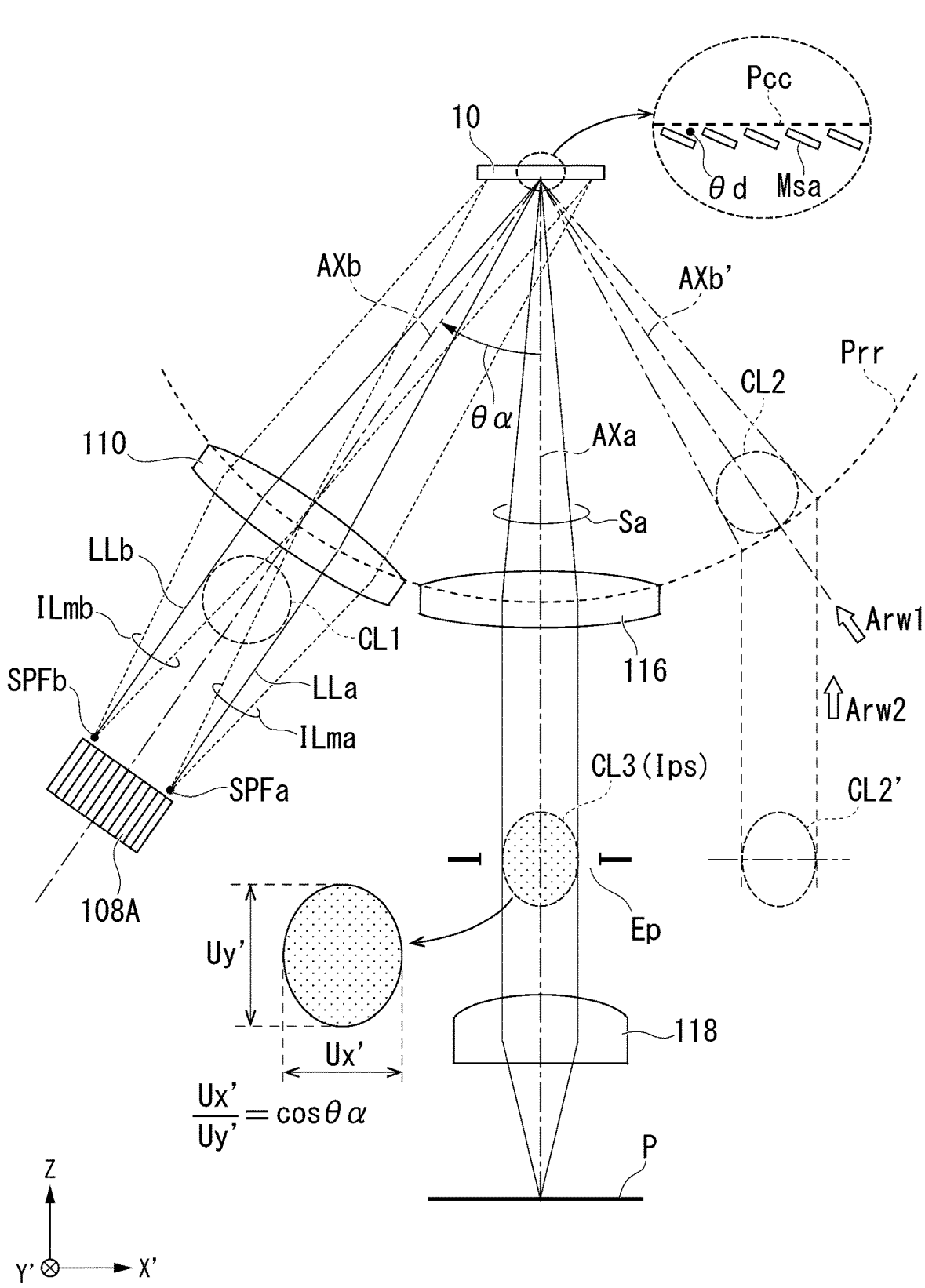
FIG. 10 is a simplified optical path diagram showing an optical path diagram of FIG. 6.

FIG. 10 is an optical path diagram in which the optical path diagram of FIG. 6 above is simplified and expressed, and the orthogonal coordinate system X'Y'Z is set to the same as in FIG. 6. In addition, for the purpose of simple description, the inclined mirror 112 shown in FIG. 6 will be omitted. In FIG. 10, the inclination angle θd of the micro mirrors Msa in the ON state of the DMD 10 is set to 17.5° as a design value with respect to a neutral plane Pcc. Accordingly, an angle formed between the optical axis AXb passing through the MFE lens 108A and the condenser lens system 110 and the optical axis AXa of the projection unit PLU, i.e., the incidence angle θα is set to 35° in the X'Z plane.

Each Illumination lights ILma and ILmb of two point light sources SPFa and SPFb located on the outermost circumference of the circular region APh shown in FIG. 7 in the plane parallel to the X'Z plane containing the optical axis AXb, among plurality of point light sources SPF formed on the emission side of the MFE 108A illuminate the entire DMD 10 using the condenser lens system 110. Center rays LLa and LLb of the illumination lights ILma and ILmb are parallel to the optical axis AXb until they enter the con-denser lens system 110. Accordingly, when the surface light source (an aggregate of the point light sources SPF) on the emission side of the MFE 108A is seen from the side of the DMD 10, the shape is a circular shape CL1.

Here, when it is assumed that all the reflecting surfaces of the plurality of micro mirrors of the DMD 10 are parallel to the neutral plane Pcc, the illumination lights ILma and ILmb advance as regular reflected light along the optical axis AXb' inclined by an angle (−θα) symmetrical to the optical axis AXb with respect to the optical axis AXa. Here, it is assumed that a main surface of the first lens group 116 of the projection unit PLU and a main surface of the condenser lens system 110 are located on an arc Prr using an intersection between the neutral plane Pcc of the DMD 10 and the optical axis AXa as a center. The regular reflected light that advances along the optical axis AXb' is seen as the same circular shape CL2 as the surface light source (an aggregate of the point light sources SPF) on the emission side of the MFE 108A when seen from an arrow Arw1.

However, when seen from an arrow Arw2 parallel to the optical axis AXa of the projection unit PLU, since the regular reflected light that advances along the optical axis AXb' looks like an elliptical shape CL2' because it looks obliquely into the circular surface light source (an aggregate of the point light sources SPF) on the emission side of the MFE 108A. Meanwhile, when the pattern is projected by driving the DMD 10, the reflected light (and diffraction light) generated from many of the micro mirrors Msa in the ON state becomes an image forming light flux Sa' and enters the first lens group 116 of the projection unit PLU. Since the first lens group 116 and the condenser lens system 110 are disposed along the separate optical axes AXa and AXb which are inclined by the angle $\theta\alpha$, respectively, when an intensity distribution (distribution of an image of the point light sources SPF) of a zero order light equivalency ingredient in the image forming light flux Sa' generated from the micro mirrors Msa in the ON state of the DMD 10 is seen on the pupil Ep, the circular surface light source on the emission surface side of the MFE 108A looks like an elliptical shape CL3 because it is viewed diagonally.

When the distribution of the surface light source on the emission surface side of the MFE 108A is a true circle using the optical axis AXb as a center, the intensity distribution of the elliptical shape CL3 of the image forming light flux Sa' (zero order light equivalency ingredient) formed on the pupil Ep of the projection unit PLU is compressed in an incidence direction of the illumination light ILm in the X'Y' plane. Since the incidence direction of the illumination light ILm to the DMD 10 is the X' direction in the X'Y' plane, a major axis of the intensity distribution of the elliptical shape CL3 is parallel to the Y' axis, and a minor axis is parallel to the X' axis. When a dimension of the major axis of the intensity distribution of the elliptical shape CL3 is Uy' and a dimension of the minor axis is Ux', a ratio Ux'/Uy' of the ellipse is cos $\theta\alpha$ depending on the incidence angle $\theta\alpha$ of the illumination light ILm. Since the incidence angle $\theta\alpha$ is two times the inclination angle $\theta$d of the micro mirrors Msa in the ON state of the DMD 10, the ratio Ux'/Uy' may be set to cos(2·$\theta$d). When the incidence angle $\theta\alpha$ is set as 35°, the ratio Ux'/Uy' is about 0.82.

Figure 11:
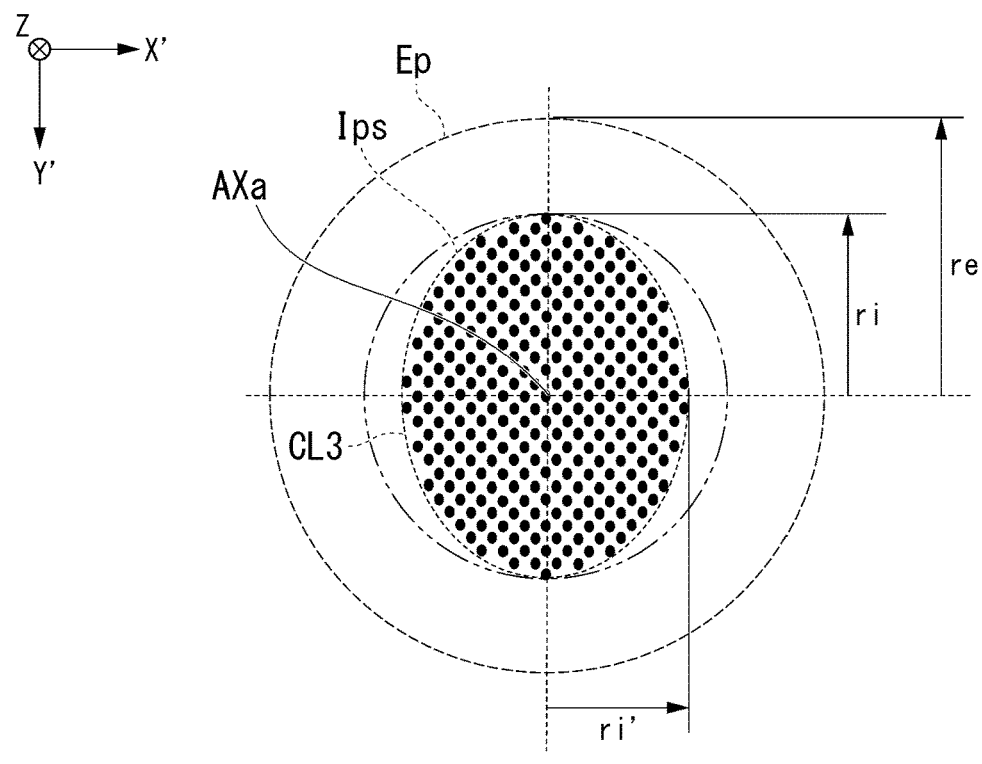
FIG. 11 is a view schematically showing an aspect of a light source image Ips formed on the pupil Ep by a zero order light equivalency ingredient of an image forming light flux Sa from the DMD 10.

Like FIG. 9 above, FIG. 11 is a view schematically showing an aspect of the light source image Ips formed on the pupil Ep by the zero order equivalent ingredient with the largest intensity in the image forming light flux Sa from the DMD 10. In the light source image Ips (the elliptical shape CL3), while a radial dimension in the Y' direction is the same radius ri as in FIG. 9, a radial dimension in the X' direction is a radius ri' reduced by about 0.82 times that the radius ri. In this way, when the intensity distribution (the distribution of the light source image Ips) formed on the pupil Ep by the zero order equivalent ingredient of the image forming light flux Sa is anisotropic, differences may occur in image forming characteristics of an edge portion depending on a direction in the X'Y' plane (i.e., in the XY plane) of an edge of the pattern projected onto the substrate P via the projection unit PLU. For this reason, it is desirable that the intensity distribution formed on the pupil Ep by the zero order equivalent ingredient of the image forming light flux Sa is generally an isotropic circular shape.

Figure 12:
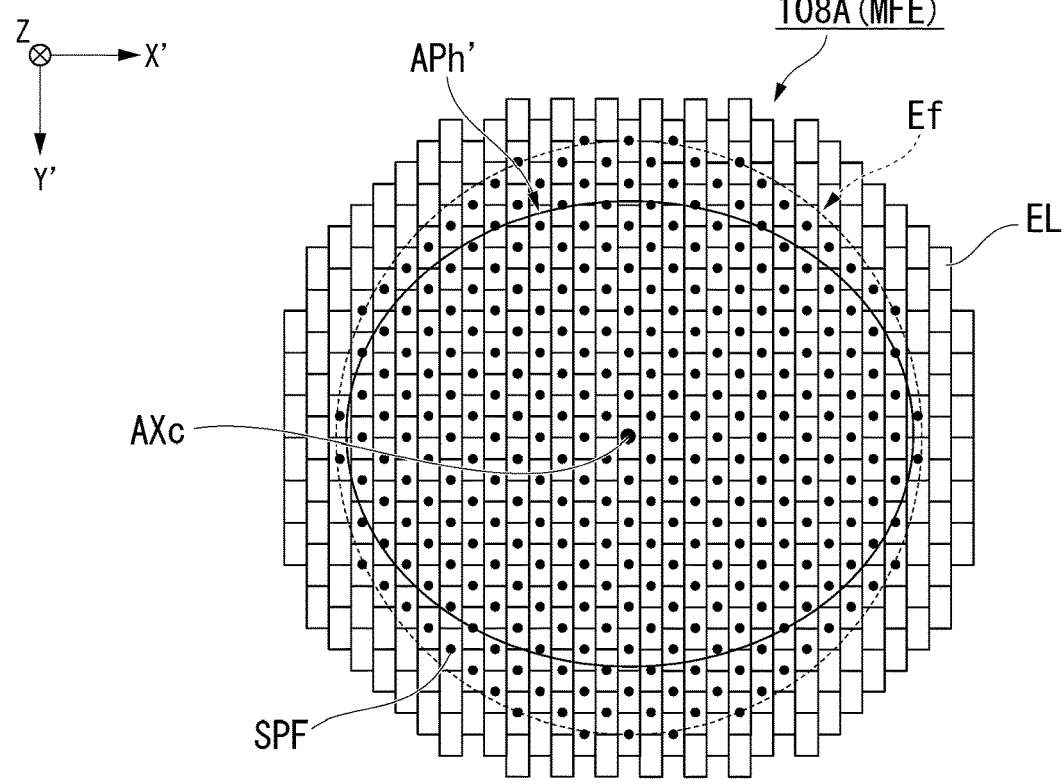
FIG. 12 is a schematic view of a light source surface having an elliptical shape when the MFE lens 108A of the optical integrator 108 is seen from the emission surface side as in FIG. 7.

Here, in the embodiment, the circular region APh of the opening shape of the opening diaphragm provided on the emission surface side of the MFE 108A described in FIG. 7 above is deformed in an ellipse region APh' in which the X' direction is a major axis and the Y' direction is a minor axis as shown in FIG. 12. Like FIG. 7, FIG. 12 is a schematic view showing the MFE lens 108A of the optical integrator 108 when seen from the emission surface side. The ellipse region APh' is obtained by rotating the ellipse CL3 of the light source image Ips formed on the pupil Ep of the projection unit PLU by 90° in the X'Y' plane. Further, a ratio (minor axis dimension/major axis dimension) of the ellipse of the ellipse region APh' is set to the same cos $\theta\alpha$ as the ratio of the ellipse CL3 shown in FIG. 10.

In this way, since the effective overall shape (outline) of the surface light source (the aggregate of the point light sources SPF) formed on the emission surface side of the MFE lens 108A is made an elliptical shape, the intensity distribution (the light source image Ips) of the zero order light equivalency ingredient of the image forming light flux Sa' formed on the pupil Ep of the projection unit PLU can be formed in a circular shape, and even when the edge of the pattern extends in any direction in the X'Y' plane (in the XY plane), image forming characteristics (in particular, contrast characteristics of the edge) can be uniformized.

(Telecentric Error Upon Projection Exposure)

Figure 13:
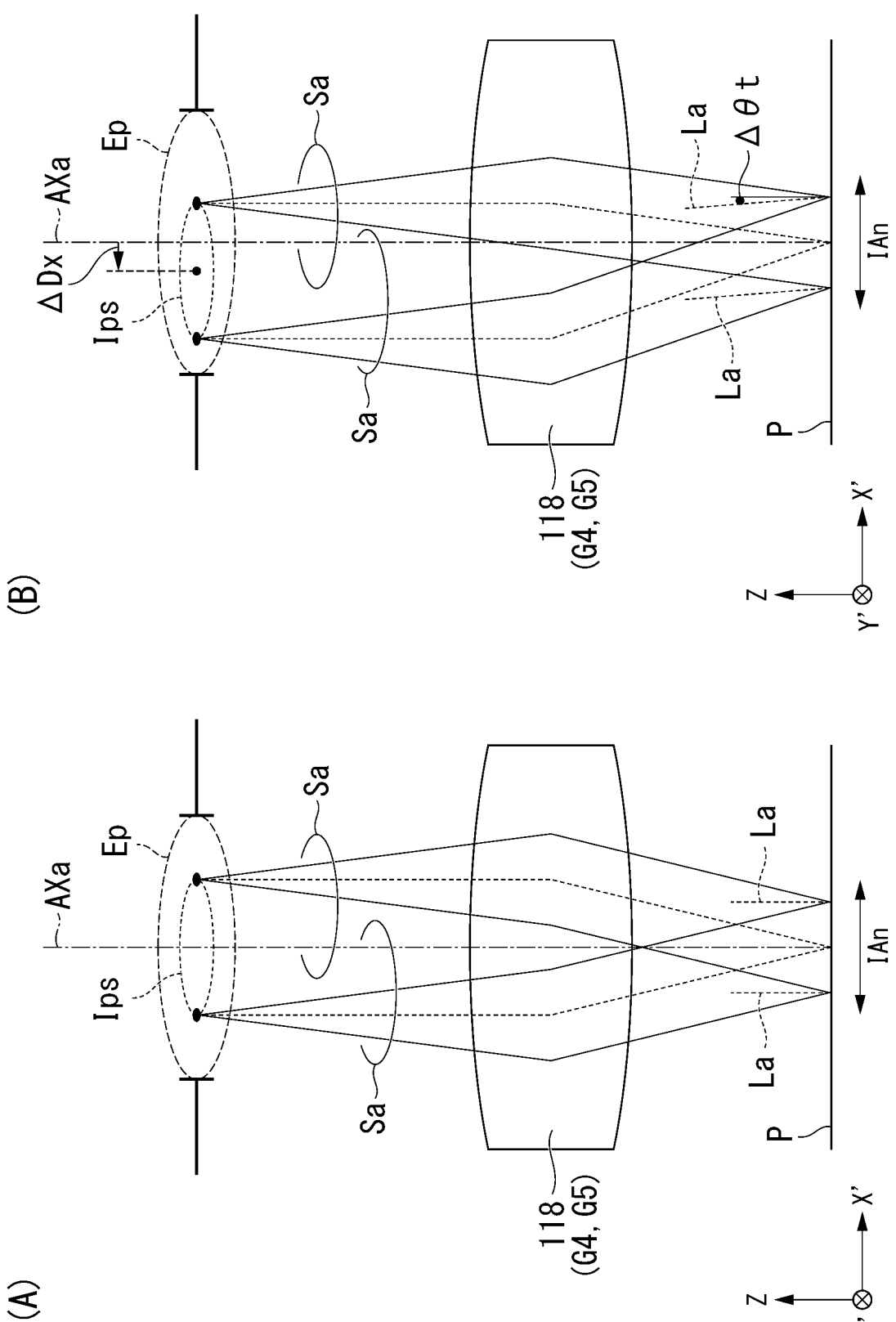
FIG. 13 is a view schematically showing a behavior of an image forming light flux Sa of an optical path from the pupil Ep of the projection unit PLU to the substrate P shown in FIG. 6.

Next, while a telecentric error that may occur in the case of the exposure apparatus EX using the DMD 10 like the embodiment will be described, one of generation factors of the telecentric error will be simply described with reference to FIG. 13 in advance. FIG. 13(A) and FIG. 13(B) are views schematically showing a behavior of the image forming light flux Sa of the optical path from the pupil Ep to the substrate P via the second lens group 118 shown in FIG. 6. The orthogonal coordinate system X'Y'Z in FIG. 13(A) and FIG. 13(B) is the same as the coordinate system X'Y'Z of FIG. 6. For the purpose of simple description, here, a case in which the entire mirror surface of the DMD 10 is inclined by the angle $\theta\alpha/2$ parallel to the inclined mirror 112 in FIG. 6 as a single planar mirror is assumed. In FIG. 13(A) and FIG. 13(B), the lens groups G4 and G5 are disposed along the optical axis AXa between the pupil Ep and the substrate P, and an elliptical light source image (surface light source image) Ips is formed in the pupil Ep as shown in FIG. 11. Further, a principal ray of the reflected light (image forming light flux) Sa entering the lens groups G4 and G5 through one point of a peripheral portion of the light source image (surface light source image) Ips in the X' direction is La.

FIG. 13(A) shows a behavior of the reflected light (image forming light flux) Sa when a center (or a center of gravity) of the light source image (surface light source image) Ips is accurately located at the center of the pupil Ep, the principal ray La of the reflected light (image forming light flux) Sa toward one point in the projection region IAn on the substrate P is parallel to the optical axis AXa, and the image forming light flux projected to the projection region IAn is in a telecentric state, i.e., a state in which the telecentric error is zero. On the other hand, FIG. 13(B) shows a behavior of the reflected light (image forming light flux) Sa when the center (or a center of gravity) of the light source image (surface light source image) Ips is laterally shifted by $\Delta$Dx in the X' direction from the center of the pupil Ep. In this case, the principal ray La of the reflected light (image forming light flux) Sa toward one point in the projection region IAn on the substrate P is inclined by $\Delta\theta$t with respect to the optical axis AXa. The inclination quantity $\Delta\theta$t is the telecentric error, the inclination quantity $\Delta\theta$t (i.e., a lateral shift quantity $\Delta$Dx) is greater than a predetermined allowance, and thus, the image forming state of the pattern image projected to the projection region IAn is decreased.

(Configuration of DMD)

Figure 14:
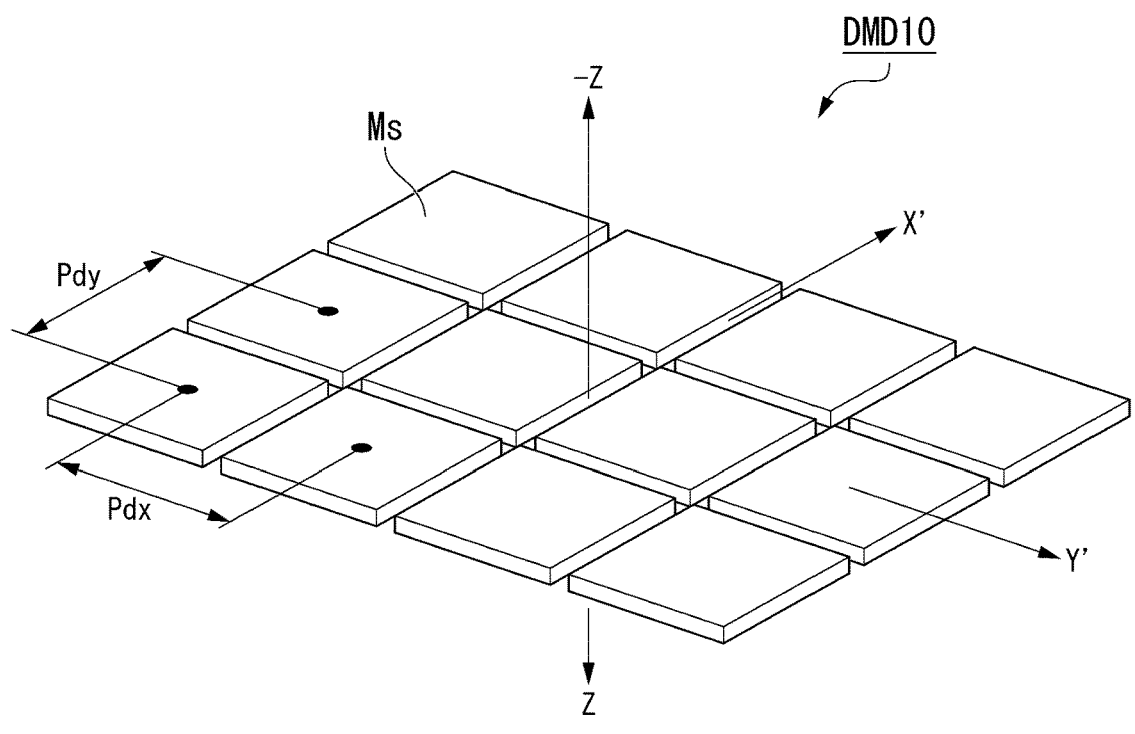
FIG. 14 is an enlarged perspective view of a state of some micro mirrors Ms of the DMD 10 when a power supply to a driving circuit of the DMD 10 is off.
Figure 15:
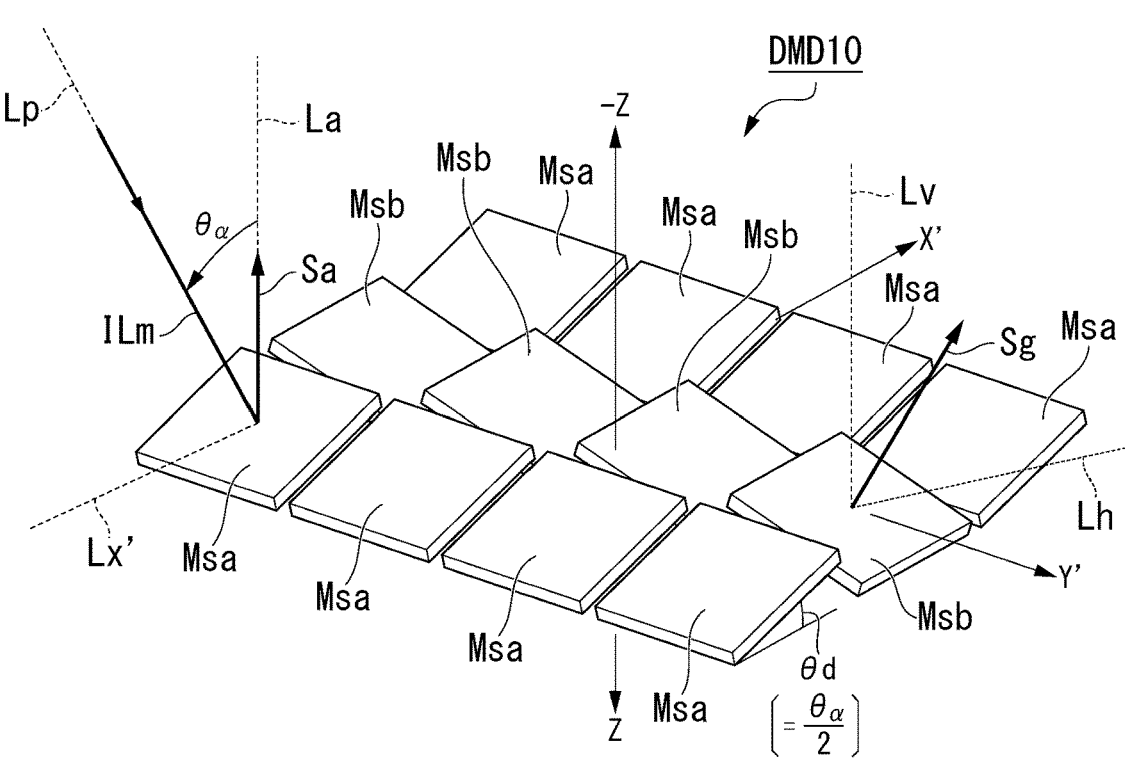
FIG. 15 is an enlarged perspective view of a part of a mirror surface of the DMD 10 when the micro mirrors Ms of the DMD 10 are in an ON state and an OFF state.

As described above, while the DMD 10 used in the embodiment is a roll and pitch driving type, a specific configuration thereof will be described with reference to FIG. 14 and FIG. 15. FIG. 14 and FIG. 15 are partially enlarged perspective view of the mirror surface of the DMD 10. Again, the orthogonal coordinate system X'Y'Z is the same as the coordinate system X'Y'Z in FIG. 6 above. FIG. 14 shows a state when power supply to the driving circuit provided on a lower layer of each of the micro mirrors Ms of the DMD 10 is off. When the power supply is in an OFF state, the reflecting surface of each of the micro mirrors Ms is set to be parallel to the X'Y' plane. Here, while an arrangement pitch of the micro mirrors Ms in the X' direction is Pdx ($\mu$m) and an arrangement pitch in the Y' direction is Pdy ($\mu$m), in practice, it is set to Pdx=Pdy.

FIG. 15 shows an aspect in which power supply to the driving circuit is on and the micro mirrors Msa in the ON state and the micro mirrors Msb in the OFF state are mixed. In the embodiment, the micro mirrors Msa in the ON state are driven to be inclined by the angle $\theta$d (=$\theta\alpha$/2) from the X'Y' plane around a line parallel to the Y' axis, and the micro mirrors Msb in the OFF state are driven to be inclined by the angle $\theta$d (=$\theta\alpha$/2) from the X'Y' plane around a line parallel to the X' axis. The illumination light ILm is irradiated to each of the micro mirrors Msa and Msb along a principal ray Lp parallel to the X'Z plane (parallel to the optical axis AXb shown in FIG. 6). Further, the line Lx' in FIG. 15 is obtained by projecting the principal ray Lp to the X'Y' plane and is parallel to the X' axis.

The incidence angle $\theta\alpha$ of the illumination light ILm to the DMD 10 is an inclination angle with respect to the Z axis in the X'Z plane, and the reflected light (image forming light flux) Sa that advances substantially parallel to the Z axis in the −Z direction is generated from the micro mirrors Msa in the ON state inclined by the angle $\theta\alpha$/2 in the X' direction from a geometrical optical point of view. Meanwhile, the reflected light Sg reflected by the micro mirrors Msb in the OFF state is generated in the −Z direction in a state non-parallel to the Z axis because the micro mirrors Msb are inclined in the Y' direction. In FIG. 15, when a line Lv is a line parallel to the Z axis (the optical axis AXa) and a line Lh projects to the X'Y' plane of the principal ray of the reflected light Sg, the reflected light Sg advances in a direction inclined in a surface containing the line Lv and the line Lh.

(Image Forming State by DMD)

In the projection exposure using the DMD 10, the pattern exposure is performed by scanning the substrate P in the X direction at a speed corresponding to a switching speed while rapidly switching each of a plurality of micro mirrors Ms between an inclination in an ON state and an inclination in an OFF state on the basis of the pattern data (drawing data) using the operation shown in FIG. 15. However, the telecentric state (telecentricity) of the image forming light flux projected from the projection unit PLU (the first lens group 116 and the second lens group 118) to the substrate P may be changed according to fineness, concentration degree or periodicity of the projected pattern. This is because the mirror surface of the DMD 10 is used as a reflective diffraction grating (brazed diffraction grating) according to an inclined state corresponding to the pattern of the plurality of micro mirrors Ms of the DMD 10.

Figure 16:
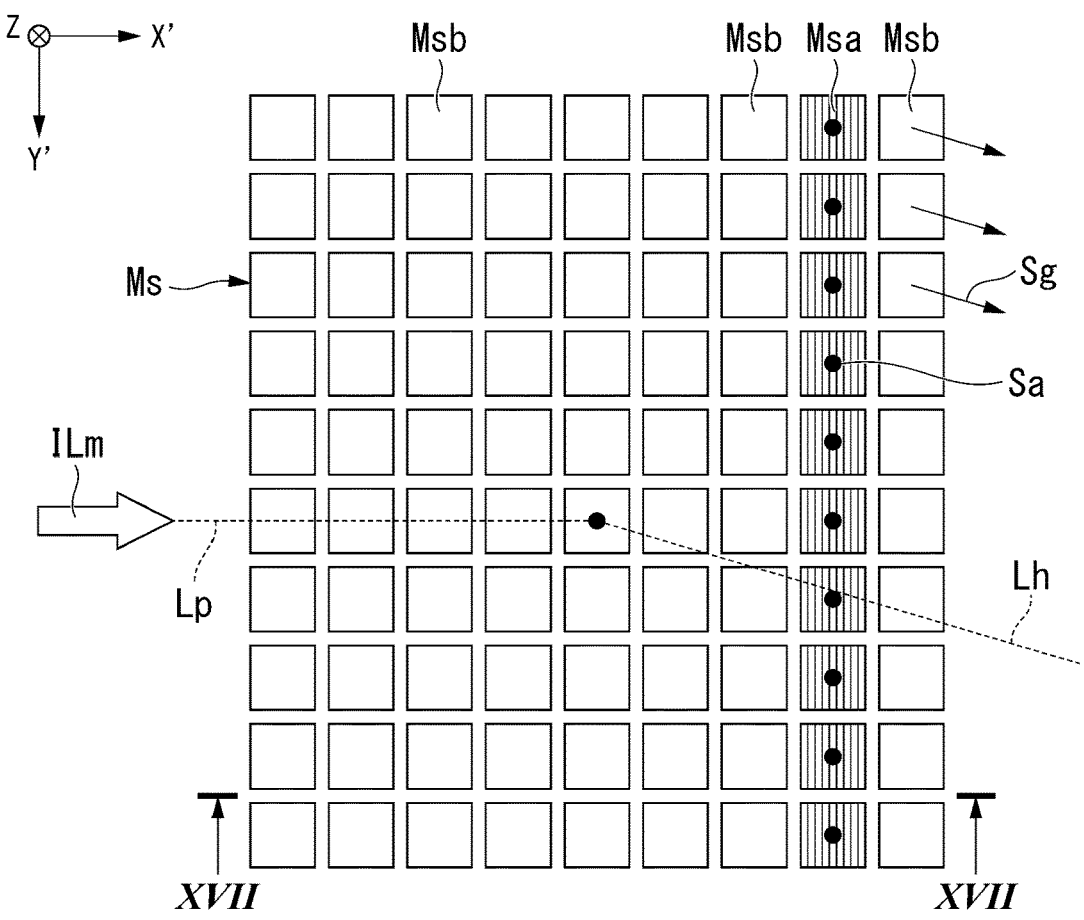
FIG. 16 is a view showing a part of the mirror surface of the DMD 10 in an X'Y' plane when only a row of micro mirrors Ms arranged in a Y' direction is in an ON state.
Figure 17:
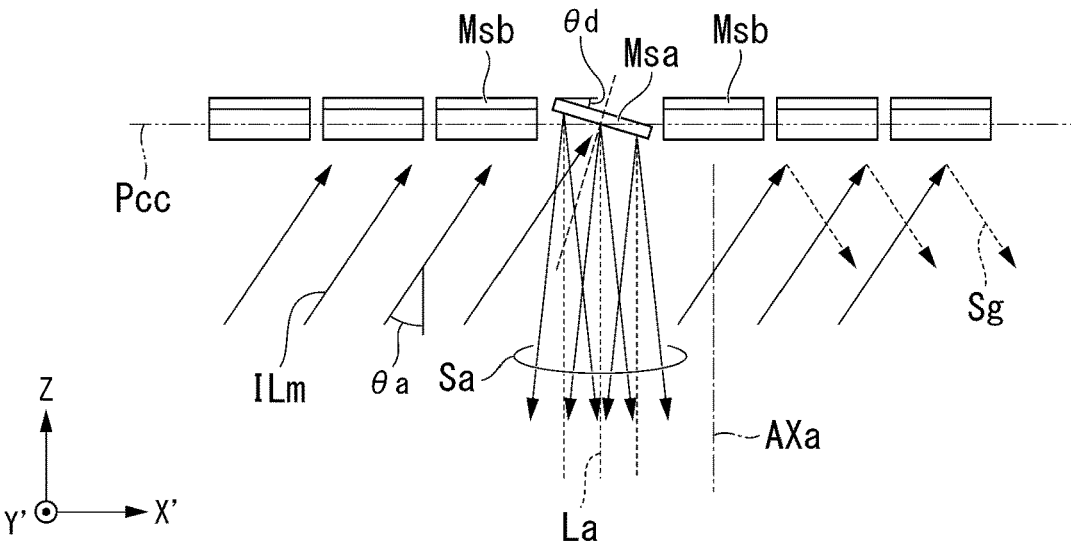
FIG. 17 is a view of a portion of the mirror surface of the DMD 10 of FIG. 16 along an arrow XVII-XVII in an X'Z plane.

FIG. 16 is a view showing a part of the mirror surface of the DMD 10 in the X'Y' plane, and FIG. 17 is a view showing a portion of the mirror surface of the DMD 10 of FIG. 16 along an arrow XVII-XVII in the X'Z plane. In FIG.

16, in the plurality of micro mirrors Ms, only the micro mirrors Ms in a row arranged in the Y' direction are the micro mirrors Msa in the ON state, and the other micro mirrors Ms are the micro mirrors Msb in the OFF state. The inclined state of the micro mirrors Ms shown in FIG. 16 is appeared when an isolated line pattern of the line width (for example, about 1 $\mu$m) of the resolution limit is projected. In the X'Y' plane, the reflected light (image forming light flux) Sa from the micro mirrors Msa in the ON state is generated parallel to the Z axis in the −Z direction, and the reflected light Sg from the micro mirrors Msb in the OFF state is generated in the −Z direction but inclined in a direction along the line Lh in FIG. 11.

In this case, as shown in FIG. 17, only one of the plurality of micro mirrors Ms arranged in the X' direction is the micro mirror Msa in the ON state inclined by the angle $\theta$d (=$\theta\alpha$/2) around a line parallel to the Y' axis with respect to the neutral plane Pcc (a surface parallel to the X'Y' plane containing the center point of all the micro mirrors Ms). Accordingly, in the X'Z plane, the reflected light (image forming light flux) Sa generated from the micro mirrors Msa in the ON state becomes a simple regular reflected light that does not contain diffraction light of one order or more, and the principal ray La enters the projection unit PLU parallel to the optical axis AXa. The other reflected light Sg from the micro mirrors Msb in the OFF state does not enter the projection unit PLU. Further, when the micro mirror Msa in the ON state is one isolated in the X' direction (or a row arranged in the Y' direction), the principal ray La of the reflected light (image forming light flux) Sa becomes parallel to the optical axis AXa, regardless of a wavelength $\lambda$ of the illumination light ILm.

Figure 18:
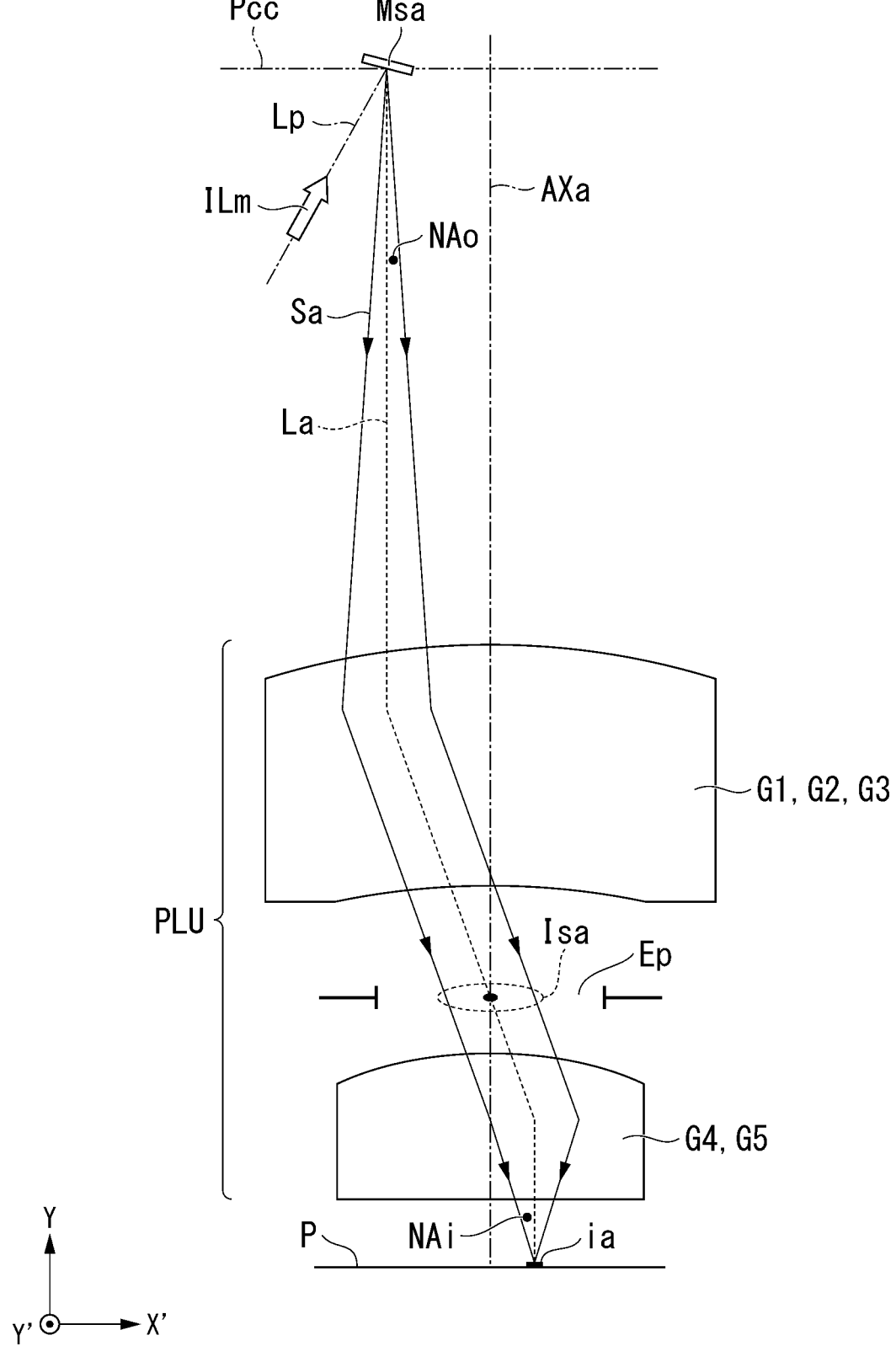
FIG. 18 is a view schematically showing a state in which the projection unit PLU forms an image of the reflected light (image forming light flux) Sa from the isolated micro mirrors Msa in the X'Z plane as shown in FIG. 16.

FIG. 18 is a view schematically showing an image forming state by the projection unit PLU of the reflected light (image forming light flux) Sa from the micro mirrors Msa isolated as shown in FIG. 17 in the X'Z plane. In FIG. 18, the member having the same function as the member described in FIG. 6 above is designated by the same reference sign. Since the projection unit PLU (the lens groups G1 to G5) is a bilateral telecentric reduction projection system, if the principal ray La of the reflected light (image forming light flux) Sa from the isolated micro mirrors Msa is parallel to the optical axis AXa, the principal ray La of the reflected light (image forming light flux) Sa formed as the reduced image ia is also parallel to a line (the optical axis AXa) perpendicular to the surface of the substrate P, and a telecentric error does not occur. Further, the numerical aperture NAo of the reflected light (image forming light flux) Sa on the object surface side (the DMD 10) of the projection unit PLU shown in FIG. 18 is equal to the numerical aperture of the illumination light ILm.

As described in FIG. 11 (or FIG. 9) and FIG. 13(A) above, when the DMD 10 is inclined by the angle $\theta\alpha$/2 as a single large planar mirror, a position of the center (center of gravity) of the light source image (surface light source image) Ips formed on the pupil Ep of the projection unit PLU passes through the optical axis AXa. Similarly, when only the regular reflected light Sa from the isolated micro mirrors Msa in the mirror surface of the DMD 10 enters the projection unit PLU, since the point image intensity distribution of the light flux Isa at the position (Fourier conversion surface) of the pupil Ep of the regular reflected light Sa is a rectangular shape (square shape) in which the reflecting surface of the micro mirror Ms is fine, the optical axis AXa is expressed by a sin c2 function (a point image intensity distribution of a square opening) as a center.

Figure 8:
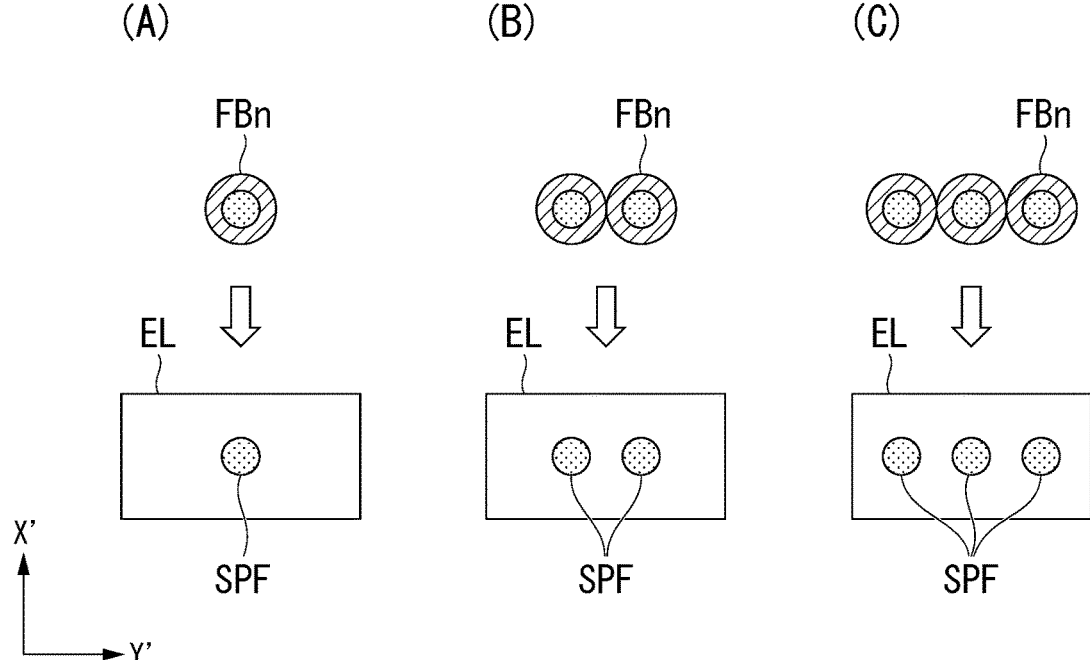
FIG. 8 is a view schematically showing an example of an arrangement relation between a point light source SPF and an emission end of an optical fiber bundle FBn formed on an emission surface side of a lens element EL of the MFE lens 108A of FIG. 7.
Figure 19:
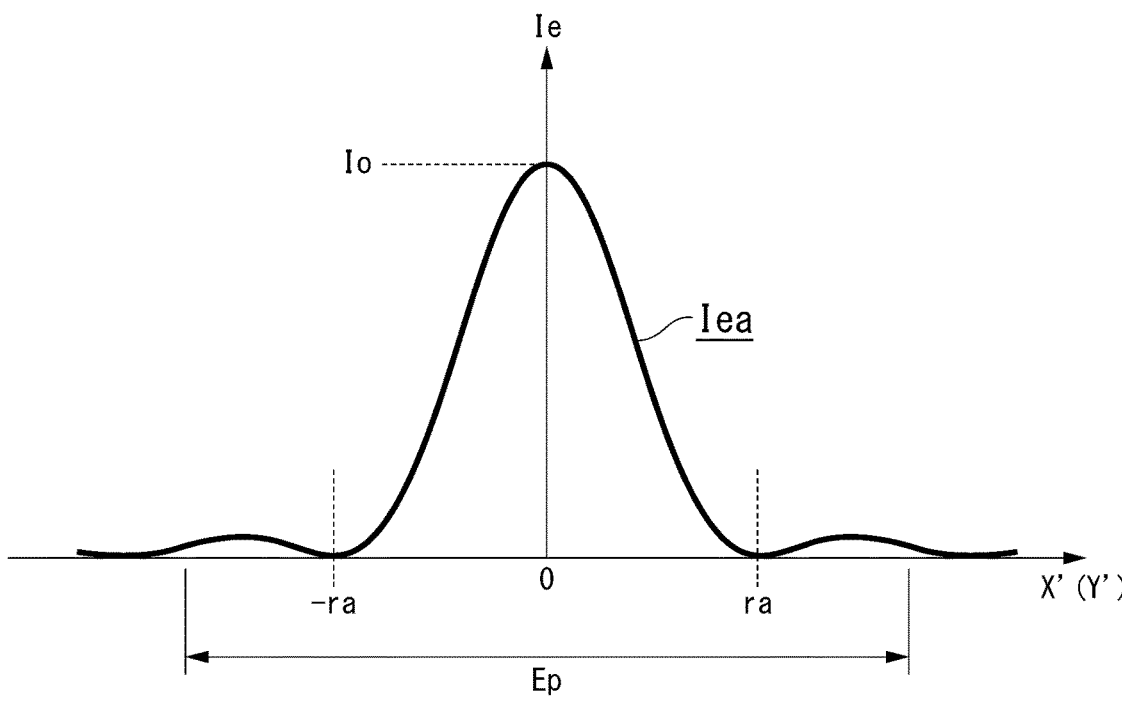
FIG. 19 is a graph schematically showing a point image intensity distribution Iea of a diffraction image in the pupil Ep of regular reflected light Sa from the isolated micro mirrors Msa.

FIG. 19 is a graph schematically expressing a theoretical point image intensity distribution Iea (distribution created by light flux from the one point light source SPF shown in FIG. 7 and FIG. 8) of the light flux (here, zero order diffraction light) Isa in the pupil Ep by the reflected light Sa from the row of (or single) micro mirrors Msa isolated in the X' direction. In the graph of FIG. 19, a lateral axis represents a coordinate position in the X' (or Y') direction as the position of the optical axis AXa, and a vertical axis represents a light intensity Ie. The point image intensity distribution Iea is expressed by the following Equation (1).

[Math. 1]

$$Ie = Io \cdot sinc^2(X') = Io \cdot sin^2(X')/(X')^2 \tag{1}$$

In the above-mentioned Equation (1), Io expresses a peak value of the light intensity Ie, and a position of the peak value Io by the reflected light Sa from the row of (or single) isolated micro mirrors Msa coincides with an origin 0 in the X' (or Y') direction, i.e., a position of the optical axis AXa. In addition, as described in FIG. 12 above, when the shape of the surface light source formed on the emission surface side of the MFE 108A is adjusted like the ellipse region APh, a position±ra in the X' (or Y') direction of a first dark line on which the light intensity Ie of the point image intensity distribution Iea initially becomes a minimum value (0) from the origin 0 corresponds to a position of the radius ri of the light source image Ips described in FIG. 9 above. Further, the actual intensity distribution on the pupil Ep is obtained by convolution-integrating (convolution-calculating) the point image intensity distribution Iea throughout a wide range (σ value) of the light source image Ips shown in FIG. 9, and the intensity is approximately uniform.

Figure 20:
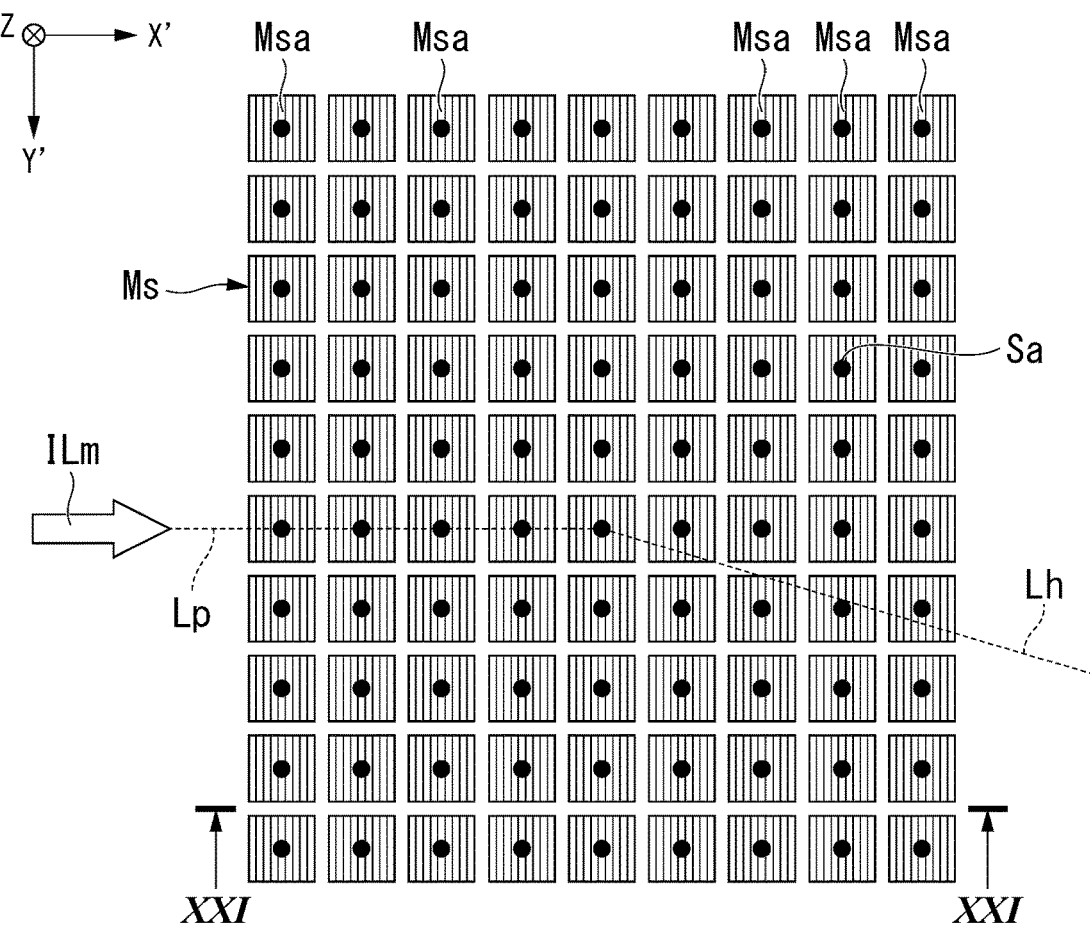
FIG. 20 is a view showing a part of the mirror surface of the DMD 10 in an X'Y' plane when the plurality of micro mirrors Ms adjacent to each other in the X' direction are in an ON state simultaneously.
Figure 21:
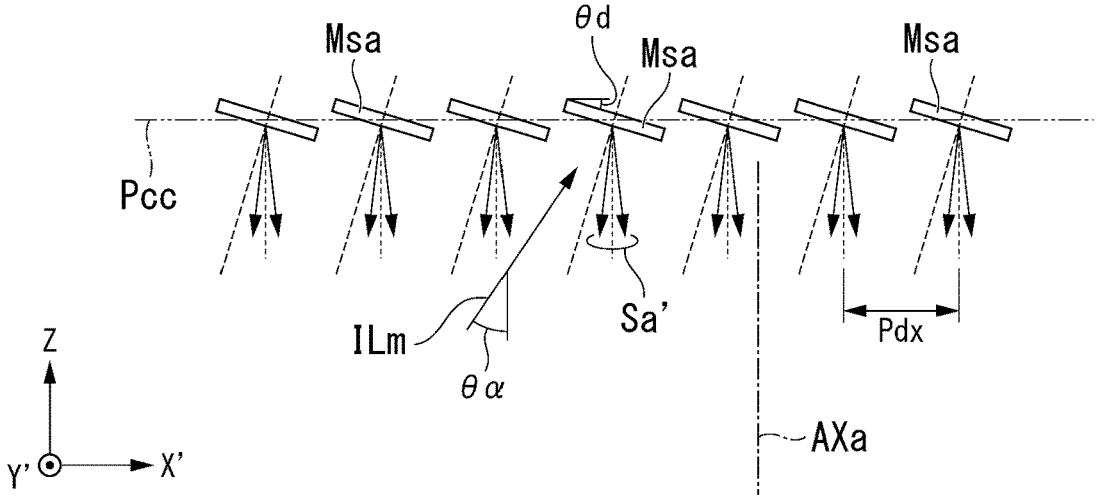
FIG. 21 is a view of a portion of the mirror surface of the DMD 10 of FIG. 20 along the arrow XXI-XXI in the X'Z plane.

Next, a case in which a width of the projected pattern in the X' direction (X direction) is sufficiently large will be described with reference to FIG. 20 and FIG. 21. FIG. 20 is a view showing a part of the mirror surface of the DMD 10 in the X'Y' plane, and FIG. 21 is a view showing a portion of the mirror surface of the DMD 10 of FIG. 20 along an arrow XXI-XXI in the X'Z plane. FIG. 20 shows a case in which all the plurality of micro mirrors Ms shown in FIG. 16 above become the micro mirrors Msa in the ON state. In FIG. 20, while only disposition of the micro mirrors Ms of nine in the X' direction and ten in the Y' direction is shown, the adjacent micro mirrors Ms of the above-mentioned number or more (or preferably all the micro mirrors Ms on the DMD 10) may be in an ON state.

As shown in FIG. 20 and FIG. 21, the reflected light Sa' is generated from the plurality of micro mirrors Msa in the ON state arranged adjacent to each other in the X' direction by a diffraction effect in a state slightly inclined from the optical axis AXa. When the mirror surface of the DMD 10 in the state of FIG. 21 is considered as diffraction gratings arranged at a pitch Pdx in the X' direction along the neutral plane Pcc, a generation angle θj of the diffraction light is expressed by the following Equation (2) or Equation (3)

when j is an order (j=0, 1, 2, 3, . . . ), A is a wavelength and an incidence angle of the illumination light ILm is θα.

[Math. 2]

$$sin \theta j = j (\lambda/Pdx) - sin \theta \alpha \tag{2}$$

[Math. 3]

$$sin \theta j = sin \theta \alpha - j (\lambda/Pdx) \tag{3}$$

Figure 22:
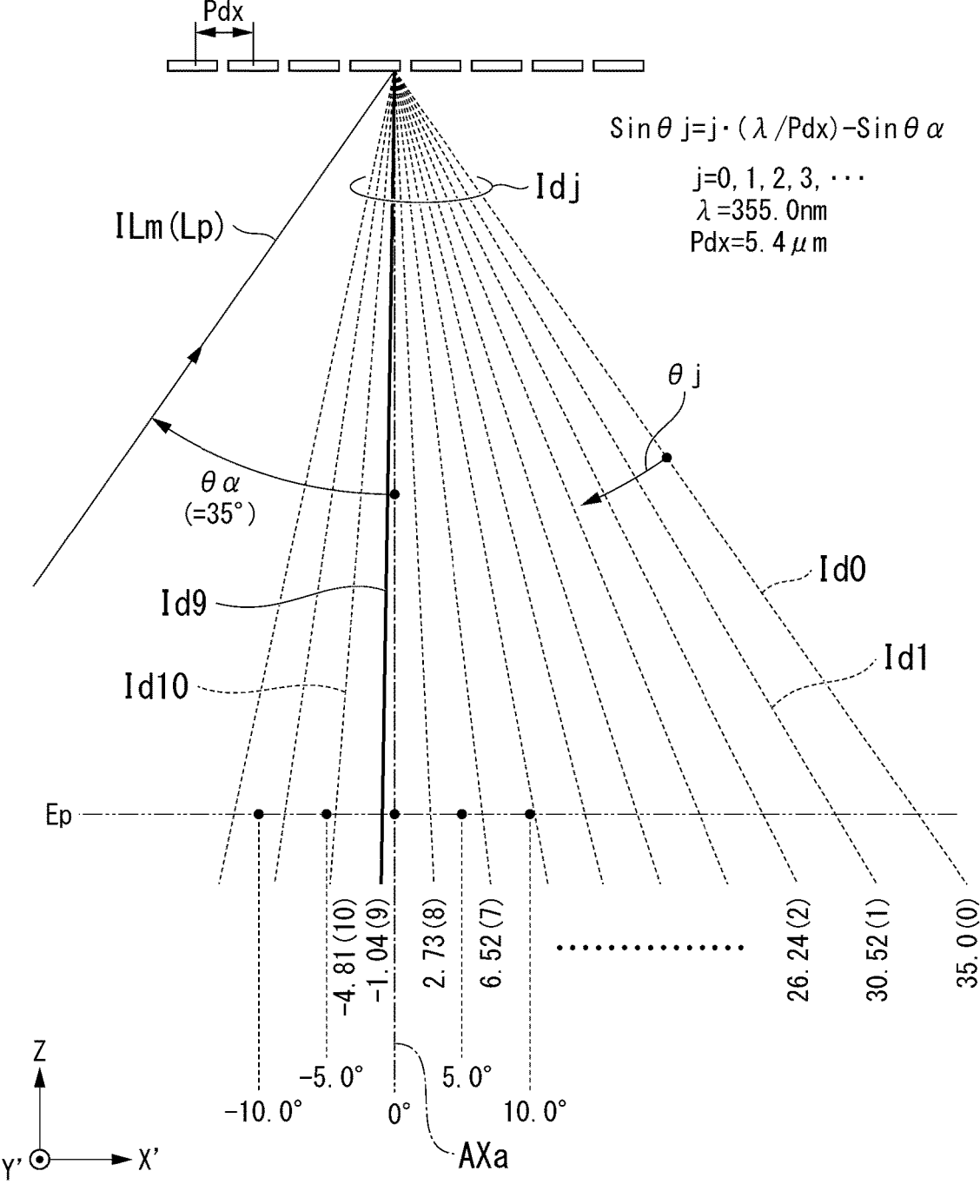
FIG. 22 is a graph showing an example of a distribution of an angle θj of diffraction light Idj generated from the DMD 10 in the state of FIG. 20 and FIG. 21.

FIG. 22 is a graph expressing a distribution of an angle θj of diffraction light Idj calculated, for example, when the incidence angle θα of the illumination light ILm (an inclination angle of the principal ray Lp of the illumination light ILm with respect to the optical axis AXa) is 35.0°, the inclination angle θd of the micro mirrors Msa in the ON state is 17.5°, the pitch Pdx of the micro mirrors Msa is 5.4 μm, and a wavelength λ is 355.0 nm. As shown in FIG. 22, since the incidence angle θα of the illumination light ILm is 35°, zero order diffraction light Id0 (j=0) is inclined at ±35° with respect to the optical axis AXa, and as the diffraction order increases, the angle θj with respect to the zero order diffraction light Id0 increases. A numerical value shown in a lower portion of FIG. 22 expresses the order j in a parenthesis and an inclination angle from the optical axis AXa of the diffraction light Idj of each order.

In the case of the numerical condition of FIG. 22, an inclination angle of 9-order diffraction light Id9 from the optical axis AXa is the smallest, approximately −1.04°. Accordingly, when the micro mirrors Ms of the DMD 10 are densely disposed and in the ON state as shown in FIG. 20 and FIG. 21, a center of the intensity distribution of the image forming light flux (Sa') in the pupil EP of the projection unit PLU is eccentric from a position laterally shifted by an amount equivalent to an angle of −1.04° from the position of the optical axis AXa (equivalent to a lateral shift quantity ΔDx shown in FIG. 13(B) above). The distribution of the actual image forming light flux in the pupil Ep is obtained by convolution-integrating (convolution-calculating) the diffraction light distribution expressed by Equation (2) or (3) using the sin c² function expressed by Equation (1).

Figure 23:
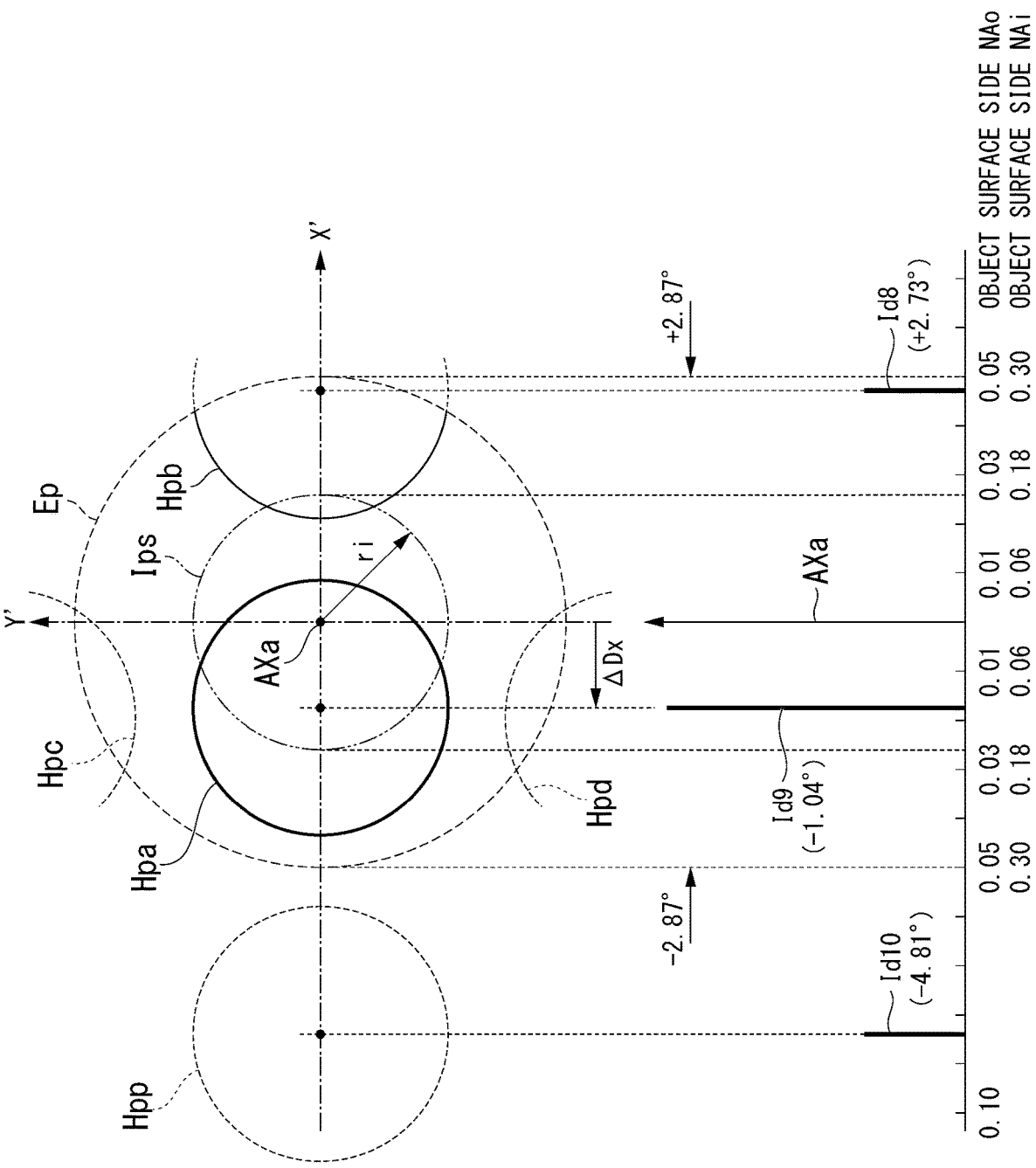
FIG. 23 is a view schematically showing an intensity distribution of an image forming light flux of the pupil Ep in a generation state of such diffraction light in FIG. 22.

FIG. 23 is a view schematically showing the intensity distribution of the image forming light flux Sa' in the pupil Ep in the generation state of the diffraction light as shown in FIG. 22. A lateral axis in FIG. 23 represents a value obtained by converting the angle θj of the diffraction light Idj into the numerical aperture NAo on the side of the physical surface (the DMD 10) and the numerical aperture NAi on the side of the image surface (the substrate P) when the projection magnification Mp of the projection unit PLU is ⅙. In addition, the numerical aperture NAi on the image surface side of the projection unit PLU is assumed as 0.3 (the numerical aperture NAo on the object surface side=0.05). In this case, the resolution (minimum resolution line width) Rs is expressed by Rs=k1 (λ/NAi) using a process constant k1 (0<k1≤1).

Accordingly, the resolution Rs is about 0.83 μm when a wavelength λ=355.0 nm and k1=0.7. The pitch Pdx (Pdy) of the micro mirrors Ms is reduced by the projection magnification Mp=⅙ on the side of the image surface (the substrate P) and becomes 0.9 μm. Accordingly, if the projection unit PLU has the numerical aperture NAi on the image surface side of 0.3 (the numerical aperture NAo on the object surface side is 0.05) or more, one projection image of the micro mirrors Msa in the ON state can be formed with high contrast.

In FIG. 23, an angle θe from the optical axis AXa in the X' direction of the numerical aperture NAo=0.05 on the object surface side, which is the maximum diameter of the pupil Ep of the projection unit PLU, becomes θe≈±2.87° from NAo=sin θe. As shown in FIG. 22 above, the inclination angle of −1.04° (accurately, −1.037°) of the 9-order diffraction light Id9 is about 0.018 when being converted into the numerical aperture NAo on the object surface side, and an intensity distribution Hpa of the image forming light flux Sa' (zero order light equivalency ingredient) in the pupil Ep is displaced by a shift amount ΔDx in the X' direction from the original position of the light source image Ips (radius ri). Further, while a part of an intensity distribution Hpb by an 8-order diffraction light Id8 is appeared in a periphery of the pupil Ep in the +X' direction, the peak intensity is low. Further, since an inclination angle of a 10-order diffraction light Id10 on the object surface side from the optical axis AXa is large at 4.81°, the intensity distribution is disposed outside the pupil Ep and does not pass through the projection unit PLU. Further, as described in FIG. 12 above, the intensity distributions Hpa and Hpb in FIG. 23 are substantially circular shapes by setting the surface light source formed on the emission surface side of the MFE 108A of the illumination unit ILU to the ellipse region APh'.

In addition, since the micro mirrors Ms of the DMD 10 are arranged at a pitch Pdy (=5.4 μm) even in the Y' direction, the diffraction light is generated with low illuminance even in the Y' direction according to the pitch Pdy, and weak intensity distributions Hpc and Hpd are generated. The intensity distributions Hpc and Hpd may also partially enter the pupil Ep according to the size of the numerical aperture NAo (NAi) of the projection unit PLU. For this reason, it is possible to prevent the intensity distributions Hpc and Hpd from entering the pupil Ep by appropriately setting a relation between the numerical aperture NAo (NAi) of the projection unit PLU and the size (radius ri) of the light source image Ips.

As described also in FIG. 13(B) above, a telecentric error Δθt on the image surface side occurred by the shift amount ΔDx of the center of the intensity distribution Hpa becomes Δθt=−6.22° (=−1.037°/the projection magnification Mp) in the case of a condition shown in FIG. 22 and FIG. 23. In this way, when exposing a large pattern in which many of the plurality of micro mirrors Ms of the DMD 10 are densely in the ON state, the principal ray of the image forming light flux Sa' to the substrate P is directed as being inclined by 6° or more with respect to the optical axis AXa. Such a telecentric error Δθt may also play a role in reducing the image forming quality (contrast characteristics, distortion characteristics, symmetric properties, or the like) of the projection image.

Figure 24:
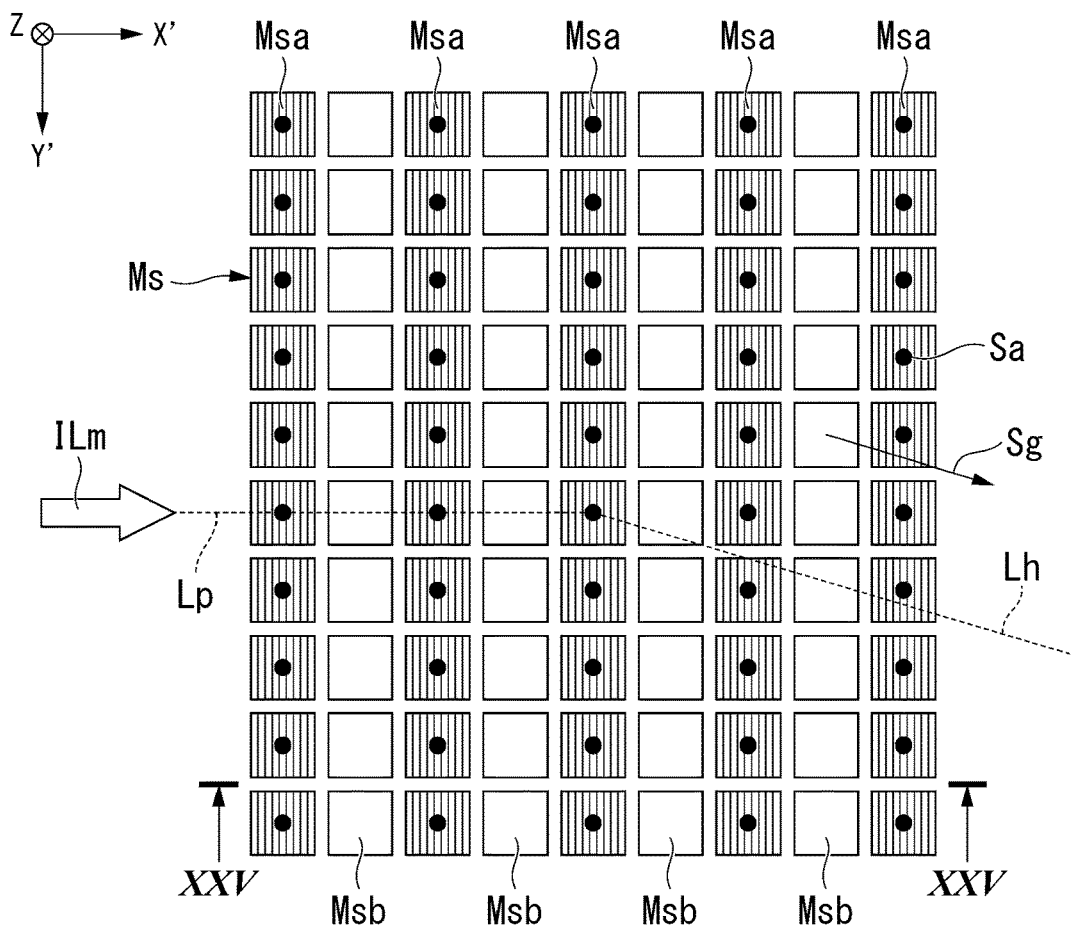
FIG. 24 is a view of a state of a part of the mirror surface of the DMD 10 upon projection of a line and space pattern in an X'Y' plane.
Figure 25:
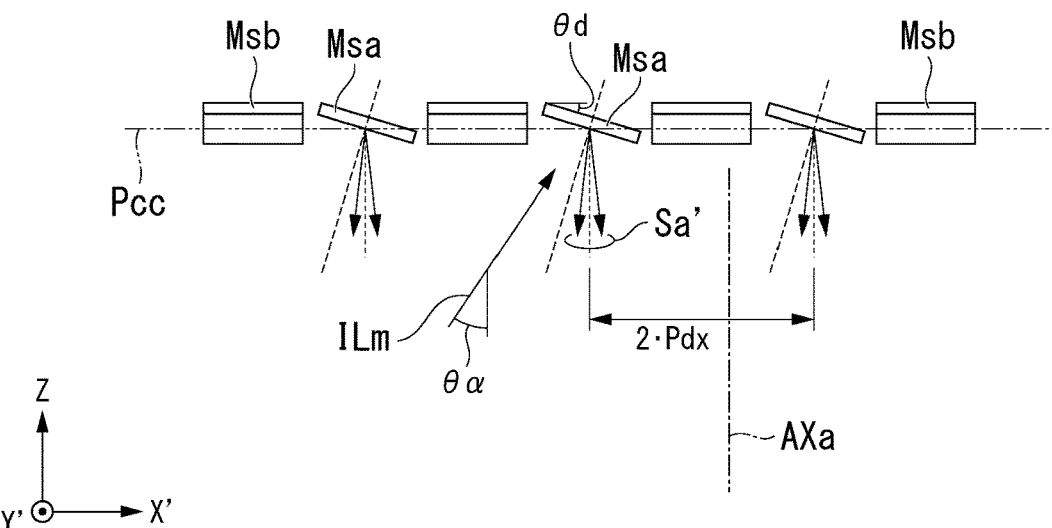
FIG. 25 is a view of a part of the mirror surface of the DMD 10 of FIG. 24 along the arrow XXV-XXV in the X'Z plane, showing a variant of a distribution part of the embodiment.

Next, a case of a line and space pattern in which a projected pattern has a constant pitch in the X' direction (X direction) will be described with reference to FIG. 24 and FIG. 25. FIG. 24 is a view showing a part of the mirror surface of the DMD 10 in the X'Y' plane, and FIG. 25 is a view showing a portion of the mirror surface of the DMD 10 of FIG. 24 along an arrow XXV-XXV in the X'Z plane. FIG. 24 shows a case in which, among the plurality of micro mirrors Ms shown in FIG. 16 above, the micro mirrors Ms of odd numbers arranged in the X' direction are the micro mirrors Msa in the ON state, and the micro mirrors Ms of even numbers are the micro mirrors Msb in the OFF state.

It is assumed that the micro mirrors Ms of the odd numbers in the X' direction are all in the ON state for one row in the Y' direction, and the micro mirrors Ms of the even numbers are all in the OFF state for one row in the Y' direction.

As shown in FIG. 25, when the micro mirrors Msa in the ON state are arranged one by one in the X' direction, the generation angle θj of the diffraction light generated from the DMD 10 is expressed by the following Equation (4) or Equation (5) similar to Equation (2) or Equation (3) above by considering the mirror surface of the DMD 10 as the diffraction gratings arranged at a pitch 2·Pdx along the neutral plane Pcc in the X' direction.

[Math. 4]

$$\sin \theta\ j = j\ \left(\lambda/2Pdx\right) - \sin \theta\ \alpha \tag{4}$$

[Math. 5]

$$\sin \theta\ j = \sin \theta\ \alpha - j\ \left(\lambda/2Pdx\right) \tag{5}$$

Figure 26:
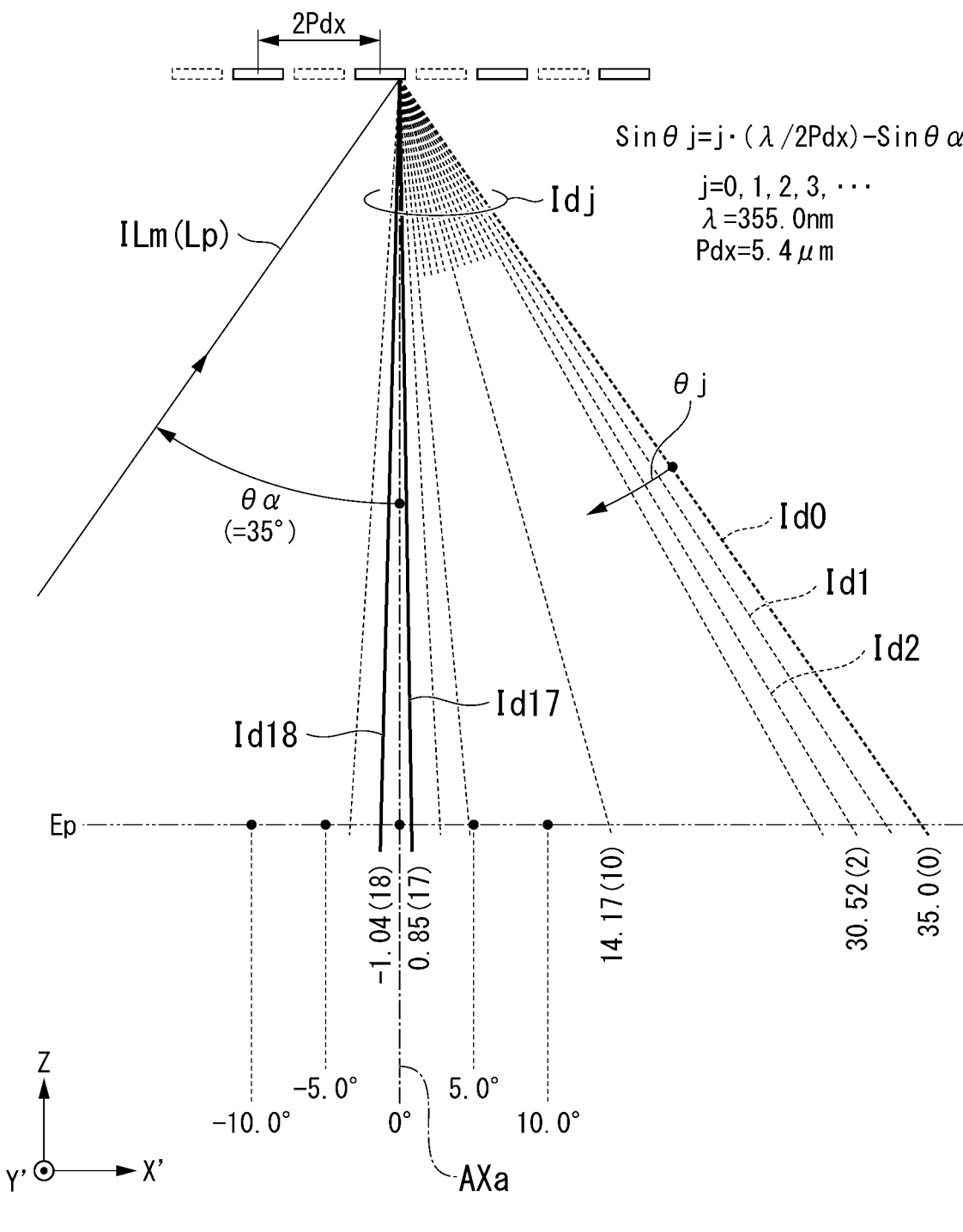
FIG. 26 is a graph showing an example of a distribution of the angle θj of the diffraction light Idj generated from the DMD 10 of the state of FIG. 24 and FIG. 25.

Like the case of FIG. 22, FIG. 26 is a graph expressing a distribution of the angle θj of the diffraction light Idj calculated when the incidence angle θg of the illumination light ILm (an inclination angle of the principal ray Lp of the illumination light ILm with respect to the optical axis AXa) is 35.0°, the inclination angle θd of the micro mirrors Msa in the ON state is 17.5°, a pitch 2Pdx of the micro mirrors Msa is 10.8 μm, and a wavelength λ is 355.0 nm. As shown in FIG. 26, since the incidence angle θα of the illumination light ILm is 35°, the zero order diffraction light Id0 (j=0) is inclined at +35° with respect to the optical axis AXa, and the angle θj with respect to the zero order diffraction light Id0 is increased as the diffraction order is increased. Numerical values shown in a lower portion of FIG. 26 express the order j in parentheses, and an inclination angle of the diffraction light Idj of each order from the optical axis AXa.

In the case of the numerical condition of FIG. 26, an inclination angle of 17-order diffraction light Id17 from the optical axis AXa is the smallest, approximately 0.85°. Further, 18-order diffraction light Id18 with an inclination angle of −1.04° from the optical axis AXa is also generated. Accordingly, as shown in FIG. 24 and FIG. 25, when the micro mirrors Ms of the DMD 10 are in the finest line and space shape in the ON state, a center of the intensity distribution of the image forming light flux Sa' in the pupil EP of the projection unit PLU is eccentric from a position laterally shifted by an amount equivalent to an angle of 0.85° or −1.04° from the position of the optical axis AXa. The distribution of the actual image forming light flux Sa' in the pupil Ep can be obtained by convolution-integrating (convolution-calculating) the diffraction light distribution expressed by Equation (4) or Equation (5) using a sin c² function expressed by Equation (1).

Like FIG. 23 above, also in the case of FIG. 26, the intensity distribution Hpa of the image forming light flux (regular reflected light ingredient) in the pupil Ep is displaced and appeared in the X' direction from the original position of the light source image Ips (radius ri) to correspond to each of an inclination angle of 0.85° of the 17-order diffraction light Id17 and an inclination angle of −1.04° of the 18-order diffraction light Id18. In the case of the diffraction light distribution as shown in FIG. 26, since one of the intensity distribution Hpa formed in the direction of the 17-order diffraction light Id17 and the intensity distribution Hpa formed in the direction of the 18-order diffraction light Id18 is large and the other is small, the telecentric error Δθt on the image surface side occurred by the shift of the intensity distribution Hpa is substantially within a range between Δθt=5.1° and Δθt=−6.22°.

This range is slightly different from the telecentric error Δθt=−6.22° in the generation direction of the 9-order diffraction light Id9 (see FIG. 22) when the plurality of micro mirrors Ms are adjacent to each other to become the micro mirrors Msa in the ON state as shown in FIG. 20 and FIG. 21 above. Further, it is very different compared to the telecentric error Δθt=0° when a row of (or a single) the plurality of micro mirrors Ms as shown in FIG. 16 and FIG. 17 above are isolated as the micro mirrors Msa in the ON state. Further, the actual pattern image projected onto the substrate P by the projection unit PLU is formed by the interference of the reflected light Sa' containing the diffraction light from the DMD 10 captured in the projection unit PLU. Further, Equation (4) or Equation (5) can specify a generation state of the diffraction light in the line and space pattern in which an arrangement pitch or a line width is n times the Pdx (5.4 µm) using the following Equation (6) or Equation (7) in which n is a real number.

[Math. 6]

$$\sin\theta\,j = j\left(\lambda/(n\cdot Pdx)\right) - \sin\theta\,\alpha \qquad (6)$$

[Math. 7]

$$\sin\theta\,j = \sin\theta\,\alpha - j\left(\lambda/(n\cdot Pdx)\right) \qquad (7)$$

Figure 27:
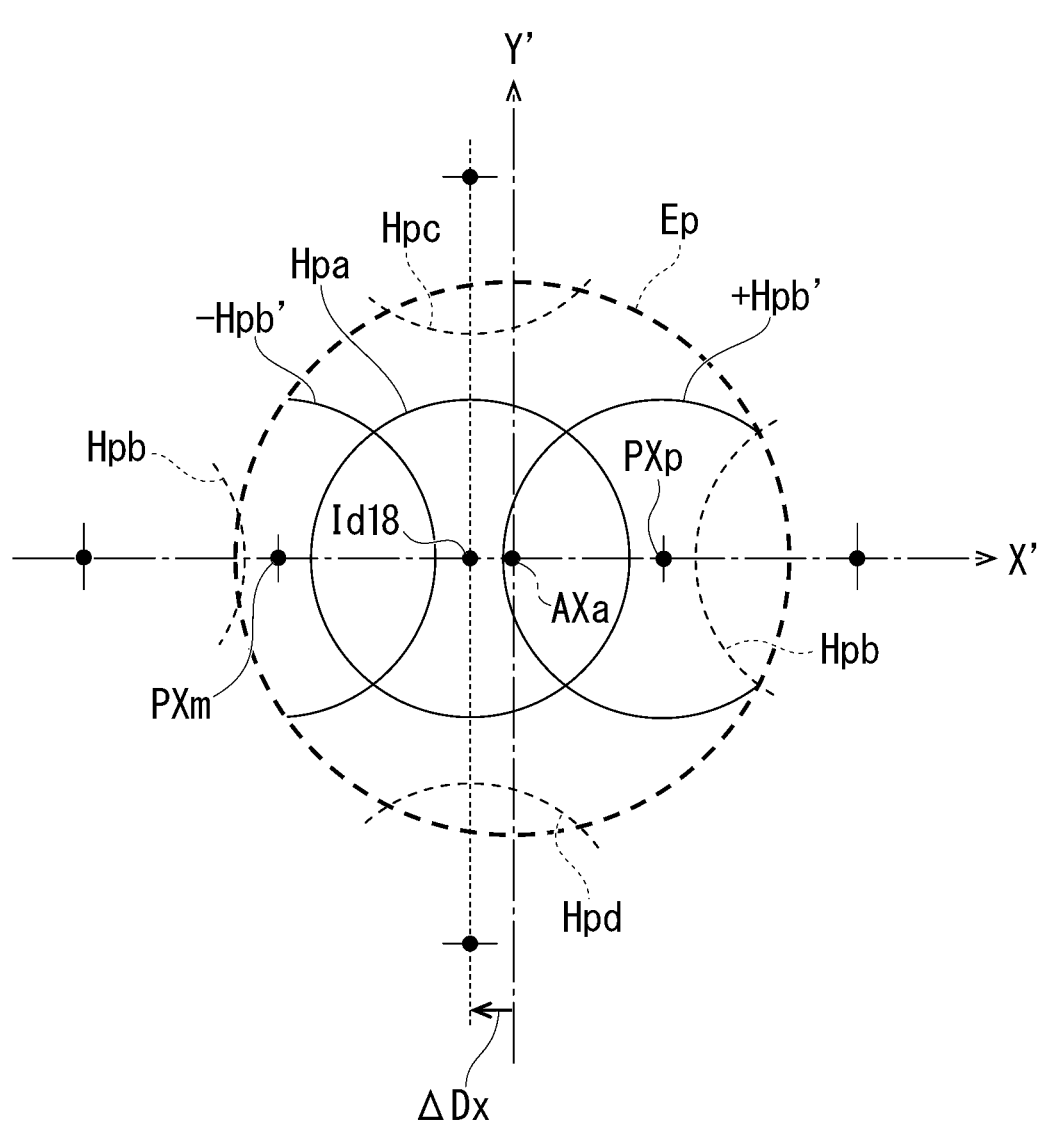
FIG. 27 is a view schematically showing an intensity distribution of an image forming light flux in the pupil Ep in a generation state of such diffraction light in FIG. 26.

FIG. 27 is a view schematically showing the distribution on the pupil Ep of the projection unit PLU by the reflected light (diffraction light) from the DMD 10 shown in FIG. 26 to correspond to FIG. 23 above. Even in the case of FIG. 27, as described in FIG. 12 above, by setting the outline of the surface light source formed on the emission surface side of the MFE 108A to an elliptical shape APh', the intensity distribution of each diffraction light flux as the image forming light flux Sa' formed on the pupil Ep of the projection unit PLU is made to a circular shape. In addition, in FIG. 27, the intensity by the 18-order diffraction light Id18 shown in FIG. 26 is the largest, and in the case of the projection of the line and space pattern as shown in FIGS. 24 and 25, the 18-order diffraction light Id18 has an intensity distribution Hpa of the zero order equivalent ingredient. The intensity distribution Hpa is eccentric by ΔDx in the −X' direction to correspond to an angle of −1.04° from the optical axis AXa of the 18-order diffraction light Id18, and the telecentric error Δθt occurs.

As described in FIG. 23 above, while the intensity distributions Hpb, Hpc and Hpd of the diffraction light ingredient generated by the pitches Pdx and Pdy of the arrangement of the micro mirrors Ms of the DMD 10 in the X' direction and the Y' direction are generated in the plane of the pupil Ep, the intensity is sufficiently smaller than the intensity of the intensity distribution Hpa. Further, intensity distributions ±Hpb' of ±1-order light equivalency ingredients generated by the diffraction effect are appeared on both sides of the intensity distribution Hpa in the X' direction from the line and space pattern (the pitch 2Pdx, a line width in the X' direction of which is Pdx) created by the micro mirrors Ms of the DMD 10. A center point PXp of the intensity distribution +Hpb' of the +1-order light equivalency ingredient is located at a substantially intermediate position between the center point (Id18) of the intensity distribution Hpa of the zero order light equivalency ingredient and the center point of the intensity distribution Hpb in the +X' direction. Similarly, a center point PXm of an intensity distribution −Hpb' of the −1-order light equivalency ingredient is located at a substantially intermediate position between the center point (Id18) of the intensity distribution Hpa of the zero order light equivalency ingredient and the center point of the intensity distribution Hpb in the −X' direction.

In addition, FIG. 27 shows the intensity distribution of the image forming light flux Sa' (diffraction light flux) at the pupil Ep in the case of the line and space pattern with the pitch 2Pdx in the X' direction as shown in FIG. 24. On the other hand, in the case of the line and space pattern with a pitch 2Pdy (Pdy=Pdx) in the Y' direction, in a state in which the center point (Id18) of the intensity distribution Hpa of the zero order light equivalency ingredient is eccentric by ΔDx in the −X' direction, the intensity distributions ±Hpb' of the ±1 order light equivalency ingredients are appeared on both sides of the intensity distribution Hpa in the Y' direction.

Figure 28:
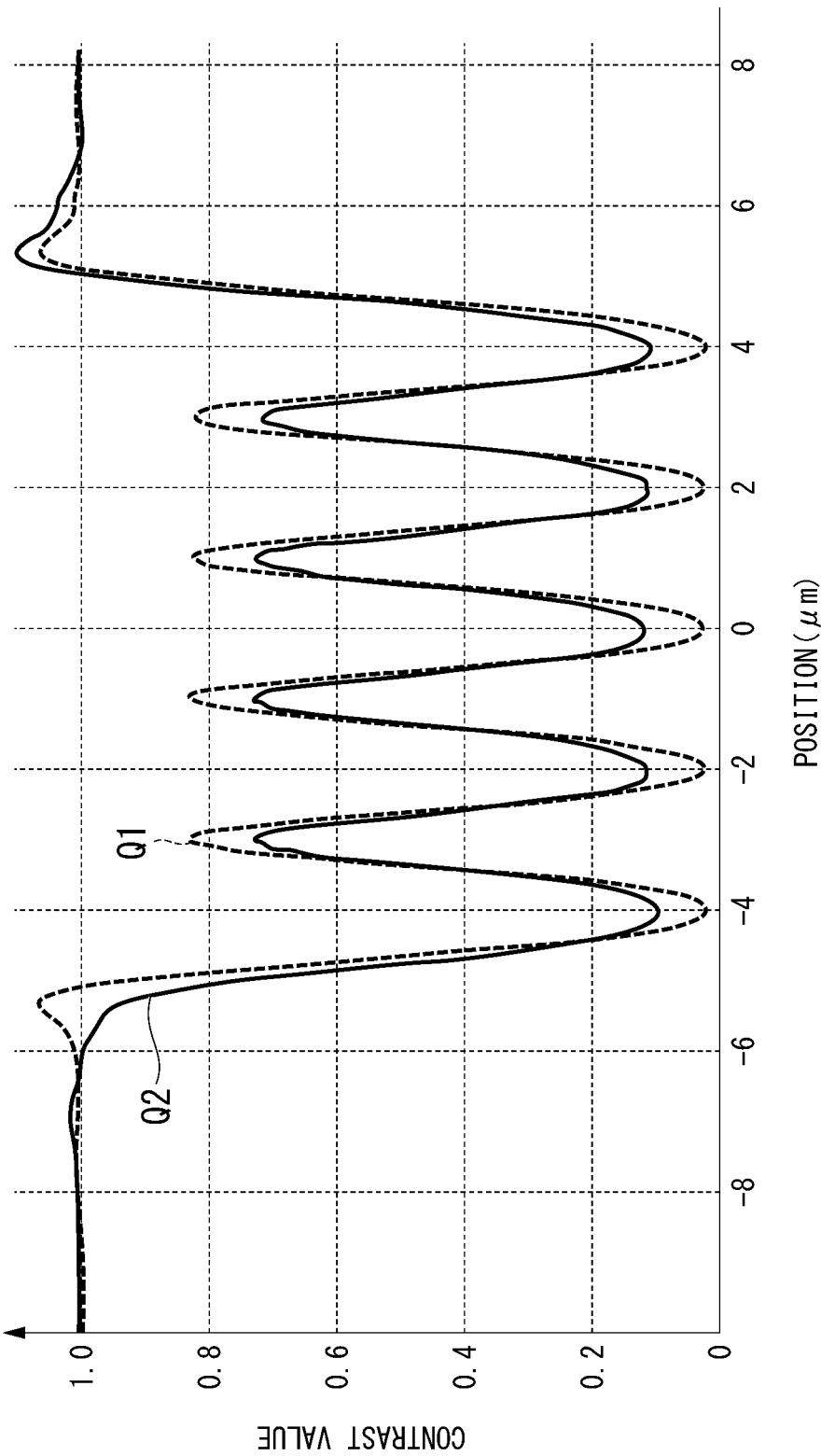
FIG. 28 is a graph showing a result obtained by simulating a contrast of a spatial image of a line and space pattern with a line width of 1 μm on an image surface.

In this way, even when many of the plurality of micro mirrors Ms of the DMD 10 are disposed in the line and space shape in an ON state, the principal ray of the image forming light flux to the substrate P may be largely inclined with respect to the optical axis AXa, and image forming quality (contrast characteristics, distortion characteristics, or the like) of the projection image may be significantly deteriorated. Here, an example of a change in image forming quality due to generation of the telecentric error Δθt will be described with reference to FIG. 28. FIG. 28 is a graph expressing a result obtained by simulating a spatial image of a line and space pattern in which a line width on an image surface is 1 µm and a pitch in the X' direction is 2 µm. A lateral axis of FIG. 28 represents a position (µm) on the image surface in the X' direction, and a vertical axis represents a relative intensity value with the intensity of the illumination light (incidence light) normalized to 1.

In the graph of FIG. 28, the simulation is performed assuming that the numerical aperture NAi of the image side of the projection unit PLU is 0.25, a σ value of the illumination light ILm is 0.6, the image forming light flux Sa' in the pupil Ep of the projection unit PLU is eccentric from the optical axis AXa in the X' direction, and the telecentric error Δθt on the image surface side becomes 50 mrad (≈2.865°). In the graph of FIG. 28, characteristics Q1 shown by a broken line are contrast characteristics in the best focus surface (best image forming surface) of the projection unit PLU, and characteristics Q2 shown by a solid line are contrast characteristics in a surface defocused by 3 µm from the best focus surface in a direction of the optical axis AXa. Further, in FIG. 28, dark lines with a line width of 1 µm are formed at five places of positions 0, ±2 µm, and ±4 µm.

It is typical that the contrast (intensity amplitude) of the characteristics Q2 is lower than the characteristics Q1 due to defocus, but it is determined that, due to the influence of the telecentric error Δθt, a symmetric property between the characteristics around +5 µm and the characteristics around −5 µm is deteriorated. From this, in the case of the pattern in which the telecentric error Δθt on the image surface side exceeds an allowable range (for example, ±2°), i.e., when the micro mirrors Msa in the ON state among the plurality of micro mirrors Ms of the DMD 10 are densely disposed in a wide range or arranged with periodicity, the accuracy of the edge position of the resist image corresponding to the edge portion of the exposed pattern is lost, and as a result, errors occur in the line width or dimension of the pattern. That is, as the intensity distribution (distribution of the diffraction light) formed on the pupil Ep of the projection unit PLU by the reflected light (image forming light flux) Sa' from the DMD 10 is deviated from an isotropic state centered on the optical axis AXa or a symmetrical state, an asymmetric property of the projected pattern image is increased.

(Wavelength Dependency of Telecentric Error)

The telecentric error $\Delta\theta t$ described above changes depending on the wavelength $\lambda$ as is apparent from Equation (2) to Equation (5) above. For example, in the case of the state of FIG. 20 and FIG. 21 expressed by Equation (2), in order to make the telecentric error $\Delta\theta t$ on the image surface side zero, the wavelength $\lambda$ may be set such that the inclination angle of $-1.04°$ (accurately, $-1.037$) from the optical axis AXa of the 9-order diffraction light Id9 shown in FIG. 22 and FIG. 23 becomes zero.

Figure 29:
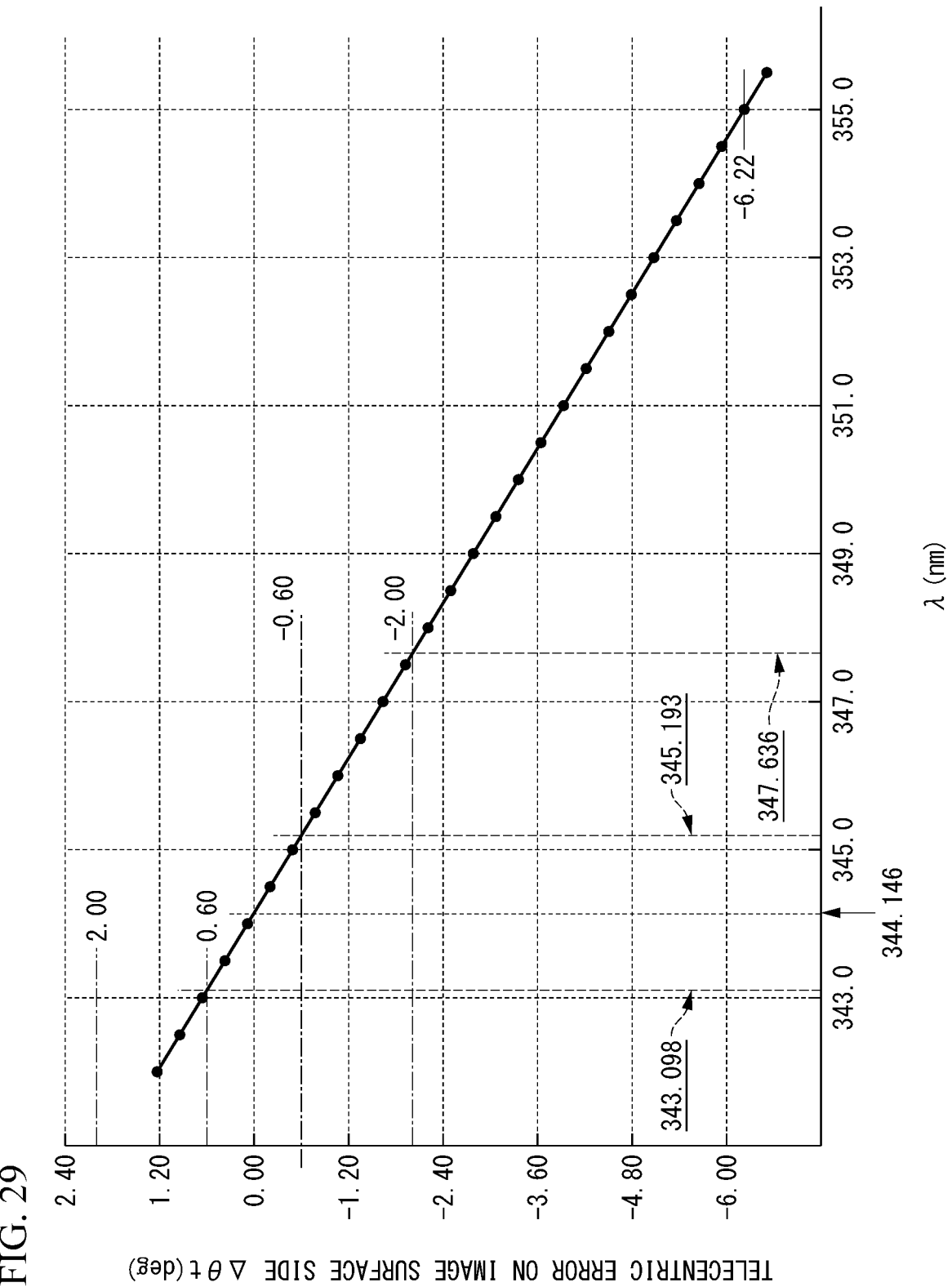
FIG. 29 is a graph that calculates a relation between a wavelength λ and a telecentric error Δθt on the basis of Equation (2).

FIG. 29 is a graph in which a relation between a center wavelength $\lambda$ and a telecentric error $\Delta\theta t$ is obtained on the basis of the above-mentioned Equation (2), a lateral axis represents the center wavelength $\lambda$ (nm), and a vertical axis represents the telecentric error $\Delta\theta t$ (deg) on the image surface side. The pitch Pdx (Pdy) of the micro mirrors Ms of the DMD 10 is 5.4 $\mu$m, the inclination angle $\theta d$ of the micro mirrors Ms is 17.5°, the incidence angle $\theta\alpha$ of the illumination light ILm is 35°, and in the case in which the micro mirrors Ms are dense in the ON state as shown in FIG. 20 and FIG. 21, the telecentric error $\Delta\theta t$ theoretically becomes zero when the center wavelength $\lambda$ is approximately 344.146 nm. The telecentric error $\Delta\theta t$ on the image surface side is preferably set to zero as much as possible, but it can have an allowable range depending on the minimum line width (or the resolution Rs) of the pattern to be projected.

For example, when the allowable range of the telecentric error $\Delta\theta t$ on the image surface side is set to within $\pm0.6°$ (approximately 10 mrad) as shown in FIG. 29, the center wavelength $\lambda$ may be in the range of 343.098 nm to 345.193 nm (with a width of 2.095 nm). In addition, when the allowable range of the telecentric error $\Delta\theta t$ on the image surface side is set to within $\pm2.0°$, the center wavelength $\lambda$ may be in the range of 340.655 nm to 347.636 nm (with a width of 6.98 nm).

In this way, the telecentric error $\Delta\theta t$ occurred due to arrangement (periodicity) or a concentration degree of the micro mirrors Msa in the ON state of the DMD 10, i.e., the size of the distribution density also has wavelength dependency. In general, since specifications of the pitch Pdx (Pdy), the inclination angle $\theta d$, or the like, of the micro mirrors Ms of the DMD 10 are uniquely set for a ready-made product (for example, a DMD compatible with ultraviolet ray manufactured by Texas Instrument), the wavelength $\lambda$ of the illumination light ILm is set to match the specifications. In the DMD 10 of this embodiment, since the pitch Pdx (Pdy) of the micro mirrors Ms is 5.4 $\mu$m and the inclination angle $\theta d$ is 17.5°, it is preferable to use a fiber amplifier laser light source that generates high brightness ultraviolet pulse light as a light source that supplies the illumination light ILm to each of the optical fiber bundles FBn (n=1 to 27).

The fiber amplifier laser light source is constituted by, for example, as disclosed in Japanese Patent No. 6428675, a semiconductor laser element configured to generate seed light in an infrared wavelength region, a high speed switching element (electric optical element or the like) of the seed light, an optical fiber configured to amplify the switched seed light (pulse light) using a pump beam, a wavelength conversion element configured to convert the light in the amplified infrared wavelength region into pulse light of a high frequency (ultraviolet wavelength region), and the like. In the case of such a fiber amplifier laser light source, a peak wavelength of the ultraviolet ray that can increase generation efficiency (conversion efficiency) by combining available semiconductor laser elements, optical fibers and wavelength conversion elements is 343.333 nm. In the case of the peak wavelength, the maximum telecentric error $\Delta\theta t$ on the image surface side (the inclination angle on the image surface side of the 9-order diffraction light Id9 in FIG. 22 and FIG. 23) that can be generated in the state of FIG. 20 is about 0.466° (about 8.13 mrad).

From the above, when two or more lights with significantly different peak wavelengths (for example, light with a wavelength on the order of 350 nm and light with a wavelength on the order of 400 nm) are synthesized as the illumination light ILm, the telecentric error $\Delta\theta t$ can vary greatly depending on the form of the pattern to be projected (an isolated pattern, a line and space pattern, or a large land-like pattern). In the embodiment, as the illumination light ILm supplied to each of the modules MUn (n=1 to 27), light synthesized from a plurality of fiber amplifier laser light sources whose peak wavelength is slightly shifted within the range where the wavelength-dependent telecentric error $\Delta\theta t$ is allowed is used. In this way, by using the illumination light ILm obtained by synthesizing the plurality of lights with a slightly shifted peak wavelength, the coherence of the illumination light ILm can suppress the contrast of speckles (or interference fringes) generated on the micro mirrors Ms of the DMD 10 (as well as on the substrate P).

(Telecentric Adjustment Mechanism)

As described above, when the micro mirrors Msa that become the ON state according to the pattern to be exposed to the substrate P among the plurality of micro mirrors Ms of the DMD 10 are densely arranged in the X' direction and the Y' direction, or when arranged with periodicity in the X' direction (or the Y' direction), the telecentric error (angular variation) $\Delta\theta t$ occurs, although there are varying degrees, in the image forming light flux (Sa, Sa') projected from the projection unit PLU. Since each of the plurality of micro mirrors Ms of the DMD 10 can be switched between the ON state and the OFF state at a response speed of about 10 KHz, the pattern image generated by the DMD 10 also changes rapidly according to the drawing data. For this reason, during scanning exposure of a pattern of a display panel or the like, the pattern image projected from each of the modules MUn (n=1 to 27) instantaneously changes a shape into an isolated line pattern, a dotted pattern, a line and space pattern, a large land-like pattern, or the like.

A general display panel for a television (a liquid crystal type, an organic EL type) is constituted by an image display region arranged in a matrix such that a pixel part of about 200 to 300 $\mu$m square has a predetermined aspect ratio such as 2:1, 16:9, or the like, on the substrate P, and a peripheral circuit part (an extraction wiring, a connection pad, or the like) disposed at a periphery thereof. A thin film transistor (TFT) for switching or current driving is formed in each pixel part, but a size (line width) of a pattern for TFT (a pattern for a gate layer, a drain/source layer, a semiconductor layer, or the like), a gate wiring, or a driving wiring is sufficiently small compared to the arrangement pitch (200 to 300 $\mu$m) of the pixel part. For this reason, when the pattern in the image display region is exposed, since the pattern image projected from the DMD 10 is almost isolated, the telecentric error $\Delta\theta t$ does not occur.

However, according to the configuration of the lighting driving circuit (TFT circuit) for each pixel part, line and space wirings arranged in the X direction or the Y direction may be formed at a pitch smaller than the arrangement pitch of the pixel part. In this case, when the pattern in the image display region is exposed, the pattern image projected from the DMD 10 has periodicity. For this reason, the telecentric error $\Delta\theta t$ occurs depending on the degree of periodicity. In addition, upon exposure of the image display region, a rectangular pattern having substantially the same size as the pixel part or having a size more than half of the area of the pixel part may be uniformly exposed. In this case, the plurality of micro mirrors Ms of the DMD 10 during exposure of the image display region becomes the ON state with more than half of them being in a nearly dense state. For this reason, a relatively large telecentric error $\Delta\theta t$ may occur.

The generation state of the telecentric error $\Delta\theta t$ can be estimated before exposure on the basis of the drawing data of the pattern for a display panel exposed to each of the plurality of modules MUn (n=1 to 27). In the embodiment, the module MUn is configured such that a position or a posture of each of several optical members is finely adjustable, and among these optical members, it is possible to correct the telecentric error $\Delta\theta t$ by selecting an adjustable optical member according to the estimated magnitude of the telecentric error $\Delta\theta t$.

Figure 30:
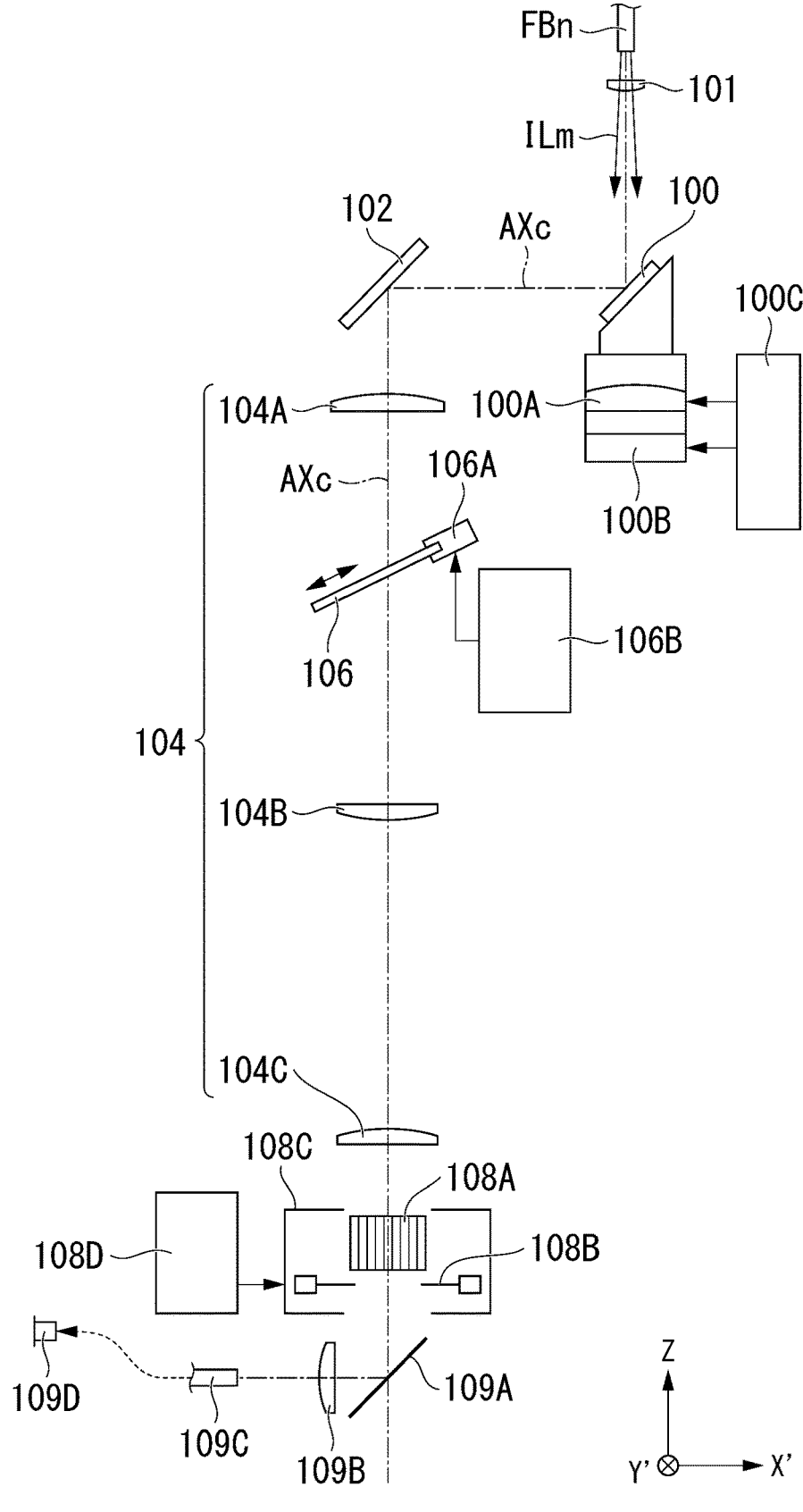
FIG. 30 is a view showing a specific configuration of an optical path from the optical fiber bundle FBn in an illumination unit ILU to the MFE 108A shown in FIG. 4 or FIG. 6.
Figure 31:
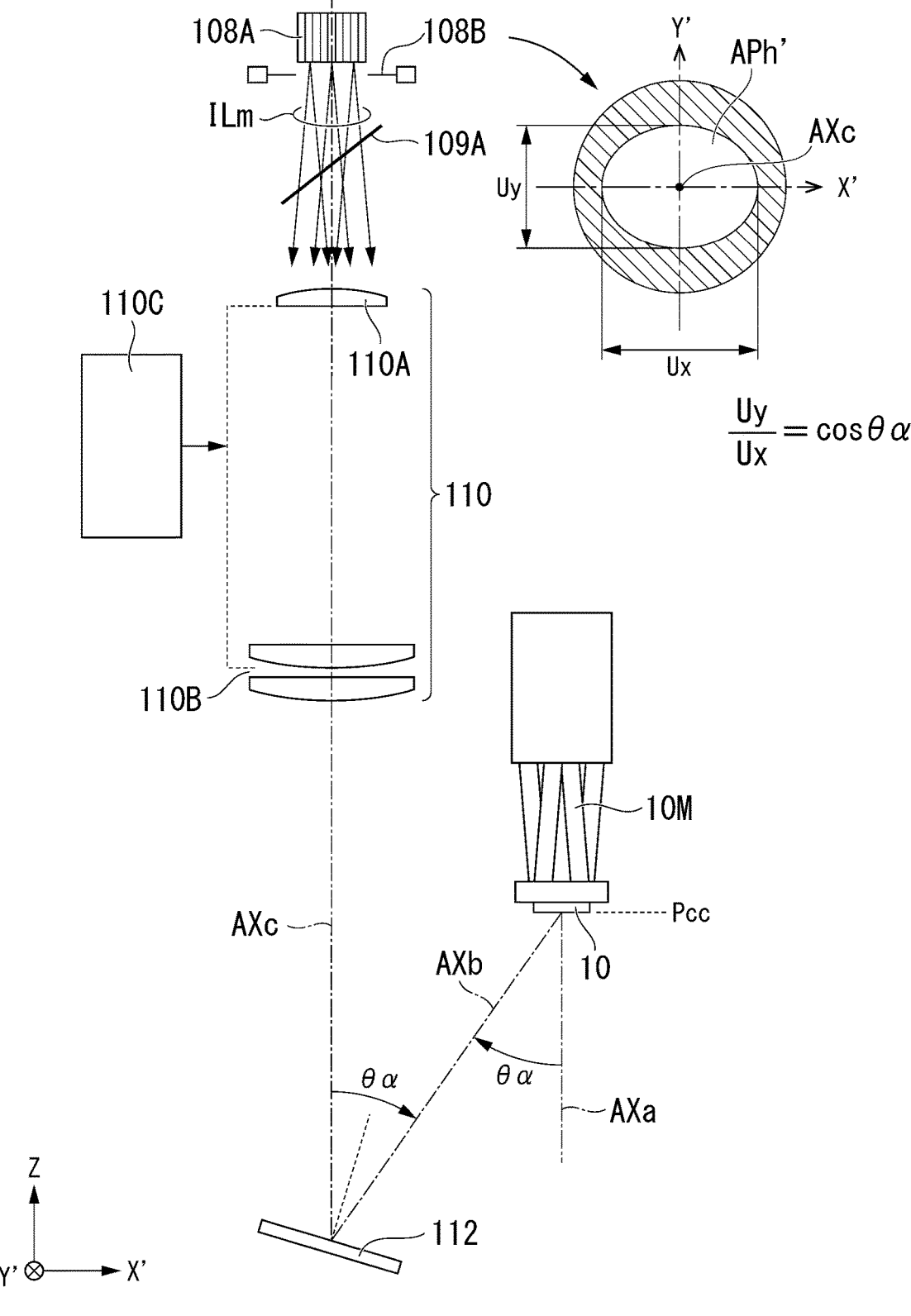
FIG. 31 is a view showing a specific configuration of an optical path from the MFE 108A in the illumination unit ILU to the DMD 10 shown in FIG. 4 or FIG. 6.

FIG. 30 shows a specific configuration of the optical path from the optical fiber bundle FBn to the MFE lens 108A in the illumination unit ILU of the module MUn shown in FIG. 4 or FIG. 6 above, and FIG. 31 shows a specific configuration of the optical path from the MFE lens 108A to the DMD 10 in the illumination unit ILU. In FIG. 30 and FIG. 31, the orthogonal coordinate system X'Y'Z is set to be the same as the coordinate system X'Y'Z of FIG. 4 (FIG. 6), and the members having the same functions as the members shown in FIG. 4 are designated by the same reference signs.

While not shown in FIG. 4, in FIG. 30, a contact lens 101 is disposed immediately behind the emission end of the optical fiber bundle FBn, and the spread of the illumination light ILm from the emission end is suppressed. The optical axis of the contact lens 101 is set to be parallel to the Z axis, and the illumination light ILm that advances from the optical fiber bundle FBn with a predetermined numerical aperture is reflected by the mirror 100 to advance parallel to the X' axis and is reflected by the mirror 102 in the −Z direction. The input lens system 104 disposed in the middle of the optical path from the mirror 102 to the MFE lens 108A is constituted by three lens groups 104A, 104B and 104C along the optical axis AXc at an interval.

The illuminance adjustment filter 106 is supported by a holding member 106A translated by a driving mechanism 106B, and disposed between the lens group 104A and the lens group 104B. For example, as disclosed in Japanese Unexamined Patent Application, First Publication No. H11-195587, an example of the illuminance adjustment filter 106 is one in which a fine light shielding dot pattern is formed by gradually changing the density on a transmission plate such as a quartz or the like, or one in which a plurality of rows of elongated light shielding wedge-shaped patterns are formed, and transmissivity of the illumination light ILm can be changed continuously within a predetermined range by moving a quartz plate in parallel.

The first telecentric adjustment mechanism is constituted by a tilting mechanism 100A configured to finely adjust a two-dimensional inclination (a rotation angle around the X' axis and the Y' axis) of the mirror 100 configured to reflect the illumination light ILm from the optical fiber bundle FBn, a translation mechanism 100B configured to finely move the mirror 100 two-dimensionally in the X'Y' plane perpendicular to the optical axis AXc, and a driving unit 100C constituted by a micro head, a piezo actuator, or the like, configured to individually drive each of the tilting mechanism 100A and the translation mechanism 100B.

By adjusting the inclination of the mirror 100, the center ray (principal ray) of the illumination light ILm entering the input lens system 104 can be adjusted to a state coaxial with the optical axis AXc. In addition, since the emission end of the fiber bundle FBn is disposed at a position of a front focal point of the input lens system 104, when the mirror 100 is finely moved in the X' direction, the center ray (principal ray) of the illumination light ILm entering the input lens system 104 is shifted parallel to the optical axis AXc in the X' direction. Accordingly, the center ray (principal ray) of the illumination light ILm emitting from the input lens system 104 advances slightly inclined with respect to the optical axis AXc. Accordingly, the illumination light ILm entering the MFE lens 108A is slightly inclined overall in the X'Z plane.

Figure 32:
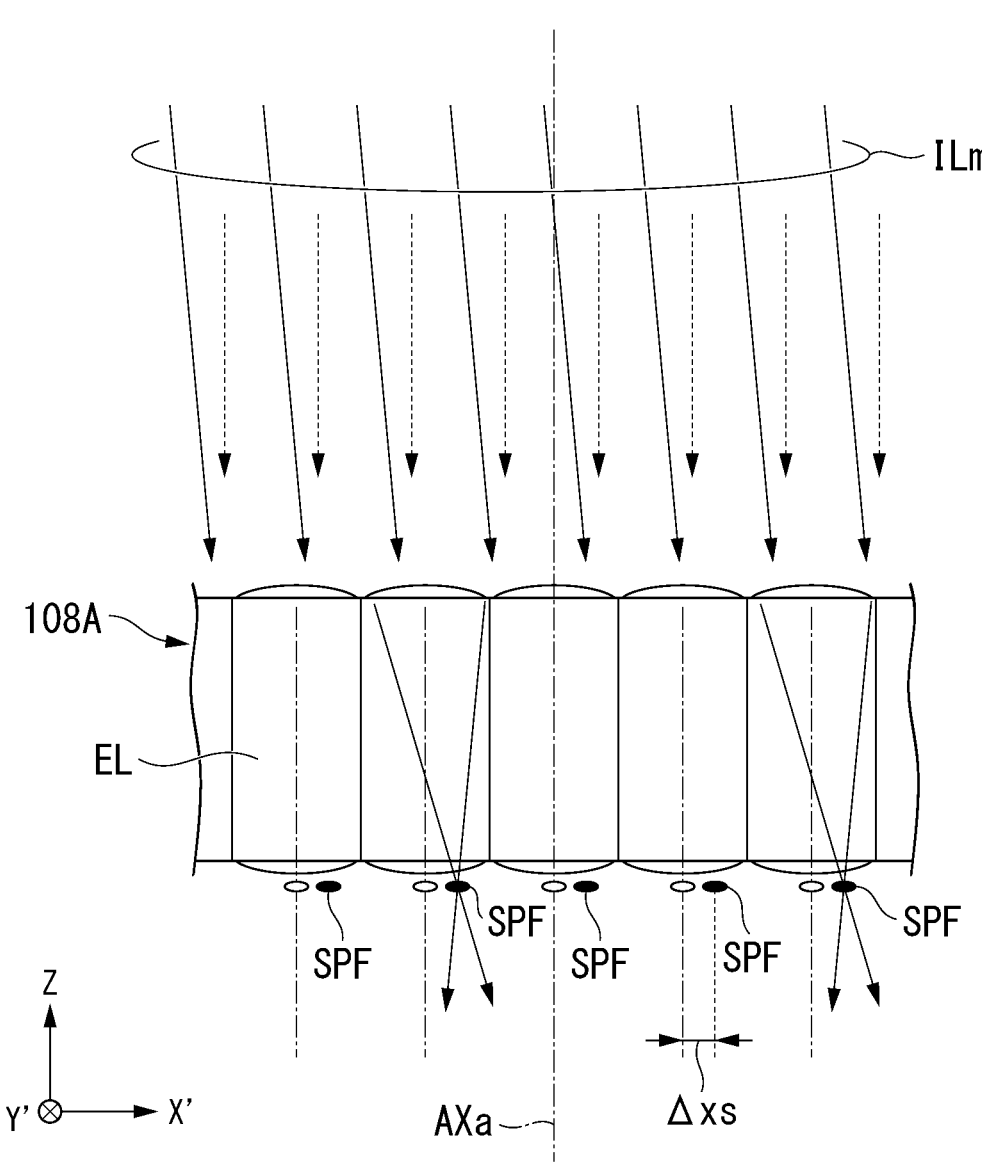
FIG. 32 is a view in which a state of the point light source SPF formed on an emission surface side of the MFE 108A when the illumination light ILm entering the MFE 108A is inclined in the X'Z plane is exaggerated.

FIG. 32 is a view that exaggerates a state of the point light sources SPF formed on the emission surface side of the MFE lens 108A when the illumination light ILm entering the MFE lens 108A is inclined in the X'Z plane. When the center ray (principal ray) of the illumination light ILm is parallel to the optical axis AXc, the point light sources SPF condensed on the emission surface side of each of the lens elements EL of the MFE lens 108A are located at a center in the X' direction as shown by a white circle in FIG. 32. When the illumination light ILm is inclined with respect to the optical axis AXc in the X'Z plane, the point light sources SPF condensed on the emission surface side each of the lens elements EL is eccentric by $\Delta$xs in the X' direction from a center position as shown by a black circle in FIG. 32. In this case, as described in FIG. 7 to FIG. 9 above, the surface light source by the aggregate of the plurality of point light sources SPF formed on the emission surface side of the MFE lens 108A is laterally shifted by $\Delta$xs in the X' direction as a whole. Since a cross-sectional dimension in the X'Y' plane of each of the lens elements EL of the MFE lens 108A is small, eccentricity $\Delta$xs in the X' direction as the surface light source is also small.

As shown in FIG. 30, an opening diaphragm 108B having an opening shape of the ellipse region APh' shown in FIG. 12 is provided on the emission surface side of the MFE lens 108A, and the MFE lens 108A and the opening diaphragm 108B are integrally attached to a holding portion 108C. The holding portion 108C (the MFE 108A) is provided such that a position in the X'Y' plane can be finely adjusted by a micro-motion mechanism 108D such as a micro head, a piezo motor, or the like. In the embodiment, the micro-motion mechanism 108D configured to finely move the MFE lens 108A in the X'Y' plane two-dimensionally functions as a second telecentric adjustment mechanism. As shown in FIG. 31, the opening diaphragm 108B has an opening of the ellipse region APh' using the X' direction as a major axis and the Y' direction as a minor axis. When a dimension of the major axis of the ellipse region APh' is Ux and a dimension of the minor axis is Uy, a ratio Uy/Ux of the ellipse is set to a relation of Uy/Ux=cosα depending on a cosine value of the incidence angle $\theta\alpha$ to the DMD 10 of the illumination light ILm (two times the inclination angle $\theta$d of the micro mirrors Msa in the ON state).

A plate type beam splitter 109A inclined about 45° with respect to the optical axis AXc is provided immediately behind the MFE lens 108A (the opening diaphragm 108B). The beam splitter 109A transmits most of a quantity of light of the illumination light ILm from the MFE lens 108A, and reflects the remaining quantity of light (for example, about several %) toward a condensing lens 109B. Some of the illumination light ILm condensed by the condensing lens 109B is guided to a photoelectric element 109D by an optical fiber bundle 109C. The photoelectric element 109D is used as an integration sensor (integration monitor) configured to monitor the intensity of the illumination light ILm and measure an exposure value of the image forming light flux projected to the substrate P.

As shown in FIG. 31, the illumination light ILm from the surface light source on the emission surface side of the MFE lens 108A (the aggregate of the point light sources SPF) passes through the beam splitter 109A and enters the condenser lens system 110. The condenser lens system 110 is constituted by a front group lens system 110A and a rear group lens system 110B, which are disposed at an interval, and a two-dimensional position in the X'Y' plane can be finely adjusted by a micro-motion mechanism 110C such as a micro head, a piezo motor, or the like. That is, eccentricity adjustment of the condenser lens system 110 can be performed by the micro-motion mechanism 110C. In the embodiment, the micro-motion mechanism 110C configured to finely move the condenser lens system 110 in the X'Y' plane two-dimensionally functions as a third telecentric adjustment mechanism. Further, all the first telecentric adjustment mechanism, the second telecentric adjustment mechanism, and the third telecentric adjustment mechanism adjust a relative positional relation in an eccentricity direction between the surface light source generated on the emission surface side of the MFE lens 108A (or the surface light source restricted in the opening of the ellipse region APh' of the opening diaphragm 108B) and the condenser lens system 110.

The front focal point of the condenser lens system 110 is set to a position of the surface light source on the emission surface side of the MFE lens 108A (the aggregate of the point light sources SPF), and the illumination light ILm that advances in a telecentric state from the condenser lens system 110 via the inclined mirror 112 Kohler-illuminates the DMD 10. As described in FIG. 32 above, when the surface light source by the aggregate of the plurality of point light sources SPF formed on the emission surface side of the MFE lens 108A is laterally shifted by Δxs in the X' direction as a whole, the principal ray (center ray) of the illumination light ILm irradiated to the DMD 10 is slightly inclined with respect to the optical axis AXb in FIG. 31. That is, the incidence angle θα of the illumination light ILm described in FIG. 6, FIG. 17, FIG. 21 and FIG. 25 above can be slightly changed from an initial set angle (35.0°) in the X'Z plane by intentionally applying the telecentric error to the illumination light ILm using the first telecentric adjustment mechanism.

In addition, when the MFE lens 108A and the variable opening diaphragm 108B are integrally displaced in the X'Y' plane in the X' direction by the micro-motion mechanism 108D as the second telecentric adjustment mechanism shown in FIG. 30, the opening of the opening diaphragm 108B (the ellipse region APh' in FIG. 31) is eccentric from the optical axis AXc. Accordingly, the surface light source formed in the ellipse region APh' is also shifted in the X' direction as a whole. Even in this case, the principal ray (center ray) of the illumination light ILm irradiated to the DMD 10 can be inclined with respect to the optical axis AXb in the X'Z plane in FIG. 31. That is, the incidence angle θα of the illumination light ILm to the DMD 10 can be changed from the initial set angle (35.0°) in the X'Z plane. Further, even when only the opening diaphragm 108B is configured to be solely finely moved in the X'Y' plane by the micro-motion mechanism 108D, the incidence angle θα can be changed similarly.

In this way, since the MFE lens 108A and the opening diaphragm 108B are integrally relatively largely displaced, it is necessary to expand a light flux width (a diameter of an irradiation range) of the illumination light ILm irradiated from the input lens system 104 to the MFE lens 108A. Further, it is also effective to provide a shift mechanism configured to laterally shift the illumination light ILm irradiated to the MFE lens 108A in the X'Y' plane in conjunction with an amount of the displacement. The shift mechanism can be constituted by a mechanism configured to incline a direction of the emission end of the optical fiber bundle FBn, a mechanism configured to incline a parallel planar plate (quartz plate) disposed in front of the MFE lens 108A, or the like.

While both the first telecentric adjustment mechanism (the driving unit 100C or the like) and the second telecentric adjustment mechanism (the micro-motion mechanism 108D or the like) can adjust the incidence angle θα of the illumination light ILm to the DMD 10, regarding the adjustment amount, the first telecentric adjustment mechanism can be used for fine adjustment, and the second telecentric adjustment mechanism can be used for rough adjustment. In actual adjustment, whether to use both the first telecentric adjustment mechanism and the second telecentric adjustment mechanism or to use either one can be selected as appropriate depending on the form of the pattern to be projected and exposed (the amount of the telecentric error Δθt and the correction amount).

Further, the micro-motion mechanism 110C as the third telecentric adjustment mechanism configured to make the condenser lens system 110 eccentric in the X'Y' plane has the same effect as a case in which the position of the surface light source defined by the MFE lens 108A and the opening diaphragm 108B is made relatively eccentric by the second telecentric adjustment mechanism. However, when the condenser lens system 110 is eccentric in the X' direction (or the Y' direction), since the irradiation region of the illumination light ILm projected to the DMD 10 is laterally shifted, the irradiation region is set larger than the size of the entire mirror surface of the DMD 10 while taking into account the lateral shift. The third telecentric adjustment mechanism by the micro-motion mechanism 110C can also be used for rough adjustment in the same way as the second telecentric adjustment mechanism.

(Other Telecentric Adjustment Mechanisms)

In adjustment (correction) of the telecentric error, a position in the X'Y' plane of the emission end of each of the optical fiber bundles FBn (n=1 to 27) shown in FIG. 4 and FIG. 30 can also be laterally shifted by the micro-motion mechanism. In this case, like the above-mentioned first telecentric adjustment mechanism (the driving mechanism 100C or the like), the position of the surface light source (the aggregate of the plurality of point light sources SPF) formed on the emission surface side of the MFE lens 108A can be finely adjusted.

In correction of the telecentric error, the original angle of the inclined mirror 112 shown in FIG. 4, FIG. 6 and FIG. 31 can be adjusted by the micro-motion mechanism such as a micro head, a piezo actuator, or the like, and the incidence angle θα (for example, 35.0° by design) of the illumination light ILm to the DMD 10 can also be finely adjusted. Alternatively, the inclination of the mirror surface (the neutral plane Pcc) of the DMD 10 can be finely adjusted by a micro-motion stage obtained by combining a parallel link mechanism of the mount portion 10M and a piezo element shown in FIG. 4 and FIG. 31, and the telecentric error may also be corrected. However, the angle adjustment of the inclined mirror 112 or the DMD 10 is used for rough adjustment because the reflected light is inclined at twice the adjustment angle. Further, in angle adjustment of the DMD 10, image surface inclination in which the conjugation surface (best focus surface) of the neutral plane Pcc projected onto the substrate P is inclined in the direction of the scanning exposure (the X' direction or the X direction) with respect to the plane perpendicular to the optical axis AXa occurs.

When the direction of the image surface inclination is the direction of the scanning exposure, since the scanning exposure is performed at an average image surface position of the inclined image surface, a decrease in contrast of the exposed pattern image is minor. For example, as disclosed in Japanese Patent No. 2830492, an exposure method of relatively slightly inclining a best focus surface of a pattern image projected from a projection unit PLU and a surface of a substrate P in a direction of the scanning exposure has an effect of enlarging a depth of focus (DOF) especially upon exposure of an isolated pattern.

Accordingly, a function of inclining the DMD 10 in the scanning exposure direction (the X' direction or the X direction) and correcting the telecentric error $\Delta\theta t$ can also be utilized within a range in which contrast reduction of the exposed pattern image is negligible. When the DMD 10 is inclined to such an extent that contrast reduction cannot be ignored, some kind of image surface inclination correction systems (such as a two-wedge-shaped declination prism or the like) will be provided within the projection unit PLU. Alternatively, in order to correct the telecentric error $\Delta\theta t$, a mechanism configured to make a specified lens group or lens eccentric in the projection unit PLU with respect to the optical axis AXa may be provided.

In the above-mentioned description, it is assumed that the telecentric error $\Delta\theta t$ mainly occurs in the X' direction (the direction of the inclination of the micro mirrors Msa in the ON state). However, the exposed pattern may be a line and space pattern inclined at an angle of 30° to 60° with respect to each of the X' direction and the Y' direction on the substrate P. In such a case, the micro mirrors Msa in the ON state are also obliquely arranged in the X'Y' plane, and arranged with periodicity in a direction perpendicular to the inclination direction. For this reason, the telecentric error $\Delta\theta t$ occurs in the reflected light (image forming light flux) Sa' generated from the micro mirrors Msa in the ON state due to the influence of the diffraction phenomenon.

While the telecentric error $\Delta\theta t$ occurs only in the X' direction in the case of the line and space pattern as shown in FIG. 24 above, the telecentric error $\Delta\theta t$ occurs in the X' direction and the Y' direction in the case of the line and space pattern inclined in the X'Y' plane (the XY plane). Accordingly, even in the case of the line and space pattern inclined at an angle of 30° to 60°, when the telecentric error $\Delta\theta t$ that may occur exceeds the allowable range in either the X' direction or Y' direction, it can be corrected by some adjustment mechanisms for the telecentric error described in FIG. 30 and FIG. 31 above.

In addition, the telecentric error $\Delta\theta t$ is caused by an error from the design value of the inclination angle $\theta d$ of the micro mirrors Ms in the ON state of the DMD 10, regardless of the aspect of the pattern to be projected. In the DMD 10 exemplified in above, while the inclination angle $\theta d$ of the micro mirrors Msa in the ON state is set at 17.5° at a nominal value (design value), a driving error of ±0.5° occurs due to a variation or the like in a process of a manufacturing step of the DMD 10. When the driving error is ±0.5°, if the incidence angle $\theta\alpha$ of the illumination light ILm to the DMD 10 is constant at 35.0°, the telecentric error on the object surface side (the side of the DMD 10) of the projection unit PLU becomes ±1° at most. Accordingly, when the projection magnification Mp of the projection unit PLU is ⅙, the telecentric error $\Delta\theta t$ on the image surface side caused by the driving error of the micro mirrors Msa becomes ±6° at most.

Accordingly, it is desirable to measure the telecentric error $\Delta\theta t$ due to the driving error of the DMD 10 of each of the modules MUn (n=1 to 27) in advance and perform adjustment (calibration) before exposing the actual pattern using the calibration reference portion CU provided around the substrate holder 4B of the exposure apparatus shown in FIG. 1 above. The calibration reference portion CU incorporates an imaging element that partially magnifies and observes the projection image by the projection unit PLU of the pattern created by the DMD 10. Here, the projection image of the test pattern (line and space, or the like) created by the DMD 10 can be image-sampled by changing the focus position (a position in the Z direction of the substrate holder 4B) little by little, and the telecentric error $\Delta\theta t$ can be measured by analyzing changes in the lateral shift of the test pattern image for each focus position.

In the description of the above-mentioned first embodiment, the isolated pattern as an aspect of the pattern is not particularly limited to the case in which one or a row of all the micro mirrors Ms of the DMD 10 becomes the micro mirrors Msa in the ON state. For example, it can also be regarded as the isolated pattern even when two, three (1×3), four (2×2), six (2×3), eight (2×4), or nine (3×3) micro mirrors Msa in the ON state are densely arranged, and, for example, 10 or more micro mirrors Ms therearound become the micro mirrors Msb in the OFF state in the X' direction and the Y' direction. On the contrary, it can also be regarded as the land-like pattern when two, three (1×3), four (2×2), six (2×3), eight (2×4), or nine (3×3) micro mirrors Msa in the OFF state are densely arranged, and, for example, the micro mirrors Msb therearound becomes the micro mirrors Msa in the ON state) densely arranged to several or more (corresponding to a dimension several times or more than the isolated pattern) in the X' direction and the Y' direction.

In addition, the line and space pattern as an aspect of the pattern is also not particularly limited to the aspect as shown in FIG. 24 in which the micro mirrors Msa in the ON state of one row and the micro mirrors Msb in the OFF state of one row are alternately arranged repeatedly. For example, the pattern may be an aspect in which the micro mirrors Msa in the ON state of two rows and the micro mirrors Msb in the OFF state of two rows are alternately arranged repeatedly, an aspect in which the micro mirrors Msa in the ON state of three rows and the micro mirrors Msb in the OFF state of three rows are alternately arranged repeatedly, or an aspect in which the micro mirrors Msa in the ON state of two rows and the micro mirrors Msb in the OFF state of four rows are alternately arranged repeatedly. Even in the case of any pattern type, when the distribution state (a density or a concentration degree) of the micro mirrors Ms in the ON state per unit area (for example, an arrangement region of 100×100 micro mirrors Ms) in all the micro mirrors Ms of the DMD 10 is determined, the telecentric error $\Delta\theta t$ or the degree of the asymmetric property of the pattern edge can also be easily specified by simulation or the like.

(Variant 1)

In the above-mentioned embodiment, as described in FIG. 11, since the intensity distribution (the light source image Ips) of the zero order light equivalency ingredient of the image forming light flux Sa' formed at the pupil Ep of the projection unit PLU is formed in an elliptical shape by the oblique illumination of the illumination light ILm to the DMD 10, for the purpose of the correction, as shown in FIG. 31, the opening diaphragm 108B having the opening of the ellipse region APh' is provided on the emission surface side of the MFE 108A.

In this case, as shown in FIG. 12, since the illumination light ILm irradiated to the incident surface side of the MFE 108A becomes a circular illumination region Ef, the point light sources SPF distributed outside the ellipse region APh' is blocked, and thus, a decrease in use efficiency of the illumination light ILm, i.e., loss in quantity of light occurs. Here, in the variant, the illumination region Ef of the illumination light ILm irradiated to the incident surface side of the MFE 108A is formed in the elliptical shape in line with the ellipse region APh'. For this reason, in the variant, a transmissive diffraction optical element (also referred to as DOE) is used to reduce the loss in quantity of light.

Figure 33:
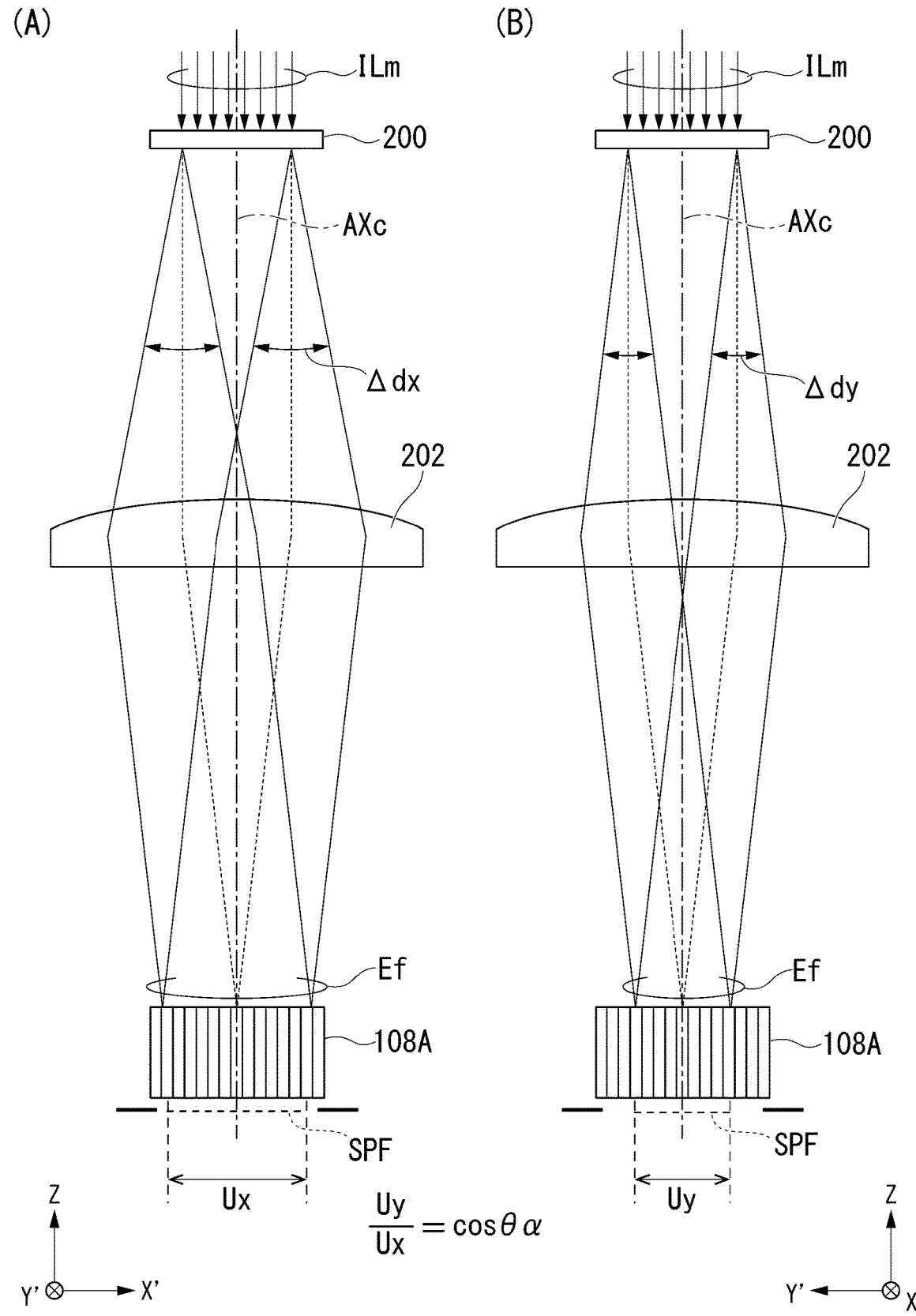
FIG. 33 is a view showing a variant of the illumination unit ILU having a surface light source formed on an emission surface side of the MFE 108A in an elliptical shape using a diffraction optical element (DOE).

FIG. 33 is a view schematically showing optical arrangement of a major part of the illumination unit ILU using a diffraction optical element (DOE) 200. FIG. 33(A) is a view showing disposition of the DOE 200, an input lens system 202 (equivalent to the input lens system 104 of FIG. 30 above), and the MFE 108A in the X'Z plane, and FIG. 33(B) is a view showing disposition of the DOE 200, the input lens system 202, and the MFE 108A in the Y'Z plane. The DOE 200 has a plurality of diffraction grating element formed by carving fine line-shaped irregularities on a surface of a quartz plate with different pitches or directions. The illumination optical system having such DOE 200 disposed in front of the fly's eye lens and configured to change a shape of the surface light source formed on the emission surface side of the fly's eye lens is disclosed in, for example, Japanese Unexamined Patent Application, First Publication No. 2001-176766.

In the variant, a pitch or the like of the diffraction grating of the DOE 200 is set such that the illumination region Ef of the illumination light ILm on the incident surface side of the MFE 108A has an elliptical shape in the X'Y' plane. The illumination light ILm (divergent light) from the fiber bundle FBn shown in FIG. 30 above is converted into parallel light flux having a circular intensity distribution in a cross section by a beam expander optical system or the like (not shown), and then, enters the DOF 200. As shown in FIG. 33(A) and FIG. 33(B), a diffraction angle of the diffraction light generated from the DOE 200 is set such that a diffraction angle $\Delta dy$ in the Y'Z plane is reduced compared to a diffraction angle $\Delta dx$ in the X'Z plane.

Since a position of a rear focal point of the input lens system 202 is set to the incident surface of the MFE 108A, a dimension Uy in the Y' direction of the illumination region Ef in the plane containing the optical axis AXc parallel to the Y'Z plane is smaller than a dimension Ux in the X' direction of the illumination region Ef in the plane containing the optical axis AXc parallel to the X'Z plane due to differences between the diffraction angles $\Delta dx$ and $\Delta dy$. A ratio Uy/Ux between the dimension Ux that is a major axis and the dimension Uy that is a minor axis is set to cos $\theta\alpha$ as described above.

According to the above-mentioned configuration, the plurality of point light sources SPF formed on the emission surface side of the MFE 108A are formed on the emission surface side only of each of the plurality of lens elements EL arranged in the range of the elliptical shape corresponding to the illumination region Ef. The diffraction grating formed on the DOE 200 has a grating structure in which high-order diffraction light with a diffraction angle greater than $\Delta dx$ and $\Delta dy$ is not generated or the high-order diffraction light has extremely low intensity even if it is generated, such that most (for example, about 90%) of a total quantity of light of the illumination light ILm enters the input lens system 202.

Further, even when the DOE 200 is used, even if the opening diaphragm 108B having the elliptical opening is used, the major axis direction and the minor axis direction of the surface light source having the elliptical shape formed on the emission surface side of the MFE 108A are uniquely determined by the incidence direction in the X'Y' plane of the illumination light ILm to the DMD 10. For this reason, while adjustment of the ellipse region APh' in the X'Y' plane in the rotation direction is not necessary, but if necessary, a micro-rotation mechanism of the DOE 200 or the opening diaphragm 108B may be provided.

In addition, for adjustment (correction) of the telecentric error $\Delta\theta t$, when the incidence angle $\theta\alpha$ of the illumination light ILm to the DMD 10 is finely adjusted from a prescribed value (for example, 35.0°), adjustment of the ellipse ratio Uy/Ux of the ellipse region APh' (see FIG. 30 and FIG. 33) can be also considered. For example, when the incidence angle $\theta\alpha$ is changed by a prescribed value of 35.0°±0.5° (equivalent to ±6° as a telecentric angle adjustment amount on the image surface side when the projection magnification Mp=⅙), the ellipse ratio Uy/Ux at the incidence angle of 35.0° is 0.8191, the ellipse ratio Uy/Ux at the incidence angle of 34.5° is 0.8241, and the ellipse ratio Uy/Ux at the incidence angle of 35.5° is 0.8141. Accordingly, the rate of change in the ellipse ratio Uy/Ux due to the adjustment of the incidence angle $\theta$ of ±0.5° is as small as ±0.6%. Further, even when the adjustment range of the incidence angle $\theta\alpha$ becomes ±1.0°, since the rate of change of the ellipse ratio Uy/Ux will be ±1.2%, there is no problem even if the ellipse ratio Uy/Ux is not adjusted.

(Variant 2)

Figure 34:
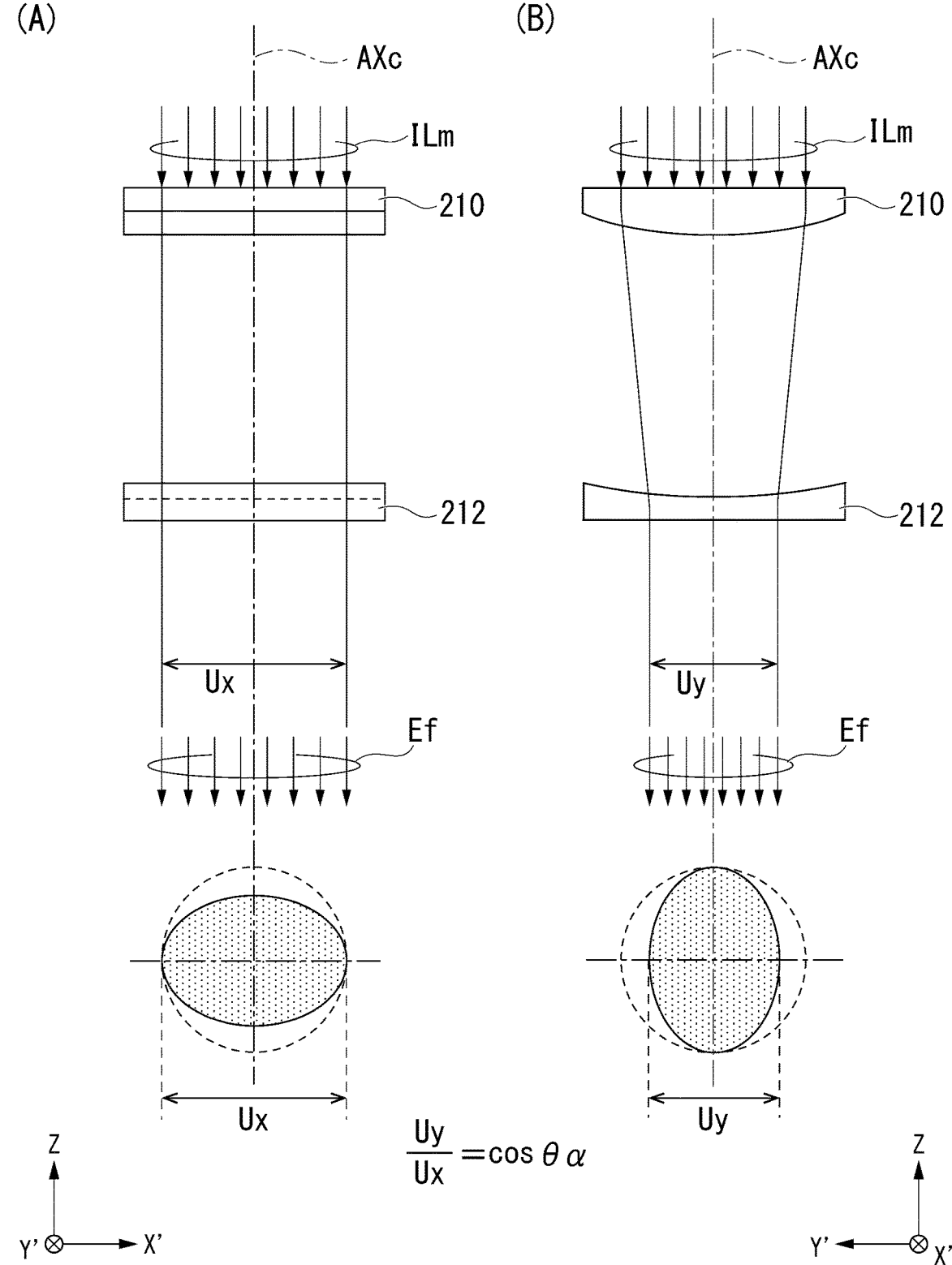
FIG. 34 is a view showing an optical arrangement according to a second variant for forming a surface light source on the emission surface side of the MFE 108A in an elliptical shape.

FIG. 34 shows optical arrangement according to a second variant in which a distribution (outline) in a cross section of the illumination light ILm entering the MFE 108A has an elliptical shape in order to form the surface light source of the elliptical shape (the aggregate of the plurality of point light sources SPF) on the emission surface side of the MFE 108A. FIG. 34(A) is a view showing disposition of two cylindrical lenses 210 and 212 disposed at positions in front of the MFE 108A in the X'Z plane, and FIG. 34(B) is a view showing disposition of FIG. 34(A) in the Y'Z plane. In the variant, the cylindrical lens 210 having positive refractive power and the cylindrical lens 212 having negative refractive power are disposed at positions in front of the MFE 108A along the optical axis AXc of the illumination unit Ilu at a predetermined interval.

A generating line of each of the cylindrical lenses 210 and 212 is set to be parallel to the X' axis. Accordingly, when the illumination light ILm having a circular intensity distribution in a cross section and becoming a parallel light flux enters the cylindrical lens 210, since the cylindrical lens 210 functions as parallel planar plate with no refractive power in the X'Z plane, as shown in FIG. 34(A), the illumination light ILm enters the cylindrical lens 212 as it is without changing the width in the X' direction. Meanwhile, as shown in FIG. 34(B), since the cylindrical lens 210 has the positive refractive power in the Y'Z plane, the illumination light ILm passing through the cylindrical lens 210 enters the cylindrical lens 212 while gradually reducing the width in the X' direction.

Since the cylindrical lens 212 functions as a parallel planar plate with no refractive power in the X'Z plane, as shown in FIG. 34(A), the illumination light ILm is emitted in a state of a parallel light flux as it is without changing the width in the X' direction, and reaches the illumination region Ef on the MFE 108A of the rear stage. Meanwhile, as shown in FIG. 34(B), since the cylindrical lens 212 has the negative refractive power in the Y'Z plane, the illumination light ILm passing through the cylindrical lens 212 reaches the illumination region Ef on the MFE 108A of the rear stage in a state of the parallel light flux having a width in the Y' direction that is reduced to be smaller than the original width.

In this way, when the two cylindrical 210 and 212 having anisotropic refractive power are provided as lens elements, a focal point position of the cylindrical lens 210 (a position where the illumination light ILm is condensed in the Y'Z plane) and a focal point position of the cylindrical lens 212 are set to become the same position on the optical axis AXc. The ellipse ratio Uy/Ux of the illumination region Ef can be set to a value (cos θα) corresponding to the incidence angle θα by appropriately setting a focal point distance of each of the cylindrical lenses 210 and 212 and an interval between the cylindrical lenses 210 and 212.

Further, in the configuration of FIG. 34, while the circular intensity distribution in the cross section of the original illumination light ILm is deformed into the elliptical shape by being compressed in the Y' direction, the illumination light ILm having the circular intensity distribution may be expanded by the negative cylindrical lens 212 in the Y' direction by switching disposition of the cylindrical lenses 210 and 212, and then, the positive cylindrical lens 210 may be changed into parallel light flux. In this case, the circular intensity distribution in the cross section of the original illumination light ILm is converted into an elliptical shape extended in the Y' direction while keeping the width in the X' direction unchanged. Accordingly, when the illumination light ILm passes from the negative cylindrical lens 212 toward the positive cylindrical lens 210, a generating line of each of the cylindrical lenses 210 and 212 is set to be parallel to the Y' axis.

As described above, as the configuration in which the intensity distribution in the cross section of the illumination light ILm irradiated to the MFE 108A has the elliptical shape, a lens system having different magnifications in a longitudinal direction and a lateral direction like an anamorphic lens, a lens element or a reflecting element having a toroidal surface (toric surface), a Fresnel lens element, a microprism array, or the like, may be used solely or in combination with another spherical lens or non-spherical lens. In this case, like the cylindrical lens, all the anamorphic lens, the lens element having a toroidal surface (toric surface), the Fresnel lens element and the microprism array function as an optical element (a lens element) having anisotropic refractive power or a refractive angle, or a distribution shaping optical element configured to form an outline of the intensity distribution in the cross section.

(Variant 3)

In the projection exposure apparatus configured to expose a pattern for an electronic device such as a semiconductor circuit, a display panel, or the like, on a semiconductor wafer or a glass substrate using a mask substrate, in order reliably expose a pattern with a finer line width, it is known to use a deformation illumination method of forming a shape of a surface light source formed on a pupil surface in an illumination optical system configured to irradiate illumination light onto a mask substrate (for example, an emission surface side of a fly's eye lens) into a annular, bipolar, or quadrupolar shape without forming a simple circular shape. Even in Japanese Unexamined Patent Application, First Publication No. 2001-176766 exemplified above, a configuration of performing multipole illumination such as quadrupole illumination or the like, or annular illumination using a diffraction optical element is disclosed.

Figure 35:
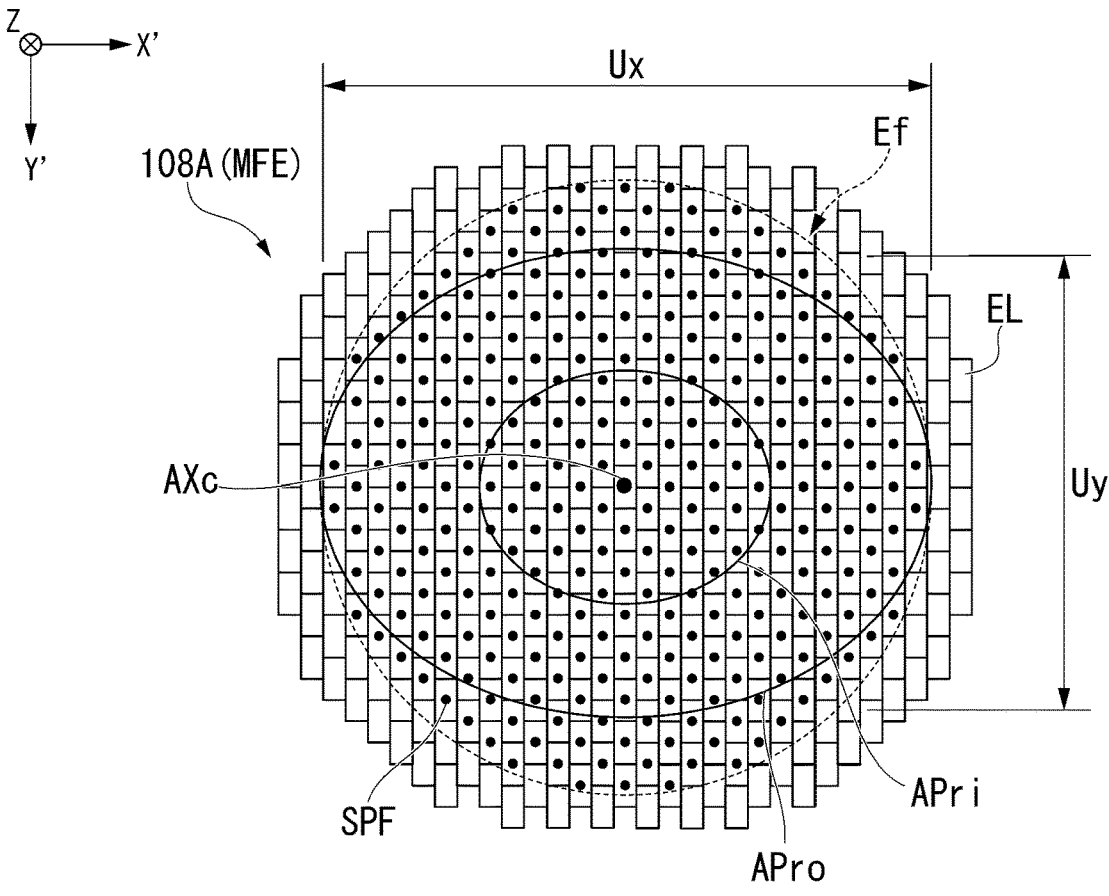
FIG. 35 is a view showing an aggregate (surface light source) of a plurality of point light sources SPF formed on the emission surface side of the MFE 108A in a +Z direction.

Even in the projection exposure of the pattern using the DMD 10, in order to support higher resolution, a configuration that can perform similar deformation illumination methods can be provided in the illumination unit ILU. A simple configuration of performing the deformation illumination method is provided to form the opening shape of the opening diaphragm 108B shown in FIG. 31 above into an annular shape or a multipole shape. Like FIG. 31, FIG. 35 is a view showing the aggregate (surface light source) of the plurality of point light sources SPF formed on the emission surface side of the MFE 108A in the +Z direction. An elliptical annular zone opening is formed in the opening diaphragm 108B to transmit light from the point light sources SPF in a region between an outer ring APro having an elliptical outline and an inner ring APri having an elliptical outline, and to block light from the point light sources SPF located in a central portion inside the inner ring APri containing the optical axis AXc and a peripheral portion outside the outer ring APro.

Even in the variant, the ratio Uy/Ux of the dimension Ux of the major axis in the X' direction and the dimension Uy of the minor axis in the Y' direction of the elliptical outer ring APro is set to cos θα according to the incidence angle θα. In addition, a ratio between a dimension of a major axis in the X' direction and a dimension of a minor axis in the Y' direction of the elliptical inner ring APri is set to cos θα defined by the incidence angle θα. When the opening diaphragm 108B has an elliptical annular zone opening, after forming a light shielding film using a chrome layer on the entire surface of a transparent quartz plate, a part of the light shielding film may be removed by etching into the shape of the elliptical annular zone opening.

Figure 36:
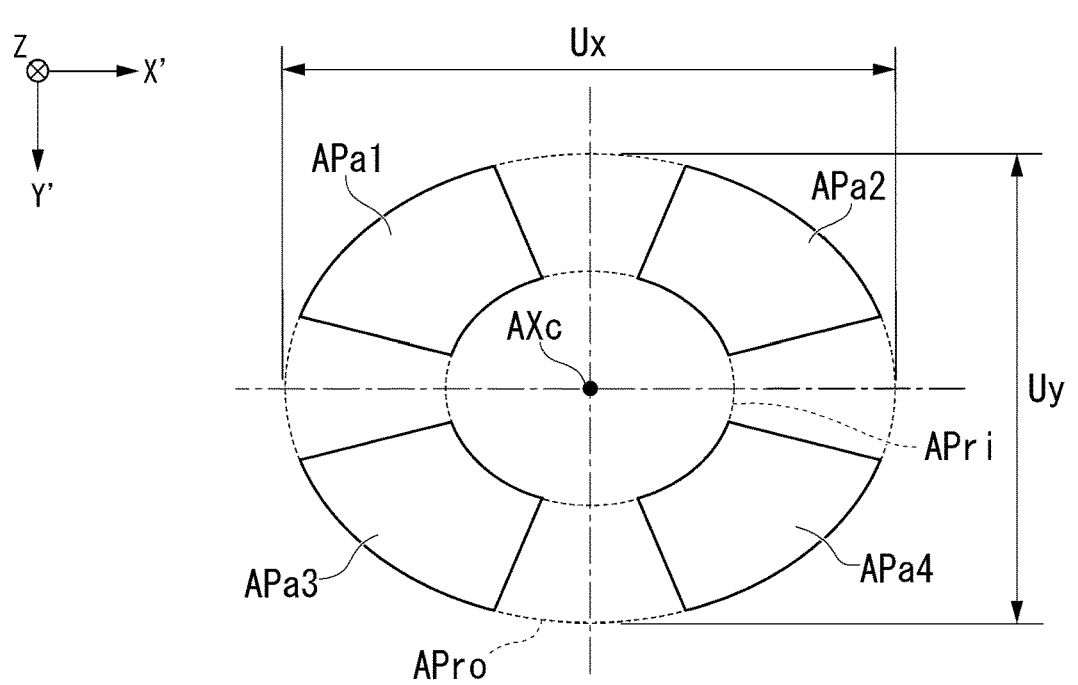
FIG. 36 is a view schematically showing disposition of four fan-shaped regions of a surface light source when an elliptical annular zone opening of FIG. 35 is deformed to perform quadrupole illumination.

In addition, when the quadrupole illumination is performed as the multipole illumination, as shown in FIG. 36, the opening diaphragm 108B configured to open each of four fan-shaped regions APa1, APa2, APa3 and APa4 in a direction inclined about 45° from each of the X' axis and the Y' axis in the elliptical annular region surrounded by the outer ring APro and the inner ring APri in FIG. 35 is provided such that light from the point light sources SPF passes therethrough. A shape of an outline of the annular region including all the four fan-shaped regions APa1, APa2, APa3 and APa4, or an annular line shape passing through a center (center of gravity) of each of the fan-shaped regions APa1, APa2, APa3 and APa4 is set to an elliptical shape having a ratio of a cosine value (=cos θα) of the incidence angle θα.

In the variant, while the elliptical annular zone opening or the four fan-shaped opening are provided in the opening diaphragm 108B for annular illumination or multipole illumination, as disclosed in Japanese Unexamined Patent Application, First Publication No. 2001-176766 exemplified above, an elliptical annular illumination region or a quadrupole illumination region can be formed on the incident surface of the MFE 108A using a diffraction optical element (DOE), an axicon element (a conical prism using an optical axis as a rotation center), or the like, and it is possible to reduce the loss in quantity of light by blocking the light from the point light sources SPF using the light shielding portion of the opening diaphragm 108B. In addition, the shape of the surface light source of each pole for multipole illumination is not limited to the fan-shaped regions APa1, APa2, APa3 and APa4 as shown in FIG. 36, but may also be a rectangular region or a circular region. In addition, the number of poles may be 2, 6, or 8 in addition to 4.

(Variant 4)

In deforming the distribution of the zero order light equivalency ingredient (the 9-order diffraction light Id9 in FIG. 22, the 18-order diffraction light Id18 in FIG. 26) of the image forming light flux Sa' formed on the pupil Ep of the projection unit PLU in the elliptical shape by the oblique illumination of the illumination light ILm to the DMD 10, the shape of the surface light source in the illumination unit ILU can be deformed and corrected in a circular shape. However, as described in FIG. 23 or FIG. 27 above, according to the setting of the diameter (a numerical aperture NA) of the pupil Ep of the projection unit PLU, the diameter of the intensity distribution Hpa (the 9-order diffraction light Id9 in FIG. 23, the 18-order diffraction light Id18 in FIG. 27) of the zero order light equivalency ingredient corrected to the circular shape, the arrangement pitches Pdx and Pdy of the micro mirrors Ms of the DMD 10, the incidence angle θα (=2θd), and the wavelength λ of the illumination light ILm, a large amount of unnecessary diffraction light ingredients passes through the pupil Ep, which may deteriorate the quality of the pattern image exposed on the substrate P.

The unnecessary diffraction light ingredient is a diffraction light ingredient determined by mainly the pitches Pdx and Pdy of the arrangement of the micro mirrors Ms of the DMD 10 and the wavelength λ. For example, as described in FIG. 22 and FIG. 23 above, the 8-order diffraction light Id8 and the 10-order diffraction light Id10 that are ±1-order light equivalency ingredient generated at the pitch Pdx (=Pdy) generate the circular intensity distributions Hpb (and Hpc, Hpd) on both sides in the X' direction (and the Y' direction) of the 9-order diffraction light Id9 that is the zero order light equivalency ingredient, respectively. In the case of FIG. 23, when the shift amount ΔDx (the telecentric error Δθt) of the intensity distribution Hpa of the 9-order diffraction light Id9 that is the zero order light equivalency ingredient is corrected to zero, both portions of the intensity distribution Hpb by each of the 8-order diffraction light Id8 and the 10-order diffraction light Id10 appears in the pupil Ep of the projection unit PLU.

When the maximum numerical aperture on the image surface side corresponding to the diameter of the pupil Ep of the projection unit PLU is NAi, in the case in which the numerical aperture NAi is greater than 0.3 exemplified in FIG. 23, many of the intensity distributions Hpb, Hpc and Hpd of the ±1-order light equivalency ingredient from the DMD 10 will pass through the pupil Ep. For this reason, the individual edge lines of the micro mirrors Msa in the ON state of the DMD 10 are resolved on the substrate P although it is weak, resulting in deterioration of the image quality of the pattern that is finally exposed.

Here, the numerical aperture NAi on the image surface side corresponding to the maximum effective diameter of the pupil Ep of the projection unit PLU is set from an equation determined by the required resolution R (μm), the center wavelength λ of the illumination light ILm, and a process factor k (0<k≤1), i.e., a relation of R=k (λ/NAi). For example, when the process factor k is 0.6, the center wavelength λ is 355.00 nm, and the required resolution R is 0.8 μm, the numerical aperture NAi is about 0.266. In addition, when the center wavelength λ is 343.33 nm and the other conditions are the same, the numerical aperture NAi is about 0.257. In addition, since the center wavelength λ, the pitches Pdx and Pdy of the micro mirrors Ms of the DMD 10, and the incidence angle θα of the illumination light ILm are determined, an angle on the object surface side of the 8-order diffraction light Id8 and the 10-order diffraction light Id10 of the ±1-order light equivalency ingredients with respect to the 9-order diffraction light Id9 of the zero order light equivalency ingredient after correction of the telecentric error Δθt is uniquely determined from the above-mentioned Equation (2) or Equation (3).

When the center wavelength λ is 355.00 nm, like the example shown in FIG. 22 and FIG. 23 above, a diffraction angle θ9 of the 9-order diffraction light Id9=−1.04°, a diffraction angle θ8 of the 8-order diffraction light Id8=+2.73°, and a diffraction angle θ10 of the 10-order diffraction light Id10=−4.81°. From this, an opening angle Δθ8 of the 8-order diffraction light Id8 seen from the 9-order diffraction light Id9 is 3.77°, and an opening angle Δθ10 of the 10-order diffraction light Id10 seen from the 9-order diffraction light Id9 is also 3.77°. Since the opening angles Δθ8 and Δθ10 are the same as each other, assuming Δθ8=Δθ10=Δθj, when converted to the numerical aperture NAoj on the object surface side, NAoj=sin (Δθj), so NAoj≈0.06575. When the projection magnification Mp of the projection unit PLU is set to ⅙, the numerical aperture NAij on the image surface side corresponding to the numerical aperture NAoj on the object surface side is set to NAij=NAoj/Mp≈0.395.

Further, as shown in FIG. 23, the circular intensity distribution Hpa of the 9-order diffraction light Id9, which is equivalent to the zero order light ingredient whose ellipse conversion has been corrected, is formed in the pupil Ep of the projection unit PLU. As also described in FIG. 11 above, a σ value (0<σ≤1) that is a ratio between the diameter of the intensity distribution Hpa and the diameter of the pupil Ep is determined by a magnification of the image forming optical path from the surface light source formed on the emission surface side of the MFE 108A to the pupil Ep of the projection unit PLU and a size of the surface light source formed on the emission surface side of the MFE 108A (a size of the opening when the opening diaphragm 108B is provided) shown in FIG. 31. Accordingly, the numerical aperture NAib on the image surface side corresponding to a radius of the intensity distribution Hpa is set to NAib=σ· NAi. Similarly, the intensity distribution Hpb (and Hpc, Hpd) by each of the 8-order diffraction light Id8 and the 10-order diffraction light Id10 of the ±1-order light equivalency ingredients is distributed with substantially the same diameter as that of the intensity distribution Hpa.

Figure 37:
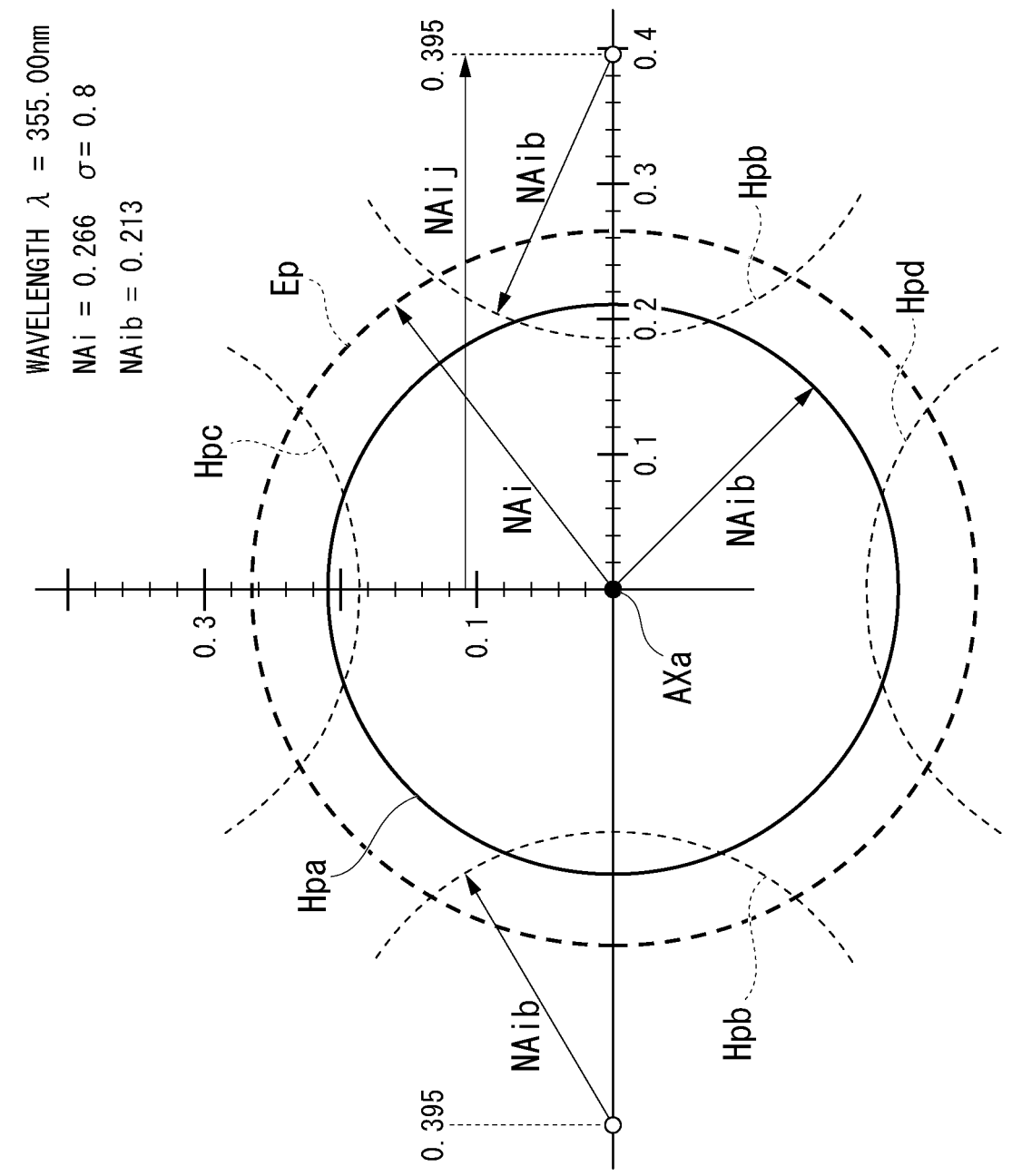
FIG. 37 is a view schematically showing a distribution of diffraction light generated at an arrangement pitch of the micro mirrors Ms of the DMD 10 on a surface of the pupil Ep of the projection unit PLU.

The above-mentioned state can be schematically expressed as shown in FIG. 37. In FIG. 37, a lateral line expresses a numerical aperture in the X' direction in the surface of the pupil Ep, a vertical line expresses a numerical aperture in the Y' direction in the surface of the pupil Ep, and a center point expresses a center (optical axis AXp) of the pupil Ep. Here, the arrangement pitch Pdx (Pdy) of the micro mirrors Ms is 5.4 μm, the center wavelength λ is 355.00 nm, the maximum numerical aperture NAi on the image surface side of the projection unit PLU is 0.266, and the σ value is 0.8. Accordingly, the numerical aperture NAib on the image surface side of each of the intensity distributions Hpa, Hpb, Hpc and Hpd is about 0.213.

In the case of the above-mentioned condition, the position of the center (center of gravity) of the intensity distributions Hpb, Hpc and Hpd by each of the 8-order diffraction light Id8 and the 10-order diffraction light Id10 of the ±1-order light equivalency ingredient is located outside the pupil Ep because the numerical aperture NAij=0.395 is large, but some of them pass through the pupil Ep. For this reason, although the edge line of the micro mirrors Msa in the ON state is weak, there is a possibility of image being formed. Therefore, it is conceivable to set all the intensity distributions Hpb, Hpc and Hpd locate almost completely outside the pupil Ep. Assuming that the center wavelength λ, the pitches Pdx and Pdy of the micro mirrors Ms, the incidence angle θα, and the maximum numerical aperture NAi (here, NAi=0.266) on the image surface side of the projection unit PLU are not changed, all the intensity distributions Hpb, Hpc and Hpd can be disposed almost completely outside the pupil Ep by adjusting the σ value and reducing the diameter of the intensity distribution Hpa of the 9-order diffraction light Id9 equivalent to the zero order light ingredient, i.e., the numerical aperture NAib from the state of FIG. 37.

As a specific example, the numerical aperture NAij (≈0.395) equivalent to the position of the center (center of gravity) of each of the 8-order diffraction light Id8 and the 10-order diffraction light Id10 of the ±1-order light equivalency ingredient, the maximum numerical aperture NAi (≈0.266) on the image surface side of the projection unit PLU, and the numerical aperture NAib equivalent to the diameter of the intensity distribution Hpa of the 9-order diffraction light Id9 equivalent to the zero order light ingredient set by the σ value may be theoretically expressed as the following Equation (8).

[Math. 8]

$$NAib \leqq NAij - NAi \ ( \text{但し、} NAib > 0) \qquad (8)$$

As described in the above-mentioned embodiment, it is desirable that the numerical aperture NAib equivalent to the diameter of the intensity distribution Hpa satisfy Equation (8) and is made as large as possible in a state in which ellipse conversion of the intensity distribution Hpa of the 9-order diffraction light Id9 equivalent to the zero order light ingredient is corrected and also the generated telecentric error Δθt is corrected to zero. Accordingly, under the condition of FIG. 37, it is desirable to set to NAib≈0.129, and it becomes σ=NAib/NAi=0.485 when expressed by the σ value. In actual settings, it is sufficient to have an allowable range, and the range is σ=0.485±15%. Such settings can be similarly applied to the annular illumination method or the multipole illumination method described in FIG. 35 and FIG. 36.

In addition, in the case of the line and space pattern as described in FIG. 24 to FIG. 27 above, since the pitch of the line and space is 2Pdx (or 2Pdy), the opening angle of the diffraction light of the ±1-order light equivalency ingredient with respect to the diffraction light of the zero order light equivalency ingredient is about a half in the case of FIG. 37, and becomes NAij/2 when being converted into the numerical aperture. For this reason, most of the diffraction light of the ±1-order light equivalency ingredient passes through the pupil Ep, and the line and space pattern is reliably exposed.

Figure 38:
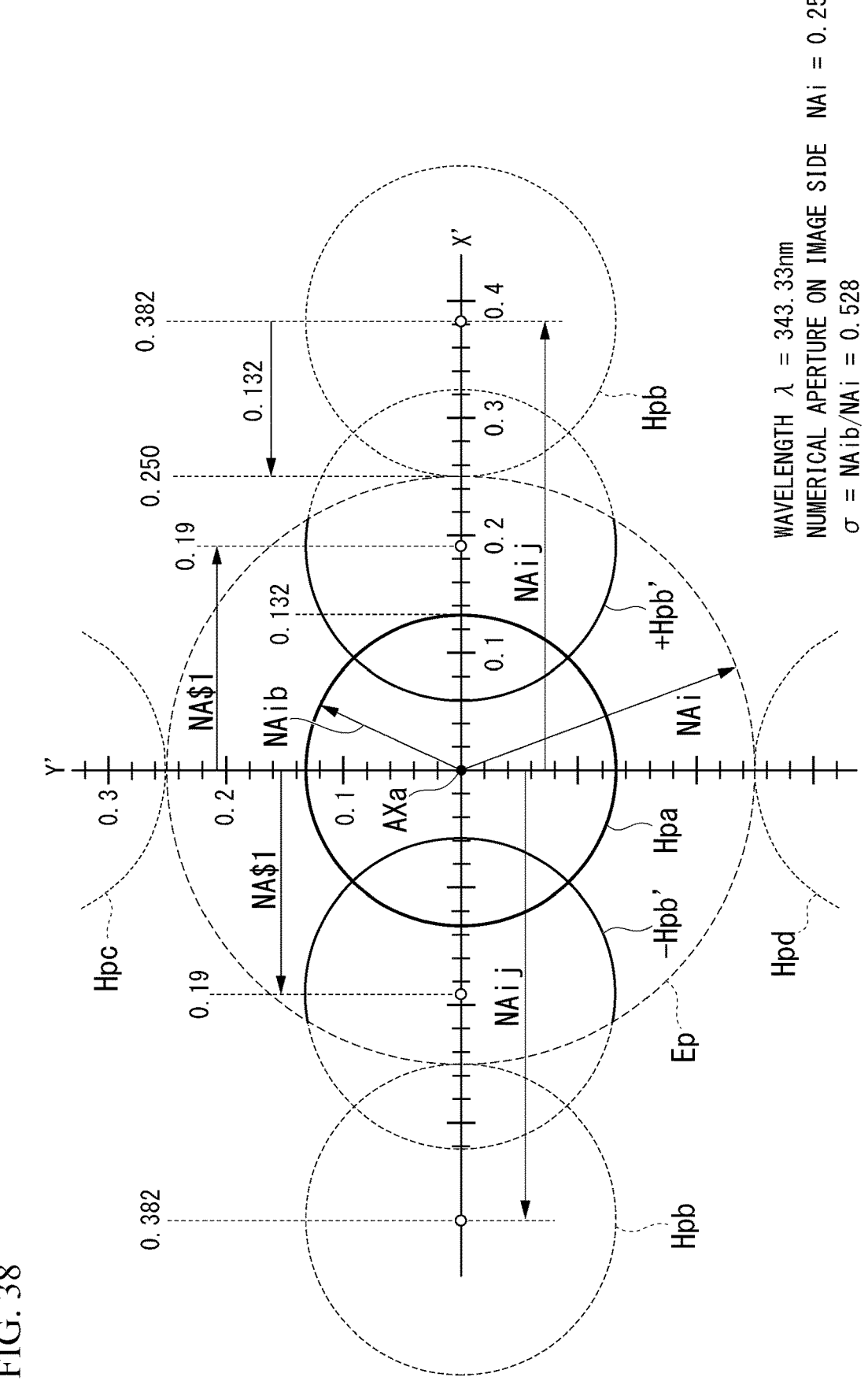
FIG. 38 is a view schematically showing diffraction light appearing on the surface of the pupil Ep of the projection unit PLU when the wavelength λ and a maximum numerical aperture of the pupil Ep described in FIG. 37 are varied.

FIG. 38 schematically shows a distribution of each diffraction light when the wavelength λ of the illumination light ILm is changed to 343.44 nm and the maximum numerical aperture NAi on the image surface side of the projection unit PLU is set to 0.25 under the condition described in FIG. 37. When the arrangement pitch Pdx (=Pdy) of the micro mirrors Ms of the DMD 10 is 5.4 μm, the telecentric error on the object surface side (on the side of the DMD 10) of the 9-order diffraction light Id9 where the inclination angle of the projection unit PLU from the optical axis AXa is the smallest is an angle of about 0.078° and the telecentric error Δθt on the image surface side is an angle of about 0.467° when calculated on the basis of the above-mentioned Equation (2) or (3). If this value is unacceptable, it will be corrected by the adjustment mechanism of the telecentric error described above.

In addition, in FIG. 38, the intensity distribution of the 9-order diffraction light Id9 (zero order light equivalency ingredient) on the pupil Ep is corrected to circular distribution Hpa from the elliptical shape according to the incidence angle θα of the illumination light ILm after correction of the telecentric error Δθt. When the wavelength λ is 343.33 nm, the center (center of gravity) of the 8-order diffraction light Id8 of the +1-order light equivalency ingredient corresponding to the pitch Pdx (Pdy) of the micro mirrors Ms and the center (center of gravity) of the 10-order diffraction light Id10 of the −1-order light equivalency ingredient become NAij≈0.382 in each of the X' direction and the Y' direction when expressed by the numerical aperture NAij.

Here, based on the above-mentioned Equation (8), when the maximum numerical aperture NAi of the pupil Ep is 0.25, the numerical aperture NAib of the circular intensity distribution Hpa of the zero order light equivalency ingredient (the 9-order diffraction light Id9) from the DMD 10 is about 0.132. Accordingly, when the size (specifically, a dimension in a minor axis direction of an elliptical shape) of the surface light source generated on the MFE 108A or the opening diaphragm 108B is set to about 0.528 or less as the σ (=NAib/NAi) value, as shown in FIG. 38, the intensity distribution Hpb of the 8-order diffraction light Id8 of the +1-order light equivalency ingredient or the 10-order diffraction light Id10 of the −1-order light equivalency ingredient, which are unnecessary, can be located outside the pupil Ep.

By setting such a σ value, as shown in FIG. 24 and FIG. 25, in the case of the line and space pattern created at the pitch 2Pdx in the X' direction, i.e., the line and space pattern at the smallest lattice pitch on the DMD 10, each center (center of gravity) of the intensity distributions ±Hpb' of the high-order diffraction light of the ±1-order light equivalency ingredients generated from the micro mirrors Msa in the ON state arranged one by one at the pitch 2Pdx in the X' direction is about 0.19 when being converted into a numerical aperture NA$1, and the numerical aperture equivalent to a radius of each of the intensity distributions ±Hpb' is equal to the numerical aperture NAib of the intensity distribution Hpa. For this reason, an area about a half or more (about 72.6% according to calculation) including the center (center of gravity) of each of the intensity distributions ±Hpb' is appeared symmetrical to the optical axis AXa in the maximum numerical aperture NAi (=0.25) of the projection unit PLU, and the line and space pattern is well imaged.

Further, in the case of the line and space pattern created at the pitch 2Pdy in the Y' direction, each center (center of gravity) of the intensity distributions ±Hpb' of the high order diffraction light of the ±1-order light equivalency ingredient is appeared on the Y' axis optically rotated about 90° around the axis AXa from the state of FIG. 38.

From above, it is conceivable to completely include each of the intensity distributions ±Hpb' of the high order diffraction light of the ±1-order light equivalency ingredients in the pupil Ep. In this case, the numerical aperture equivalent to the radius of each of the intensity distributions ±Hpb' shown in FIG. 38 may be set to NAi (0.25)−NA$1 (0.19) =0.06. This means setting the numerical aperture NAib of the intensity distribution Hpa to about 0.06, that is, setting the σ value to about 0.24 (=0.06/0.25).

Here, in a case considering the numerical aperture NAij (≈0.382) of each center (center of gravity) of the intensity distribution Hpb of the 8-order diffraction light Id8 and the 10-order diffraction light Id0 of the ±1-order light equivalency ingredients when the micro mirrors Msa in the ON state are disposed at the pitch Pdx (Pdy), and the numerical aperture NA\$1 (≈0.19) of each center (center of gravity) of the intensity distributions ±Hpb' of the high order diffraction light of the ±1-order light equivalency ingredients when the micro mirrors Msa in the ON state are disposed in every other one at the pitch 2Pdx (2Pdy), the condition of the above-mentioned Equation (8) may also be used as the condition of Equation (9).

[Math. 9]

$$(NAi - NA\$1) \leqq NAib \leqq (NAij - NAi) \qquad (9)$$

By dividing the above-mentioned Equation (9) by the maximum numerical aperture NAi on the image surface side of the projection unit PLU, it can be deformed to Equation (10) representing the preferable range of the σ value.

[Math. 10]

$$(1 - NA\$1/NAi) \leqq \sigma \leqq (NAij/NAi - 1) \qquad (10)$$

In the above-mentioned embodiment or variant, the ellipse conversion of the light source image Ips formed on the pupil Ep of the projection unit PLU, i.e., the intensity distribution Hpa of the 9-order diffraction light (18-order diffraction light, or the like) that is the zero order light equivalency ingredient from the DMD 10 is suppressed, and corrected to a circular shape. For this reason, the intensity distributions Hpb, Hpc, Hpd, and ±Hpb' of the ±1-order light equivalency ingredients are also assumed to be circular. However, since the illumination light ILm is obliquely illuminated from the X' direction in actual, even when the intensity distribution Hpa has a true circle, each of the intensity distributions Hpb, Hpc, Hpd, and ±Hpb' becomes an elliptical shape slightly compressed in the X' direction according to the diffraction angle from the center (a position of the optical axis AXa) of the intensity distribution Hpa.

Accordingly, the numerical aperture in the X' direction on the image surface side equivalent to the radius of the intensity distribution Hpb (and Hpc, Hpd) shown in FIG. 37 and FIG. 38 is a numerical aperture NAib' slightly smaller than the numerical aperture NAib of the intensity distribution Hpb in a strict sence. Here, the numerical aperture NAib on the image surface side equivalent to the radius of the intensity distribution Hpa is multiplied by the projection magnification Mp (=⅙) and becomes Mp·NAib on the object surface side (the side of the DMD 10). Here, the angle equivalent to the numerical aperture (Mp·NAib) becomes Δθσ (=arcsin (±Mp·NAib)). Similarly, the numerical aperture NAib' in the X' direction on the image surface side of the intensity distribution Hpb (and Hpc, Hpd) is multiplied by the projection magnification Mp (=⅙) and becomes Mp·NAib' on the object surface side (the side of the DMD 10). Here, the angle equivalent to the numerical aperture (Mp·NAib') in the X' direction is set to Δθib (=arcsin (±Mp·NAib')).

Considering these angles Δθσ and Δθib, the above-mentioned Equation (2) or Equation (3) can be expressed as the following Equation (11) or Equation (12), respectively.

[Math. 11]

$$\sin (\theta\,j + \Delta\,\theta\,ib) = j\,(\lambda/Pdx) - \sin (\theta\,\alpha + \Delta\,\theta\,\sigma) \qquad (11)$$

[Math. 12]

$$\sin (\theta\,j + \Delta\,\theta\,ib) = \sin (\theta\,\alpha + \Delta\,\theta\,\sigma) - j\,(\lambda/Pdx) \qquad (12)$$

(Variant 5)

In addition, as shown in FIG. 37 and FIG. 38, setting of the σ value for disposing the entire intensity distribution Hpb of the diffraction light of the ±1-order light equivalency ingredients generated by the arrangement pitches Pdx and Pdy of the micro mirrors Ms of the DMD 10 outside the pupil Ep of the projection unit PLU can also be similarly applied to an exposure apparatus for epi-illuminating the illumination light ILm to the DMD 10. In this case, a polarization beam splitter and a ¼ wavelength plate are provided in the optical path between the DMD 10 and the projection unit PLU. In this case, a polarization separating surface of the polarization beam splitter is set to 45° with respect to the optical axis AXa of the projection unit PLU as an example, and the illumination light ILm is set almost perpendicularly (the incidence angle θα≈0°) to the neutral plane Pcc of the DMD 10 from the side of the polarization beam splitter.

In this configuration, the optical axis (AXc, AXb) of the condenser lens system that emits the illumination light ILm and the optical axis AXa of the projection unit PLU are coaxial or parallel on the DMD 10. For this reason, although the problem of ellipse conversion does not occur, the tele-centric error Δθt caused by the driving error of the micro mirror Msa in the ON state of the DMD 10 occurs, so it is necessary to correct it. Further, even in the epi-illumination type, it is desirable to correct the ellipse conversion when the optical axis of the condenser lens system and the optical axis AXa of the projection unit PLU are not strictly parallel on the DMD 10, but are set to be intentionally inclined at a constant incidence angle θα (e.g., 5° or more).

(Variant 6)

In the correction method of the ellipse conversion described in the above-mentioned embodiment or variant, an outline shape of the surface light source generated in the illumination unit ILU becomes a complementary elliptical shape such that the outline shape of the light source image Ips formed in the elliptical shape on the pupil Ep of the projection unit PLU (the intensity distribution Hpa of the diffraction light of the zero order light equivalency ingredient from the DMD 10) is corrected to a circular shape. Since the incidence angle θα of the illumination light ILm to the DMD 10 does not change significantly depending on the equipment configuration, the ellipse ratio is also considered to be almost constant.

Here, the outline shape of the surface light source generated in the illumination unit ILU may be made to remain circular, the distribution shaping optical element having anisotropic refractive power such as a cylindrical lens, a toric lens, a diffraction optical element, or the like, may be added to the position in front of or behind the pupil Ep in the projection unit PLU, and the distribution (the intensity distribution Hpa of the diffraction light of the zero order light equivalency ingredient from the DMD 10) of the light source image Ips that becomes the elliptical shape may be corrected to a circular shape. However, in the case of the above-mentioned projection unit PLU, it is necessary to perform an optical design as an image forming lens including a distribution shaping optical element such that image forming performance of the projection unit PLU, in particular, isotropicity of the projection magnification Mp, distortion characteristics, and other aberration characteristics are within an allowable range.

The pattern exposure apparatus EX described in the above-mentioned embodiment or variant includes the DMD 10 (spatial light modulating element) including the plurality of micro mirrors Ms selectively driven on the basis of drawing data, the illumination unit PLU configured to irradiate the DMD 10 with the illumination light ILm at the predetermined incidence angle θα, and the projection unit PLU configured to cause reflected light from the selected micro mirrors Msa of the DMD 10 in the ON state, and the pattern exposure apparatus is configured to enter and to project the entered light to the substrate P.

Among them, the illumination unit ILU includes the condenser lens system 110 as the condensing optical member that is configured to condense light from the surface light source having a predetermined shape which is a source of the illumination light ILm (the aggregate of the plurality of point light sources SPF on the emission surface side of the MFE 108A) so as to obliquely irradiate the light to the DMD 10 and that is disposed along the optical axis (AXb, AXc) which is inclined at the incidence angle θα with respect to an optical axis AXa of the projection unit PLU so as to optically conjugate the surface light source (the aggregate of the point light sources SPF) with the pupil Ep of the projection unit PLU, and the opening diaphragm 108B, the diffraction optical element (DOE) 200, or the lens elements 210 and 212 with anisotropic refractive power as the correcting optical member configured to deform a shape of an outline of the surface light source Ips (the intensity distribution Hpa) so as to correct distortion of the entire outline of the intensity distribution Hpa of the light source image Ips of the surface light source, which is formed on the pupil Ep of the projection unit PLU by the diffraction light (Id9, Id18, or the like) of the zero order light equivalency ingredient as the reflected light from the micro mirrors Msa of the DMD 10 in the ON state, into an elliptical shape according to the incidence angle θα.

In addition, according to the above-mentioned embodiment or variant, there is provided the device manufacturing method of forming a pattern for an electronic device on the substrate P by illuminating the illumination light ILm from the illumination unit ILU the DMD 10 (spatial light modulating element) including the plurality of micro mirrors Ms selectively driven on the basis of drawing data for the pattern for an electronic device (a semiconductor circuit, a display, a wiring, a sensor, or the like) and by projecting and exposing the reflected light from selected micro mirrors Msa of the DMD 10 in the ON state to the substrate P via the projection unit ILm, and the method including a step of condensing light from the surface light source including a predetermined shape generated in the illumination unit ILU as illumination light and obliquely irradiate the light to the DMD 10 at the incidence angle θα, and a step of deforming an outline shape of the surface light source so as to correct distortion of the outline of the light source image Ips (the intensity distribution Hpa) of the surface light source, which is formed on the pupil Ep of the projection unit PLU by the reflected light from the micro mirrors Msa of the DMD 10 (diffraction lights Id9 and Id18 of the zero order light equivalency ingredient) in the ON state, into an elliptical shape according to the incidence angle.

According to the above-mentioned configuration, the light source image Ips formed on the pupil Ep of the projection unit PLU, i.e., the entire outline of the intensity distribution Hpa of the zero order light equivalency ingredient from the micro mirrors Msa in the ON state of the DMD 10 can be corrected from the distorted elliptical shape to the circular shape, and image quality of the edge portion of the pattern image projected and exposed to the substrate P by the projection unit PLU can be uniformized regardless of directionality of the edge.

What is claimed is:

1. A pattern exposure apparatus comprising: a spatial light modulating element including a plurality of micro mirrors selectively driven based on drawing data; an illumination unit configured to irradiate the spatial light modulating element with illumination light at a predetermined incidence angle; and a projection unit configured to project reflected light from selected micro mirrors of the spatial light modulating element in an ON state to a substrate, and the pattern exposure apparatus is configured to project and expose a pattern corresponding to the drawing data to the substrate, wherein the illumination unit comprises:

a condensing optical member that is configured to condense light from a surface light source having a predetermined shape which is a source of the illumination light so as to obliquely irradiate the light to the spatial light modulating element and that is disposed along an optical axis which is inclined at the incidence angle with respect to an optical axis of the projection unit so as to optically conjugate the surface light source with a pupil of the projection unit; and a correcting optical member configured to deform a shape of an outline of the surface light source so as to correct distortion of an outline of an image of the surface light source, which is formed on the pupil of the projection unit by the reflected light from the micro mirrors of the spatial light modulating element in the ON state, into an elliptical shape according to the incidence angle.

2. The pattern exposure apparatus according to claim 1, wherein the illumination unit comprises an optical integrator configured to generate the surface light source by an aggregate of a plurality of point light sources, and wherein the condensing optical member is constituted by a condenser lens system configured to Kohler-illuminate the spatial light modulating element with illumination light from each of the plurality of point light sources.

3. The pattern exposure apparatus according to claim 2, wherein the correcting optical member is constituted by an opening diaphragm configured to deform the shape of the outline of the surface light source by passing illumination light from a part of the aggregate of the plurality of point light sources toward the condenser lens system.

4. The pattern exposure apparatus according to claim 3, wherein the opening diaphragm has an elliptical opening in a state in which a direction of a major axis and a minor axis of an elliptical outline of the image of the surface light source formed at the pupil of the projection unit is rotated 90°.

5. The pattern exposure apparatus according to claim 2, wherein the correcting optical member is constituted by a distribution shaping optical element configured to shape a distribution of illumination light entering the optical integrator so as to correspond to an outline shape of the surface light source to be deformed.

6. The pattern exposure apparatus according to claim 5, wherein the distribution shaping optical element is constituted by either a diffraction optical element, a cylindrical lens, or a Fresnel lens that makes an entire outline of the distribution of the illumination light entering the optical integrator into elliptical form in a state in which a direction of a major axis and a minor axis of an elliptical outline of the image of the surface light source formed at the pupil of the projection unit is rotated 90°.

7. The pattern exposure apparatus according to claim 1, wherein the outline of the surface light source deformed by the correcting optical member is set to an elliptical shape in which a ratio between a dimension in a minor axis direction and a dimension in a major axis direction becomes a cosine value of the incidence angle.

8. A device manufacturing method of forming a pattern for an electronic device onto a substrate by obliquely illuminating illumination light from an illumination unit to a spatial light modulating element including a plurality of micro mirrors selectively driven based on drawing data of the pattern for the electronic device and by projecting and exposing reflected light from selected micro mirrors of the spatial light modulating element in an ON state to the substrate via a projection unit, wherein the method comprises:

a step of condensing light from a surface light source including a predetermined shape generated in the illumination unit as the illumination light and obliquely irradiating the light to the spatial light modulating element at a predetermined incidence angle; and a step of deforming an outline shape of the surface light source so as to correct distortion of an outline of an image of the surface light source, which is formed on a pupil of the projection unit by the reflected light from the micro mirrors of the spatial light modulating element in the ON state, into an elliptical shape according to the incidence angle.

9. An exposure apparatus comprising:

a spatial light modulating element including a plurality of micro mirrors;

an illumination unit configured to irradiate the spatial light modulating element with illumination light; and a projection unit configured to project light reflected from ON-state micro mirrors among the plurality of micro mirrors, wherein the illumination unit comprises:

a first cylindrical lens having a positive refractive power in a first plane that includes an optical axis of the illumination unit;

a second cylindrical lens having a negative refractive power in the first plane; and a condensing optical member configured to condense light passed through the first cylindrical lens and the second cylindrical lens so as to irradiate the spatial light modulating element with the condensed light.

10. The exposure apparatus according to claim 9, wherein the condensing optical member condenses light from a surface light source serving as a source of the illumination light so as to irradiate the spatial light modulating element, and the first cylindrical lens deforms a distribution shape of the surface light source formed on a pupil of the projection unit so as to suppress the distribution shape from becoming elliptical.

11. The exposure apparatus according to claim 9, wherein the first cylindrical lens has no refractive power in a second plane that includes the optical axis and is perpendicular to the first plane, and the second cylindrical lens has no refractive power in the second plane.

12. The exposure apparatus according to claim 9, wherein the illumination unit includes a fly-eye lens element into which light passed through the first cylindrical lens and the second cylindrical lens enters.

13. The exposure apparatus according to claim 10, wherein the illumination unit includes a fly-eye lens element into which light passed through the first cylindrical lens and the second cylindrical lens enters.

14. The exposure apparatus according to claim 11, wherein the illumination unit includes a fly-eye lens element into which light passed through the first cylindrical lens and the second cylindrical lens enters.

* * * * *